(12) United States Patent
Pore et al.

(10) Patent No.: US 10,043,880 B2
(45) Date of Patent: Aug. 7, 2018

(54) METAL SILICIDE, METAL GERMANIDE, METHODS FOR MAKING THE SAME

(71) Applicant: ASM INTERNATIONAL N.V., Almere (NL)

(72) Inventors: Viljami J. Pore, Helsinki (FI); Suvi P. Haukka, Helsinki (FI); Tom E. Blomberg, Helsinki (FI); Eva E. Tois, Helsinki (FI)

(73) Assignee: ASM INTERNATIONAL N.V., Almere (NL)

( * ) Notice: Subject to any disclaimer, the term of this patent is extended or adjusted under 35 U.S.C. 154(b) by 0 days.

(21) Appl. No.: 15/492,892

(22) Filed: Apr. 20, 2017

(65) Prior Publication Data
US 2017/0352737 A1     Dec. 7, 2017

Related U.S. Application Data

(63) Continuation of application No. 14/815,633, filed on Jul. 31, 2015, now Pat. No. 9,634,106, which is a (Continued)

(51) Int. Cl.
*H01L 29/45* (2006.01)
*C23C 16/06* (2006.01)
(Continued)

(52) U.S. Cl.
CPC ............ *H01L 29/45* (2013.01); *C23C 16/06* (2013.01); *C23C 16/406* (2013.01);
(Continued)

(58) Field of Classification Search
CPC . C23C 16/06; C23C 16/406; C23C 16/45527; H01L 21/28518; H01L 23/53209
See application file for complete search history.

(56) References Cited

U.S. PATENT DOCUMENTS 4,058,430 A   11/1977   Suntola et al.
4,210,608 A    7/1980   Pinke
(Continued)

FOREIGN PATENT DOCUMENTS

DE            410873       8/1923
DE    10 2008 026 284     12/2009
(Continued)

OTHER PUBLICATIONS

U.S. Appl. No. 12/337,141, filed Dec. 17, 2008, Kim et al.
(Continued)

*Primary Examiner* — Mohsen Ahmadi
(74) *Attorney, Agent, or Firm* — Knobbe, Martens, Olson & Bear LLP

(57) ABSTRACT

In one aspect, methods of silicidation and germanidation are provided. In some embodiments, methods for forming metal silicide can include forming a non-oxide interface, such as germanium or solid antimony, over exposed silicon regions of a substrate. Metal oxide is formed over the interface layer. Annealing and reducing causes metal from the metal oxide to react with the underlying silicon and form metal silicide. Additionally, metal germanide can be formed by reduction of metal oxide over germanium, whether or not any underlying silicon is also silicided. In other embodiments, nickel is deposited directly and an interface layer is not used. In another aspect, methods of depositing nickel thin films by vapor phase deposition processes are provided. In some embodiments, nickel thin films are deposited by ALD.

14 Claims, 24 Drawing Sheets

Related U.S. Application Data continuation of application No. 13/452,402, filed on Apr. 20, 2012, now Pat. No. 9,129,897.

(60) Provisional application No. 61/478,214, filed on Apr. 22, 2011, provisional application No. 61/485,532, filed on May 12, 2011, provisional application No. 61/526,607, filed on Aug. 23, 2011.

(51) Int. Cl.

| | | |
|---|---|---|
| *C23C 16/455* | (2006.01) | |
| *C23C 16/40* | (2006.01) | |
| *H01L 21/285* | (2006.01) | |
| *H01L 21/324* | (2006.01) | |
| *H01L 21/3215* | (2006.01) | |
| *H01L 29/78* | (2006.01) | |
| *H01L 29/66* | (2006.01) | |
| *H01L 29/49* | (2006.01) | |

(52) U.S. Cl.
CPC .. *C23C 16/45527* (2013.01); *H01L 21/28518* (2013.01); *H01L 21/28556* (2013.01); *H01L 21/28562* (2013.01); *H01L 21/324* (2013.01); *H01L 21/3215* (2013.01); *H01L 29/665* (2013.01); *H01L 29/66666* (2013.01); *H01L 29/7827* (2013.01); *H01L 29/456* (2013.01); *H01L 29/4933* (2013.01)

(56) References Cited

U.S. PATENT DOCUMENTS

| | | | |
|---|---|---|---|
| 4,477,296 | A | 10/1984 | Nair |
| 4,521,952 | A | 6/1985 | Riseman |
| 4,604,118 | A | 8/1986 | Bocko et al. |
| 4,605,947 | A | 8/1986 | Price et al. |
| 4,670,110 | A | 6/1987 | Withers et al. |
| 4,860,687 | A | 8/1989 | Frijlink |
| 4,891,050 | A | 1/1990 | Bowers et al. |
| 4,902,551 | A | 2/1990 | Nakaso et al. |
| 4,965,656 | A | 10/1990 | Koubuchi et al. |
| 4,994,402 | A | 2/1991 | Chiu |
| 5,032,233 | A | 7/1991 | Yu et al. |
| 5,043,300 | A | 8/1991 | Nulman |
| 5,084,406 | A | 1/1992 | Rhodes et al. |
| 5,094,977 | A | 3/1992 | Yu et al. |
| 5,106,454 | A | 4/1992 | Allardyce et al. |
| 5,147,819 | A | 9/1992 | Yu et al. |
| 5,187,122 | A | 2/1993 | Bonis |
| 5,196,360 | A | 3/1993 | Doan et al. |
| 5,231,056 | A | 7/1993 | Sandhu |
| 5,236,865 | A | 8/1993 | Sanhu et al. |
| 5,278,098 | A | 1/1994 | Wei et al. |
| 5,341,016 | A | 8/1994 | Prall et al. |
| 5,378,641 | A | 1/1995 | Cheffings |
| 5,382,333 | A | 1/1995 | Ando et al. |
| 5,389,575 | A | 2/1995 | Chin et al. |
| 5,391,517 | A | 2/1995 | Gelatos et al. |
| 5,453,494 | A | 9/1995 | Kirlin et al. |
| 5,480,814 | A | 1/1996 | Wuu et al. |
| 5,508,212 | A | 4/1996 | Wang et al. |
| 5,637,533 | A | 6/1997 | Choi |
| 5,656,519 | A | 8/1997 | Mogami |
| 5,656,546 | A | 8/1997 | Chen et al. |
| 5,695,810 | A | 12/1997 | Dubin et al. |
| 5,711,811 | A | 1/1998 | Suntola et al. |
| 5,731,634 | A | 3/1998 | Matsuo et al. |
| 5,756,394 | A | 5/1998 | Manning |
| 5,820,664 | A | 10/1998 | Gardiner et al. |
| 5,856,237 | A | 1/1999 | Ku |
| 5,865,365 | A | 2/1999 | Nishikawa et al. |
| 5,874,600 | A | 2/1999 | Rautenstrauch et al. |
| 5,884,009 | A | 3/1999 | Okase |
| 5,888,903 | A | 3/1999 | O'Brien et al. |
| 5,916,365 | A | 6/1999 | Sherman |
| 5,923,056 | A | 7/1999 | Lee et al. |
| 5,939,334 | A | 8/1999 | Nguyen et al. |
| 5,945,350 | A | 8/1999 | Violette et al. |
| 5,989,672 | A | 11/1999 | Hayashi |
| 5,998,048 | A | 12/1999 | Jin et al. |
| 6,006,763 | A | 12/1999 | Mori et al. |
| 6,006,767 | A | 12/1999 | Hecker et al. |
| 6,015,986 | A | 1/2000 | Schuegraf |
| 6,033,584 | A | 3/2000 | Ngo et al. |
| 6,040,243 | A | 3/2000 | Li et al. |
| 6,063,705 | A | 5/2000 | Vaartstra |
| 6,066,892 | A | 5/2000 | Ding et al. |
| 6,074,945 | A | 6/2000 | Vaartstra et al. |
| 6,108,937 | A | 8/2000 | Raaijmakers |
| 6,117,761 | A | 9/2000 | Manning |
| 6,124,189 | A | 9/2000 | Watanabe et al. |
| 6,130,123 | A | 10/2000 | Liang et al. |
| 6,133,159 | A | 10/2000 | Vaartstra et al. |
| 6,136,163 | A | 10/2000 | Cheung et al. |
| 6,139,700 | A | 10/2000 | Kang et al. |
| 6,143,658 | A | 11/2000 | Donnelly et al. |
| 6,144,060 | A | 11/2000 | Park et al. |
| 6,147,405 | A | 11/2000 | Hu |
| 6,171,910 | B1 | 1/2001 | Hobbs et al. |
| 6,183,565 | B1 | 2/2001 | Granneman et al. |
| 6,203,613 | B1 | 3/2001 | Gates et al. |
| 6,268,291 | B1 | 7/2001 | Andricacos et al. |
| 6,270,572 | B1 | 8/2001 | Kim et al. |
| 6,277,735 | B1 | 8/2001 | Matsubara |
| 6,281,125 | B1 | 8/2001 | Vaartstra et al. |
| 6,294,467 | B1 | 9/2001 | Yokoyama et al. |
| 6,297,539 | B1 | 10/2001 | Ma et al. |
| 6,303,500 | B1 | 10/2001 | Jiang et al. |
| 6,305,314 | B1 | 10/2001 | Sneh et al. |
| 6,306,756 | B1 | 10/2001 | Hasunuma et al. |
| 6,320,213 | B1 | 11/2001 | Kirlin et al. |
| 6,323,131 | B1 | 11/2001 | Obeng et al. |
| 6,335,280 | B1 | 1/2002 | Van der Jeugd |
| 6,342,277 | B1 | 1/2002 | Sherman |
| 6,346,151 | B1 | 2/2002 | Jiang et al. |
| 6,359,159 | B1 | 3/2002 | Welch |
| 6,372,584 | B1 | 4/2002 | Yu |
| 6,380,080 | B2 | 4/2002 | Visokay |
| 6,391,785 | B1 | 5/2002 | Satta et al. |
| 6,395,650 | B1 | 5/2002 | Callegari et al. |
| 6,403,414 | B2 | 6/2002 | Marsh |
| 6,404,191 | B2 | 6/2002 | Daughton et al. |
| 6,420,189 | B1 | 7/2002 | Lopatin |
| 6,433,432 | B2 | 8/2002 | Shimizu |
| 6,444,568 | B1 | 9/2002 | Sundararajan et al. |
| 6,444,868 | B1 | 9/2002 | Vaughn et al. |
| 6,455,424 | B1 | 9/2002 | McTeer et al. |
| 6,455,935 | B1 | 9/2002 | Hu |
| 6,464,779 | B1 | 10/2002 | Powell et al. |
| 6,468,901 | B1 * | 10/2002 | Maa ............... H01L 21/28518 257/E21.165 |
| 6,475,276 | B1 | 11/2002 | Elers et al. |
| 6,478,931 | B1 | 11/2002 | Wadley et al. |
| 6,482,733 | B2 | 11/2002 | Raaijmakers et al. |
| 6,482,740 | B2 | 11/2002 | Soininen et al. |
| 6,511,539 | B1 | 1/2003 | Raaijmakers |
| 6,524,953 | B1 | 2/2003 | Hu |
| 6,534,395 | B2 | 3/2003 | Werkhoven et al. |
| 6,541,067 | B1 | 4/2003 | Marsh et al. |
| 6,551,399 | B1 | 4/2003 | Shen et al. |
| 6,576,053 | B1 | 6/2003 | Kim et al. |
| 6,586,330 | B1 | 7/2003 | Ludviksson et al. |
| 6,593,656 | B2 | 7/2003 | Ahn et al. |
| 6,602,613 | B1 | 8/2003 | Fitzgerald |
| 6,617,173 | B1 | 9/2003 | Shen |
| 6,649,091 | B1 | 11/2003 | Ryan et al. |
| 6,656,748 | B2 | 12/2003 | Hall et al. |
| 6,664,192 | B2 | 12/2003 | Satta et al. |
| 6,679,951 | B2 | 1/2004 | Soininen et al. |
| 6,680,540 | B2 | 1/2004 | Nakano et al. |
| 6,703,708 | B2 | 3/2004 | Werkhoven et al. |
| 6,713,381 | B2 | 3/2004 | Barr et al. |
| 6,720,262 | B2 | 4/2004 | Koh et al. |

(56) References Cited

U.S. PATENT DOCUMENTS

| | | |
|---|---|---|
| 6,743,721 B2 | 6/2004 | Lur et al. |
| 6,759,325 B2 | 7/2004 | Raaijmakers et al. |
| 6,777,331 B2 | 8/2004 | Nguyen |
| 6,784,101 B1 | 8/2004 | Yu et al. |
| 6,784,504 B2 | 8/2004 | Derderian et al. |
| 6,800,542 B2 | 10/2004 | Kim |
| 6,800,567 B2 | 10/2004 | Cho et al. |
| 6,824,816 B2 | 11/2004 | Aaltonen et al. |
| 6,842,740 B1 | 1/2005 | Jeran et al. |
| 6,849,122 B1 | 2/2005 | Fair |
| 6,852,635 B2 | 2/2005 | Satta et al. |
| 6,878,628 B2 | 4/2005 | Sophie et al. |
| 6,881,260 B2 | 4/2005 | Marsh et al. |
| 6,881,437 B2 | 4/2005 | Ivanov et al. |
| 6,887,795 B2 | 5/2005 | Soininen et al. |
| 6,921,712 B2 | 7/2005 | Soininen et al. |
| 6,933,225 B2 | 8/2005 | Werkhoven et al. |
| 6,936,535 B2 | 8/2005 | Kim et al. |
| 6,955,986 B2 | 10/2005 | Li |
| 6,984,591 B1 | 1/2006 | Buchanan et al. |
| 7,011,981 B2 | 3/2006 | Kim et al. |
| 7,067,407 B2 | 6/2006 | Kostamo et al. |
| 7,078,326 B1* | 7/2006 | Marsh ................ C23C 16/0272 257/E21.171 |
| 7,105,054 B2 | 9/2006 | Lindfors |
| 7,107,998 B2 | 9/2006 | Greer et al. |
| 7,118,779 B2 | 10/2006 | Verghese et al. |
| 7,135,207 B2 | 11/2006 | Min et al. |
| 7,153,772 B2 | 12/2006 | Granneman et al. |
| 7,183,604 B2 | 2/2007 | Cartier |
| 7,211,509 B1 | 5/2007 | Gopinath et al. |
| 7,220,451 B2 | 5/2007 | Aaltonen et al. |
| 7,220,669 B2 | 5/2007 | Hujanen et al. |
| 7,238,595 B2 | 7/2007 | Brabant et al. |
| 7,241,677 B2 | 7/2007 | Soinenen et al. |
| 7,256,144 B2 | 8/2007 | Koyanagi et al. |
| 7,273,526 B2 | 9/2007 | Shinriki et al. |
| 7,273,814 B2 | 9/2007 | Matsuda |
| 7,279,756 B2 | 10/2007 | Wang et al. |
| 7,300,873 B2 | 11/2007 | Millward |
| 7,329,593 B2 | 2/2008 | Bauer et al. |
| 7,404,985 B2 | 7/2008 | Chang et al. |
| 7,419,903 B2 | 9/2008 | Haukka et al. |
| 7,425,500 B2 | 9/2008 | Metz et al. |
| 7,435,484 B2 | 10/2008 | Shinriki et al. |
| 7,438,949 B2 | 10/2008 | Weidman |
| 7,476,618 B2 | 1/2009 | Kilpela et al. |
| 7,479,421 B2 | 1/2009 | Kavalieros et al. |
| 7,494,927 B2 | 2/2009 | Kostamo et al. |
| 7,541,284 B2 | 6/2009 | Park |
| 7,601,223 B2 | 10/2009 | Lindfors et al. |
| 7,615,480 B2 | 11/2009 | Boyd |
| 7,638,379 B2 | 12/2009 | Cheng et al. |
| 7,655,564 B2 | 2/2010 | Shinriki et al. |
| 7,666,773 B2 | 2/2010 | Huotari et al. |
| 7,691,750 B2 | 4/2010 | Granneman et al. |
| 7,771,533 B2 | 8/2010 | Tois et al. |
| 7,771,534 B2 | 8/2010 | Tois et al. |
| 7,824,492 B2 | 11/2010 | Tois et al. |
| 7,927,942 B2 | 4/2011 | Raaijmakers |
| 7,943,988 B2 | 5/2011 | Pham et al. |
| 8,152,922 B2 | 4/2012 | Schmidt et al. |
| 8,384,209 B2 | 2/2013 | Oikawa et al. |
| 9,129,897 B2 | 9/2015 | Pore et al. |
| 2001/0003064 A1 | 6/2001 | Ohto |
| 2001/0013617 A1 | 8/2001 | Toyoda et al. |
| 2001/0018266 A1 | 8/2001 | Jiang et al. |
| 2001/0030366 A1 | 10/2001 | Nakano et al. |
| 2001/0041250 A1 | 11/2001 | Werkhoven et al. |
| 2001/0052318 A1 | 12/2001 | Jiang et al. |
| 2002/0004293 A1 | 1/2002 | Soininen et al. |
| 2002/0006711 A1 | 1/2002 | Yamazaki et al. |
| 2002/0013487 A1 | 1/2002 | Norman et al. |
| 2002/0027286 A1 | 3/2002 | Sundararajan et al. |
| 2002/0064948 A1 | 5/2002 | Saito et al. |
| 2002/0081381 A1* | 6/2002 | DelaRosa ................ C23C 16/18 427/255.28 |
| 2002/0102838 A1 | 8/2002 | Parajpe et al. |
| 2002/0146513 A1 | 10/2002 | Jin et al. |
| 2002/0173054 A1 | 11/2002 | Kim |
| 2003/0013302 A1 | 1/2003 | Nguyen et al. |
| 2003/0059535 A1 | 3/2003 | Luo et al. |
| 2003/0080363 A1 | 5/2003 | Maruyama et al. |
| 2003/0088116 A1 | 5/2003 | Kawano et al. |
| 2003/0100162 A1 | 5/2003 | Joo |
| 2003/0121608 A1 | 7/2003 | Chen et al. |
| 2003/0135061 A1 | 7/2003 | Norman et al. |
| 2003/0165615 A1 | 9/2003 | Aaltonen et al. |
| 2003/0214043 A1 | 11/2003 | Saitoh et al. |
| 2003/0219991 A1 | 11/2003 | Geusic et al. |
| 2003/0233976 A1 | 12/2003 | Marsh et al. |
| 2004/0005753 A1* | 1/2004 | Kostamo ................ C23C 16/40 438/222 |
| 2004/0028952 A1 | 2/2004 | Cartier et al. |
| 2004/0038529 A1 | 2/2004 | Soininen et al. |
| 2004/0041194 A1 | 3/2004 | Marsh |
| 2004/0053496 A1 | 3/2004 | Choi |
| 2004/0082125 A1 | 4/2004 | Hou et al. |
| 2004/0087143 A1 | 5/2004 | Norman et al. |
| 2004/0095792 A1 | 5/2004 | Hermann et al. |
| 2004/0105934 A1 | 6/2004 | Chang et al. |
| 2004/0118697 A1 | 6/2004 | Wen et al. |
| 2004/0126944 A1 | 7/2004 | Rontondaro et al. |
| 2004/0142558 A1 | 7/2004 | Granneman |
| 2004/0152255 A1 | 8/2004 | Seidl et al. |
| 2004/0192021 A1 | 9/2004 | Li |
| 2004/0192036 A1 | 9/2004 | Koyanagi et al. |
| 2004/0214354 A1 | 10/2004 | Marsh et al. |
| 2004/0216668 A1 | 11/2004 | Lindfors et al. |
| 2004/0224475 A1 | 11/2004 | Lee et al. |
| 2005/0009325 A1 | 1/2005 | Chung et al. |
| 2005/0020060 A1 | 1/2005 | Aaltonen et al. |
| 2005/0048794 A1 | 3/2005 | Brask et al. |
| 2005/0082587 A1 | 4/2005 | Marsh |
| 2005/0085031 A1 | 4/2005 | Lopatin et al. |
| 2005/0087879 A1 | 4/2005 | Won et al. |
| 2005/0089632 A1 | 4/2005 | Vehkamaki et al. |
| 2005/0092247 A1 | 5/2005 | Schmidt et al. |
| 2005/0095781 A1 | 5/2005 | Papa Rao et al. |
| 2005/0098440 A1 | 5/2005 | Kailasam et al. |
| 2005/0118807 A1 | 6/2005 | Kim et al. |
| 2005/0124154 A1 | 6/2005 | Park et al. |
| 2005/0181555 A1 | 8/2005 | Haukka et al. |
| 2005/0208754 A1 | 9/2005 | Kostamo et al. |
| 2005/0229848 A1 | 10/2005 | Shinriki et al. |
| 2005/0238808 A1 | 10/2005 | Gatineau et al. |
| 2005/0266700 A1 | 12/2005 | Jursich et al. |
| 2005/0271812 A1 | 12/2005 | Myo et al. |
| 2006/0013955 A1 | 1/2006 | Senzaki |
| 2006/0019495 A1 | 1/2006 | Marcadal et al. |
| 2006/0035462 A1 | 2/2006 | Millward |
| 2006/0063375 A1 | 3/2006 | Sun et al. |
| 2006/0073276 A1 | 4/2006 | Antonissen |
| 2006/0093848 A1 | 5/2006 | Senkevich et al. |
| 2006/0118968 A1 | 6/2006 | Johnston et al. |
| 2006/0121733 A1 | 6/2006 | Kilpela et al. |
| 2006/0128150 A1 | 6/2006 | Gandikota et al. |
| 2006/0137098 A1 | 6/2006 | Choi et al. |
| 2006/0141155 A1* | 6/2006 | Gordon ................ C07C 257/14 427/255.19 |
| 2006/0165892 A1 | 7/2006 | Weidman |
| 2006/0177601 A1 | 8/2006 | Park et al. |
| 2006/0211228 A1 | 9/2006 | Matsuda |
| 2006/0216932 A1 | 9/2006 | Kumar et al. |
| 2006/0223300 A1 | 10/2006 | Simka et al. |
| 2006/0263977 A1 | 11/2006 | Kim et al. |
| 2007/0004203 A1 | 1/2007 | Streck et al. |
| 2007/0014919 A1 | 1/2007 | Hamalainen et al. |
| 2007/0026654 A1 | 2/2007 | Huotari et al. |
| 2007/0036892 A1 | 2/2007 | Haukka et al. |
| 2007/0059502 A1 | 3/2007 | Wang et al. |
| 2007/0082132 A1 | 4/2007 | Shinriki et al. |
| 2007/0190782 A1 | 8/2007 | Park |
| 2008/0038465 A1 | 2/2008 | Dussarrat |

(56) References Cited

U.S. PATENT DOCUMENTS

| | | | |
|---|---|---|---|
| 2008/0054472 A1 | 3/2008 | Shinriki et al. | |
| 2008/0124484 A1 | 5/2008 | Shinriki et al. | |
| 2008/0132050 A1* | 6/2008 | Lavoie | C23C 14/0084 438/584 |
| 2008/0146042 A1 | 6/2008 | Kostamo et al. | |
| 2008/0171436 A1 | 7/2008 | Koh et al. | |
| 2008/0171890 A1 | 7/2008 | Kim et al. | |
| 2008/0200019 A9 | 8/2008 | Huotari et al. | |
| 2008/0206982 A1 | 8/2008 | Suzuki | |
| 2008/0206985 A1 | 8/2008 | Kim et al. | |
| 2008/0214003 A1 | 9/2008 | Xia | |
| 2008/0220606 A1* | 9/2008 | Cabral | H01L 21/28052 438/606 |
| 2008/0224317 A1 | 9/2008 | Machkaoutsan et al. | |
| 2008/0242059 A1 | 10/2008 | McSwiney et al. | |
| 2008/0296768 A1 | 12/2008 | Chebiam | |
| 2008/0315418 A1 | 12/2008 | Boyd | |
| 2008/0318417 A1 | 12/2008 | Shinriki et al. | |
| 2009/0017619 A1* | 1/2009 | Lee | H01L 21/28518 438/664 |
| 2009/0068832 A1 | 3/2009 | Haukka et al. | |
| 2009/0087339 A1 | 4/2009 | Shinriki | |
| 2009/0104777 A1 | 4/2009 | Kim | |
| 2009/0155997 A1 | 6/2009 | Shinriki | |
| 2009/0163024 A1 | 6/2009 | Kim et al. | |
| 2009/0197411 A1 | 8/2009 | Dussarrat et al. | |
| 2009/0209101 A1 | 8/2009 | Shinriki et al. | |
| 2009/0214767 A1 | 8/2009 | Wang et al. | |
| 2009/0294807 A1 | 12/2009 | Yan et al. | |
| 2009/0315120 A1 | 12/2009 | Shifren et al. | |
| 2010/0021747 A1 | 1/2010 | Dussarrat et al. | |
| 2010/0055433 A1 | 3/2010 | Shinriki et al. | |
| 2010/0099904 A1 | 4/2010 | Dupau et al. | |
| 2010/0155859 A1* | 6/2010 | Raaijmakers | C23C 16/405 257/412 |
| 2010/0193951 A1 | 8/2010 | Dussarrat et al. | |
| 2011/0104906 A1 | 5/2011 | Tois et al. | |
| 2011/0143534 A1* | 6/2011 | Carron | H01L 21/28518 438/661 |
| 2011/0269310 A1 | 11/2011 | Raaijmakers | |
| 2012/0058270 A1 | 3/2012 | Winter et al. | |
| 2012/0302055 A1 | 11/2012 | Pore et al. | |
| 2012/0329208 A1 | 12/2012 | Pore et al. | |

FOREIGN PATENT DOCUMENTS

| | | |
|---|---|---|
| EP | 0 321 067 | 6/1989 |
| EP | 0 469 456 | 7/1991 |
| EP | 0 469 470 | 2/1992 |
| EP | 0 880 168 | 11/1998 |
| EP | 1 688 923 | 8/2006 |
| GB | 368850 | 12/1930 |
| GB | 1518243 | 7/1978 |
| GB | 2 340 508 | 2/2000 |
| JP | 60-10673 | 1/1994 |
| JP | 1998-340994 | 12/1998 |
| JP | 2003-168738 | 6/2003 |
| KR | 10-2001-0004717 | 1/2001 |
| KR | 10-2001-0004718 | 1/2001 |
| KR | 10-2001-0004719 | 1/2001 |
| KR | 10-2001-096408 | 11/2001 |
| KR | 10-2001-0012889 | 12/2001 |
| KR | 10-2003-0011399 | 2/2003 |
| KR | 10-2005-0103373 | 10/2005 |
| KR | 1020070093908 | 9/2007 |
| TW | 200625632 | 7/2006 |
| TW | 201007916 | 2/2010 |
| TW | 201009108 | 3/2010 |
| TW | 201013929 | 4/2010 |
| WO | WO 93/10652 | 5/1993 |
| WO | WO 98/01890 | 1/1998 |
| WO | WO 99/17343 | 4/1999 |
| WO | WO 00/03420 | 1/2000 |
| WO | WO 00/38191 | 6/2000 |
| WO | WO 01/88972 | 5/2001 |
| WO | WO 01/50502 | 7/2001 |
| WO | WO 02/09126 | 1/2002 |
| WO | WO 02/09158 | 1/2002 |
| WO | WO 03/023835 | 3/2003 |
| WO | WO 03/040150 | 5/2003 |
| WO | WO 03/056612 | 7/2003 |
| WO | WO 2004/035858 | 4/2004 |
| WO | WO 2006/035281 | 4/2006 |
| WO | WO 2009/146870 | 12/2009 |
| WO | WO 2011/056519 | 5/2011 |
| WO | WO 2012/027357 A2 | 3/2012 |
| WO | WO 2013/006242 | 1/2013 |

OTHER PUBLICATIONS

U.S. Appl. No. 60/976,378, filed Sep. 28, 2007, Shinriki, H.
U.S. Appl. No. 61/178,841, filed May 15, 2009, Hamalainen et al.
U.S. Appl. No. 10/728,126, filed Dec. 3, 2003, Granneman.
U.S. Appl. No. 10/782,727, filed Feb. 18, 2004, Lindfors et al.
U.S. Appl. No. 11/254,071, filed Oct. 18, 2005, Kilpela et al.
U.S. Appl. No. 11/367,177, filed Mar. 3, 2006, Shinriki et al.
U.S. Appl. No. 11/469,828, filed Sep. 1, 2006, Shinriki et al.
U.S. Appl. No. 11/557,891, filed Nov. 8, 2006, Shinriki et al.
U.S. Appl. No. 11/955,275, filed Dec. 12, 2007, Shinriki.
U.S. Appl. No. 11/972,081, filed Jan. 10, 2008, Koh.
U.S. Appl. No. 12/129,345, filed May 29, 2008, Shinriki et al.
U.S. Appl. No. 12/201,434, filed Aug. 29, 2008, Shinriki et al.
Aaltonen et al. "Atomic Layer Deposition of Ruthenium Thin Films From Ru(THD)3 and Oxygen," Chem. Vap. Deposition, 10, pp. 215-219, (2004).
Aaltonen et al. "Reaction Mechanism Studies on Atomic Layer Deposition of Ruthenium and Platinum," Electrochem. Solid-State Lett., 6 (2003), C130-133.
Aaltonen et al., "ALD of Rhodium Thin Films from Rh (acac)$_3$ and Oxygen," Electrochem. Solid-State Lett. 8 (8): C99-C101 (2005).
Aaltonen et al., "Atomic Layer Deposition of Iridium Thin Films," J. Electrochem. Soc. 151(8): G489-G492 (2004).
Aaltonen et al., "Atomic Layer Deposition of Noble Metal Thin Films," dissertation presented at the University of Helsinki, Helsinki, Finland, 2005.
Aaltonen et al., "Atomic Layer Deposition of Noble Metals: Exploration of the Low Limit of the Deposition Temperature," J. Mat. Res. Soc. 19 (11): 3353-3358 (2004).
Aaltonen et al., "Atomic Layer Deposition of Platinum Thin Films," Chem. Mater. 15: 1924-1928 (2003).
Aaltonen et al., "Ruthenium Thim Film Grown by Atomic Layer Deposition", Chem. Vap. Deposition, 9[1], 45, (2003).
Addison et al., "The Vapour Pressure of Anhydrous Copper Nitrate, and its Molecular Weight in the Vapour State," J. Chem. Soc., pp. 3099-3106 (1958).
Ahmed et al., Rival architectures face off in a bid to keep Moore's Law alive, Transistor Wars—IEEE Spectrum (Retrieved from URL: http://spectrum.ieee.org/semiconductors/devices/transistor-wars/0), Nov. 2011, 5 pages.
Akerman et al., "Identifying Tunneling in Ferromagnetic-Insulator-Ferromagnetic Thin Film Structures," Journal of Magnetism and Magnetic Materials, vol. 240, Nos. 1-3, pp. 86-91, (2002).
Aoyama et al., "Chemical Vapor Deposition of Ru and Its Application in (Ba, Sr) TiO$_3$ Capacitors for Future Dynamic Random Access Memories," Jpn. J. Appl. Phys. 38(43): 2194-2199 (1999).
Aoyama et al., "Ruthenium Films Prepared by Liquid Source Chemical Vapor Deposition Using Bis-(ethylcyclopentadienyl)ruthenium", Jpn. J. Appl. Phys., vol. 38, pp. L 1134-L 1136 (1999).
Arnal et al., Materials and processes for high signal propagation performance and reliable 32 nm node BEOL., 1-4244-1069-X-07, 2007 IEEE, pp. 1-3.
Bahlawane et al., "Alcohol-Assisted CVD of Silver Using Commercially Available Precursors", Chem. Vap. Deposition, 2007, vol. 13, pp. 401-407.

(56) References Cited

OTHER PUBLICATIONS

Bahlawane et al., "Catalytically enhanced H2-free CVD of transition metals using commercially available precursors", Surface & Coatings Technology, 2007, vol. 201, pp. 8914-8918.
Bahlawane et al., "Nickel and Nickel-Based Nanoalloy Thin Films from Alcohol-Assisted Chemical Vapor Deposition", Chem. Mater, 2010, vol. 22, pp. 92-100.
Bahlawane et al., "Self-catalyzed chemical vapor deposition method for the growth of device-quality metal thin films", Microelectronic Engineering, 2007, vol. 84, pp. 2481-2485.
Baklanov et al., "Characterization of Cu surface cleaning by hydrogen plasma," Journal Vac. Sci. Technol 19(4): 1201-1211 (2001).
Baliga, J., "New Designs and Materials Tackle 1 Gb Memory Challenge," Semiconductor International, World Wide Web address: semiconductor.net, Nov. 2000.
Basceri, C., "Electrial Dielectric Properties of (Ba,Sr) $TiO_3$ Thin Film Capacitors for Ultra-High Density Dynamic Random Access Memories", Thesis, 1997.
Bobo et al., Spin Dependent Tunneling Junctions with Hard Magnetic Layer Pinning, Journal of Applied Physics, vol. 83. No. 11, pp. 6685-6687, (1998).
Bursky, "Hit Up IEDM for Gigabit and Denser DRAMs and Merged Logic-Memory," Electronic Design, World Wide Web address: planetee.com, Dec. 1, 1998.
Byun et al., "Epitaxial TiSi2 Growth on Si(100) From Reactive Sputtered TiNx and Subsequent Annealing", Materials Research Soc. Proceedings, vol. 355, Pittsburgh, 1995, pp. 465-470.
Byun et al., *"Formation of a large grain sized TiN layer using $TiN_x$ , the epitaxial continuity at the Al/TiN interface . . . "*, J. Appl. Phys. 78(3), Aug. 1, 1995, pp. 1719-1724.
Byun et al., *"TiN/$TiSi_2$ Formation Using $TiN_x$ Layer and Its Feasibilities in ULSI"*, Jpn. J. Appl. Phys. vol. 35 (1995), pp. 982-986.
Byun et al., *"W as a Bit Line Interconnection in Capacitor-Over-Bit-Line (COB) Structured Dynamic Random Access Memory (DRAM) and Feasible Diffusion Barrier Layer"*, Jpn. J. Appl. Phys. vol. 35 (1996), pp. 1086-1089.
Byun, "Epitaxial C49-TiSi2 Formation on (100)Si Substrate Using TiNx and Its Electrical Characteristics as a Shallow Contact Metallization", J. Electrochem. Soc., vol. 143, No. 6, Jun. 1996, pp. 1984-1991.
Campbell et al., "Titanium dioxide (TiO2)-based gate insulators," IBM J. Res. Develop., May 1999, pp. 383-392, vol. 43, No. 3.
Chae et al., "Atomic Layer Deposition of Nickel by the Reduction of Preformed Nickel Oxide", Electrochemical and Solid-State Letters, 2002, vol. 5, No. 6, pp. C64-C66.
Chau et al., Advanced CMOS Transistors in the Nanotechnology Era for High-Performance, Low-Power Logic Applications, Proceedings 7th International Conference on Solid State and Integrated Circuits Technology (ICSICT), Beijing, China, Oct. 2004, pp. 26-30.
Daub et al., "Ferromagnetic Nanostructures by Atomic Layer Deposition: From Thin Films towards Core-shell Nanotubes", ECS Transactions, 2007, vol. 11, No. 7, pp. 139-148.
Daughton, World Wide Web nve.com-otherbiz-mram2.pdf "Advanced MRAM Concepts," p. 1-6, (Feb 7, 2001).
Elers et al, "Film Uniformity in Atomic Layer Deposition", Chemical Layer Deposition 2006, 12, 13-24.
Fereday et al., "Anhydrous Cobalt (III) Nitrate," Chemical Communications, p. 271 (1968).
Fukuzumi et al., "Liner-Supported Cylinder (LSC) Technology to Realize Ru—$Ta_2O_5$—Ru Capacitor for Future DRAMs," IEEE, IED 2000, Session 34 (2000).
Fullerton et al., "Advanced Magnetic Recording Media for High-Density Data," Solid State Technology 44(i9): 87 (2001).
Gaudet et al., Reaction of thin Ni films with Ge: Phase formation and texture, Journal of Applied Physics, 2006, vol. 100, Issue 3, p. 034306.

Geppert, L., The Amazing Vanishing Transistor Act—Radical changes are in the offing for transistors as their dimensions shrink to a few tens of nanometers, IEEE Spectrum, Oct. 2002, pp. 28-33.
Guo et al., "Modulation of Schottky Barrier Height for NiSi/Si(110) Diodes Using an Antimony Interlayer", IEEE International, May 8-12, 2011, pp. 1-3.
Hamalainen et al., Atomic Layer Deposition of Platinum Oxide and Metallic Platinum Thin Films from Pt(acac)2 and Ozone, Chem. Mater., 2008, vol. 20, Issue 21, pp. 6840-6846.
Hones et al., "MOCVD of Thin Ruthenium Oxide Films: Properties and Growth Kinetics," Chem. Vap. Deposition 6(4): 193-198 (2000).
Hoyas et al., Growth and characterization of atomic layer deposited WC0.7N0.3 on polymer films, Journal of Applied Physics, Jan. 1, 2004, vol. 95, Issue 1, pp. 381-388.
Hu et al., "In situ rapid thermal oxidation and reduction of copper thin films and their applications in ultralarge scale integration," Journal of the Electrochemical Society 148(12): G669-G675 (2001).
Hur'Yeva et al., "Ruthenium Films Deposited by Liquid-Delivery MOCVD using Bis(ethylcyclopentadienyl)ruthenium with Toulene as the Solvent", Chemical Vapor Deposition, vol. 12, pp. 429-434, (2006).
Imai, Tajuki World Wide Web nikkeibp.asiabiztech.com-nea-200008-tech_108675.html, "100 Gbit-Inch HDD Just Around the Corner," p. 1-6, (Aug. 2000).
Inoue et al., "Low thermal-budget fabrication of sputtered-PZT capacitor on multilevel interconnects for embedded FeRAM," IEEE, IED 2000, 2000, Session 34.
Integrated Circuit Engineering Corporation, Practical Integrated Circuit Fabrication Seminar (1998).
Jin et al., "The interfacial reaction of Ni on (100) Si1-xGex (x=0, 0.25) and (111) Ge", available at: http://dspace.mit.edu/bitstream/handle/1721.1/3724/AMMNS014.pdf?sequence=2, Jan. 2003.
Jung et al., "A Novel Ir—$IrO_2$—Pt-PZT-Pt—$IrO_2$-Ir Capacitor for a Highly Reliable Mega-Scale FRAM," IEEE, IED 2000, Session 34 (2000).
Kadota et al., "Ruthenium Films Deposited under H2 by MOCVD using a Novel Liquid Precursor", Interconnect Technology Conference 2009, IITC 2009, IEEE International, pp. 175-176, Jun. 2009.
Kampen et al., Alternative Source/Drain Contact-Pad Architectures for Contact Resistance Improvement in Decanano-Scaled CMOS Devices, Fraunhofer Institute of Integrated Systems and Device Technology (IISB), ULIS Conference Udine Italy, 2008, p. 1.
Kawaguchi, "MPEG1 Decoder LSI for video CD mPD61012," *NEC Device Technology International*, New Products 5 No. 48, pp. 4-8 (Jan. 1998).
Kawamoto et al., "The Outlook for Semiconductor Processes and Manufacturing Technologies in the 0.1-μm Age," Hitachi Review 48(6): 334-339 (1999).
Kim et al., Atomic Layer Deposition of Ni Thin Films and Application to Area-Selective Deposition, Journal of the Electrochemical Society, 2011, vol. 158, Issue 1, pp. D1-D5.
Knisley et al., "Low Temperature Growth of High Purity, Low Resistivity Copper Films by Atomic Layer Deposition", Chem. Mater, 2011, vol. 23, pp. 4417-4419.
Knoops et al., "Remote Plasma and Thermal ALD of Platinum and Platinum Oxide Films", ECS Transactions, 2008, vol. 16, No. 4, pp. 209-218.
Kuhn, K., Moore's Law past 32nm: Future Challenges in Device Scaling, 13th International Workshop on Computational Electronics, 2009, pp. 1-6.
Kuznetsov et al., "Continuity in development of ultra shallow junctions for 130-45 nm CMOS: the tool and annealing methods," Abstract 11th IEEE, RTP 2003 Conference, Sep. 23-26, 2003, Charleston, USA.
Kwon et al., "Ruthenium Bottom Electrode Prepared by Electroplating for a High Density DRAM Capacitor," J. Electrochem. Soc. 151(2): C127-C132 (2004).
Kwon et al., Plasma-enhance atomic layer deposition of RuTiN thin films for the applicaiton of copper diffusion barrier, ALD Conference, 2004.

(56) References Cited

OTHER PUBLICATIONS

Kwon, et al., "Plasma-enhanced Atomic Layer Deposition of Ruthenium Thin Films", Electrochemical and Solid-State Letters, 7(4), C46-C48 (2004).
Lauwers et al., "Low temperature spike anneal for Ni-silicide formation," Microelectronic Engineering 76, 303-310 (MAM2004, Brussels, Belgium, Mar. 7-10, 2004).
Lavela et al., CoFe2O4 and NiFe2O4 synthesized by sol-gel procedures for their use as anode materials for Li ion batteries, Journal of Power Sources, Oct. 11, 2007, vol. 172, Issue 1, pp. 379-387.
Lavoie et al., "Towards implementation of a nickel silicide process for CMOS technologies", Microelectronic Engineering, 2003, vol. 70, pp. 144-157.
Lee et al., "Electroless CoWP boosts cooper reliability, device performance," Semiconductor International, Jul. 1, 2004, 5 pages.
Lee et al., "Interface Properties of Nickel-silicide Films Deposited by Using Plasma-assisted Atomic Layer Deposition", Journal of the Korean Physical Society, 2009, vol. 55, No. 3, pp. 11-53-1157.
Lee et al., "On the Ni—Si phase transformation with/without native oxide", Microelectronic Engineering, 2000, vol. 51-52, pp. 583-594.
Lee et al., "Synthesis of Novel Platinum Precursor and Its Application to Metal Organic Chemical Vapor Deposition of Platinum Thin Films", Bull. Korean Chem. Soc., 2008, vol. 29, No. 8, pp. 1491-1494.
Lim et al., Atomic layer deposition of transition metals, Nature Materials, Nov. 2003, vol. 2, pp. 749-754.
Lou et al., "*The Process Window of a-Si/Ti Bilayer Metallization for an Oxidation-Resistant and Self-Aligned TiSi2 Process*,"IEEE Transactions on Electron Devices, vol. 39, No. 8, Aug. 1992, pp. 1835-1843.
Namba et al., PEALD of Ru layer on WNC ALD barrier for Cu-porous low-k, Proceedings of Advanced Metallization Conference 2006, p. 39.
Nayfeh, "Heteroepitaxial Growth of Relaxed Germanium on Silcon", Stanford University, available at: http://cis.stanford.edu/~saraswat/Thesis/Ammar%20Nayfeh%20Thesis.pdf, Jun. 2006.
NEC Device Technology International, "Current state of leading edge ULSI process technology and future trends," No. 48, pp. 4-8 (1998).
Nemouchi et al, "A comparative study of nickel silicides and nickel germanides: Phase formation and kinetics", Microelectronic Engineering 83 (2006) 2101-2106.
Nilsen et al. ,"Thin Film Deposition of Lanthanum Manganite Perovskite by the ALE process," Journal of Materials Chemistry, vol. 9, 1781-1784, (1999).
Notice of Allowance for U.S. Appl. No. 11/254,071 dated Sep. 17, 2008.
Office Action dated Aug. 10, 2006, received in U.S. Appl. No. 10/394,430.
Office Action dated Aug. 20, 2003, received in U.S. Appl. No. 10/300,169.
Office Action dated Dec. 14, 2006, received in U.S. Appl. No. 10/394,430.
Office Action dated Dec. 24, 2003, received in U.S. Appl. No. 10/300,169.
Office Action dated Jun. 11, 2008, received in U.S. Appl. No. 11/179,791.
Office Action dated Sep. 13, 2007, received in U.S. Appl. No. 10/394,430.
Office Action for U.S. Appl. No. 11/182,734, filed Jul. 15, 2005, dated Aug. 21, 2008.
Office Action for U.S. Appl. No. 11/182,734, filed Jul. 15, 2005, dated Dec. 29, 2008.
Office Action for U.S. Appl. No. 11/182,734, dated Mar. 17, 2009.
Office Action dated Dec. 14, 2015 received in Taiwanese Application No. 101114212, filed Apr. 12, 2012 in 15 pages.
Office Action dated Nov. 15, 2007 for U.S. Appl. No. 11/254,071, filed Oct. 18, 2005.
Onda et al., "Hydrogen plasma cleaning a novel process for IC-packaging," Semicon West 97, Packaging Materials Conference, 1997, pp. D-1-D-10.
Pages et al., "The effect of ramp rate—short process time and partial reactions on cobalt and nickel silicide formation," Proceedings $205^{th}$ ECS Meeting, May 9-13, 2004, San Antonio TX, USA, p. 174-182.
Pakrad, "Pure Tech: Growth of MR-GMR Head Materials," World Wide Web, Puretechinc.com-tech_papers-tech_papers-4.htm, pp. 1-2, (1999).
Paranjpe et al., Atomic Layer Deposition of AlOx for thin Film Head Gap Applications, Journal of Electrochemical Society, V 148 (9), G465-G471.
Park et al., "Metallorganic Chemical Vapor Deposition of Ru and RuO2 using Ruthenocene Precursor and Oxygen Gas", J. Electrochem. Soc., 147[1], p. 203, (2000).
Parsons et al., "Microcontact Patterning of Ruthenium Gate Electrodes by Selective Area," North Carolina State university, presentation at AVS conference on Atomic Layer Deposition (ALD 2004), Helsinki, Finland, Aug. 16, 2004.
Pore et al., Atomic Layer Deposition of Antimony and its Compounds Using Dechlorosilylation Reactions of Tris(triethylsilyl)antimony, Chem. Mater., 2011, vol. 23, Issue 2, pp. 247-254.
Pore et al., "Nickel Silicide for Source-Drain Contacts from ALD NiO Films," ASM ALD Conference (2014) in 22 pages.
Premkumar et al., CVD of Metals Using Alcohols and Metal Acetylacetonates, Part I: Optimization of Process Parameters and Electrical Characterization of Synthesized Films, Chem. Vap. Deposition, 2007, vol. 13, 219-226.
Premkumar et al., CVD of Metals Using Alcohols and Metal Acetylacetonates, Part II: Role of Solvent and Characterization of Metal Films Made by Pulsed Spray Evaporation CVD, Chem. Vap. Deposition, 2007, vol. 13, 227-231.
Premkumar et al., Effect of Solvent on the Growth of Co and $Co_2$ Using Pulsed-Spray Evaporation Chemical Vapor Deposition, Chem. Mater., 2007, vol. 19, 6206-6211.
Ritala et al., "Atomic Layer Deposition," Handbook of Thin Film Materials vol. 1: Deposition and Processing of Thin Films, chapter 2, pp. 103-159 (2002).
Rodriguez et al., Experimental and Theoretical Studies on the Reaction of H2 with NiO: Role of O Vacancies and Mechanism for Oxide Reduction, J. Am. Chem. Soc., 2002, vol. 124, Issue 2, pp. 346-354.
Rodriguez et al., Reduction of CuO in H2: in situ time-resolved XRD studies, Catalysis Letters, Feb. 2003, vol. 85, Issue 3-4, pp. 247-254.
Rooth et al., "Atomic Layer Deposition of Iron Oxide Thin Films and Nanotubes using Ferrocene and Oxygen as Precursors", Chem. Vap. Deposition, 2008, vol. 14, 67-70.
Rossnagel, "The latest on Ru—Cu interconnect technology," Solid State Technology, Feb. 2005, Online, pp. 1-4.
Sakurai et al., "Adsorption of ruthenium tetroxide on metal surfaces," *J. Phys. Chem. American Chemical Society*, vol. 89, pp. 1892-1896 (1985).
Satta et al., "The Removal of Copper Oxides by Ethyl Alcohol Monitored in Situ by Spectroscopic Ellipsometry," Journal of the Electromechanical Society, 150 (5) , pp. 300-306 (2003).
Satyanarayana et al., Nanosized spinel NiFe2O4: A novel material for the detection of liquefied petroleum gas in air, Materials Chemistry and Physics, Sep. 28, 2003, vol. 82, Issue 1, pp. 21-26.
Scheffe et al., "Atomic layer deposition of iron(III) oxide on zirconia nanoparticles in a fluidized bed reactor using ferrocene and oxygen", Thin Solid Films, 2009, vol. 517, pp. 1874-1879.
Schubert, E. F. "Silicon Versus Germanium—A Historical Perspective," Prof. E. F. Schubert Group Seminar, http://www.ecse.rpi.edu/~schubert/Course-Teaching-modules/A027-Silicon-versus-germanium---A-historical-perspective.pdf, downloaded on Sep. 15, 2014.
Shao et al., An alternative low resistance MOL technology with electroplated rhodium as contact plugs for 32nm CMOS and beyond, 1-4244-1070-3-07, 2007 IEEE.
Singer, Peter, "Progress in Copper: A Look Ahead", Semiconductor International, May 1, 2002.

(56) References Cited

OTHER PUBLICATIONS

SOI Technology: IMB's Next Advance in Chip Design, 1998.
Solanki et al., "Atomic Layer Deposition of Copper Seed Layers," Electrochemical and Solid-State Letters 3(10): 479-480 (2000).
Sundani et al., "Oral Presentation of Dual Damascene Process," slides, Nov. 19, 1998.
Suntola, "Atomic Layer Epitaxy," Handbook of Crystal Growth, vol. 3, chapter 14, pp. 601-663 (1994).
Thompson et al., Moore's law: the future of Si microelectronics, Materials Today, Jun. 2006, vol. 9, No. 6, pp. 20-25.
Tomitaka et al., Magnetic characterization and self-heating of various magnetic nanoparticles for medical applications, Nanoelectronics Conference (INEC), 2010 3rd International, Jan. 3-8, 2010, pp. 896-897.
Tung et al., Atomic Layer Deposition of Noble Metals: Exploration of the Low Limit of the Deposition Temperature, J Mater. Res., vol. 19, No. 11, p. 3353-3357 (Nov. 2004).
U.S. File History for U.S. Appl. No. 12/339,672, filed Dec. 19, 2008, entitled "Selective Silicide Process".
U.S. File History for U.S. Appl. No. 13/084,341, filed Apr. 11, 2011, entitled "Selective Silicide Process".
U.S. File History for U.S. Appl. No. 13/504,079, filed Sep. 17, 2012, entitled "Synthesis and Use of Precursors for ALD of Group VA Element Containing Thin Films".
Ueno et al. Cleaning of CHF3 plasma-etched SiO2—SiN—Cu via structures using a hydrogen plasma, an oxygen plasma and hexafluoracetylacetone vapors, J. Vac. Sci. Technology B vol. 16, No. 6, pp. 2986-2995 (1998).
Utriainen et al., "Studies of metallic thin film growth in an atomic layer epitaxy reactor using $M(acac)_2$ (M=Ni, Cu, Pt) precursors," Applied Surface Science 157: 151-158 (2000).
Utriainen et al., "Studies of NiO thin film formation by atomic layer epitaxy," Materials Science and Engineering B54: 98-103 (1998).
Van Houtum et al., "*TiSi2 strap formation by Ti-amorphous-Si reaction*," J. Vac. Sci. Technol. B 6(6), Nov./Dec. 1988, pp. 1734-1739.
Wang et al. "Phase Formations in Co/Si, Co/Ge, and Co/Si1-xGex by Solid Phase Reactions". MRS Proceedings, vol. 320; 1993. http://dx.doi.org/10.1557/Proc-320-397.
Wang, Shan X. "Advanced Materials for Extremely High Density Magnetic Recording Heads," Department of Materials Science and Engineering, Department of Electrical Engineering, Stanford University, Stanford, CA 94305-4045, presentation.
Winbond News Release, "Successful development of capacitor technology for next generation memory," World Wide Web address: winbond.com, Dec. 13, 2000.
Won et al., "Conformal CVD-ruthenium process for MIM capacitor in giga-bit DRAMs," IEEE, IED 2000, Session 34 (2000).
Wong et al., International Symposium on VLSI Technology, Systems and applications (VLSI-TSA), Apr. 21-23, 2008, pp. 36-37, Hsinchu, Taiwan.
World Wide web, magahaus.com-tech-westerndigital-shitepapers-gmr_wp.shtml, "GMR Head Technology: Increased Areal Density and Improved Performance Areal Density," pp. 1-4, (Feb. 2000).
World Wide Web, pc.guide.com-ref-hdd-op-heads-techGMR-c.html, "Giant Magnetoresistive (GMR) Heads," pp. 1-4.
World Wide web, semiconductor.net-semiconductor-issues-Issues-1998-feb98-docs-emerging.asp, "GMR Read-Write Heads Yield Data Storage Record," pp. 1-2 (Feb. 1998).
World Wide Web, stoner.leeds.ac.uk-research-gmr.htm, "Giant Magnetoresistance," pp. 1-6.
Xu et al., "A breakthrough in low-k barrier-etch stop films for copper damascene applications," Semiconductor Fabtech, 2000, pp. 239-244, 11th Edition.
Yagishita et al., "Cleaning of Copper Surface Using Vapor-Phase Organic Acids," MRS Proceedings, vol. 766, MRS Spring 2003 Meeting, Apr. 21-25, 2003, Symposium E, Session E3, Paper E3.28.
Yang et al., Physical, Electrical, and Relaiability Characterization of Ru for Cu Interconnects, 2006 International Interconnect Technology Conference, pp. 187-190, ISBN 1-4244-0103-8-06, 2006 IEEE.
Yoon et al., "Development of an RTA process for the enhanced crystallization of amorphous silicon thin film", Electrochemical Society Proceedings 2000-9: 337-343 (2000).
Yoon et al., "Investigation of $RuO_2$ -incorporated Pt layer as a Bottom Electrode and Diffusion Barrier for High Epsilon Capacitor Applications," Electrochemical and Solid-State Letters 3(8): 373-376 (2000).
Yoon et al., "Tantalum-ruthenium dioxide as a diffusion barrier between Pt bottom electrode and $TiSi_2$ ohmic contact layer for high density capacitors," Journal of Applied Physics 86(5): 2544-2549 (1999).
Yoon et al., 197th Meeting Program Information II, The Electrochemical Society, 197th Meeting—Toronto, Ontario, Canada, May 14-18, 2000, Program Information, I1—Rapid Thermal and Other Short-Time Processing Technologies I, Electronics Division—Dielectric Science and Technology Division—High Temperature Materials Division, 2000, Wednesday, May 17, 2000, New Applications of RTP, Co-Chairs: A. Fiory and D.-L Kwong, Time 11:10 Abs#550, Title: Development of RTA Process for the Crystallization of A-Si Thin Film—Y.-G. Yoong, T.-K. Kim, K.-B. Kim J.-Y. Chio, B.-I. Lee, and S.-K. Joo (Seoul National Univ.).
Zhang Qingchun "Germanium MOSFETs with High-k Gate Dielectric and Advanced Source/Drain Structure," National University of Singapore, 2007.

\* cited by examiner

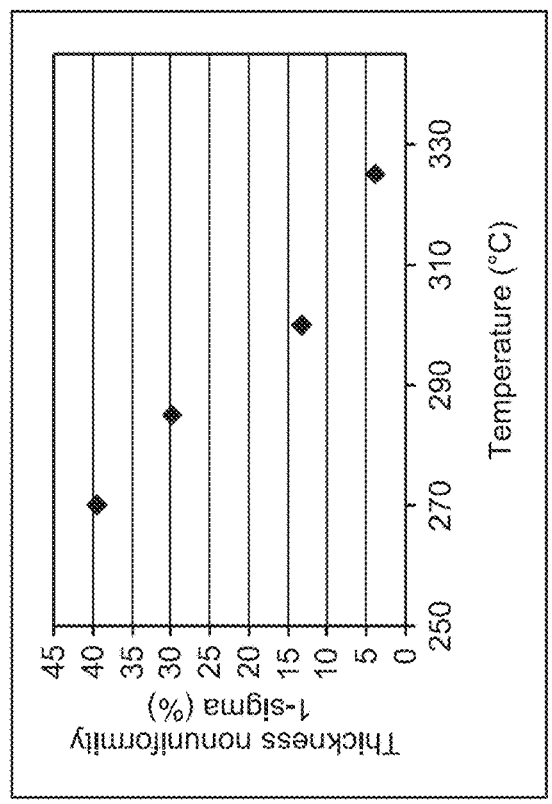
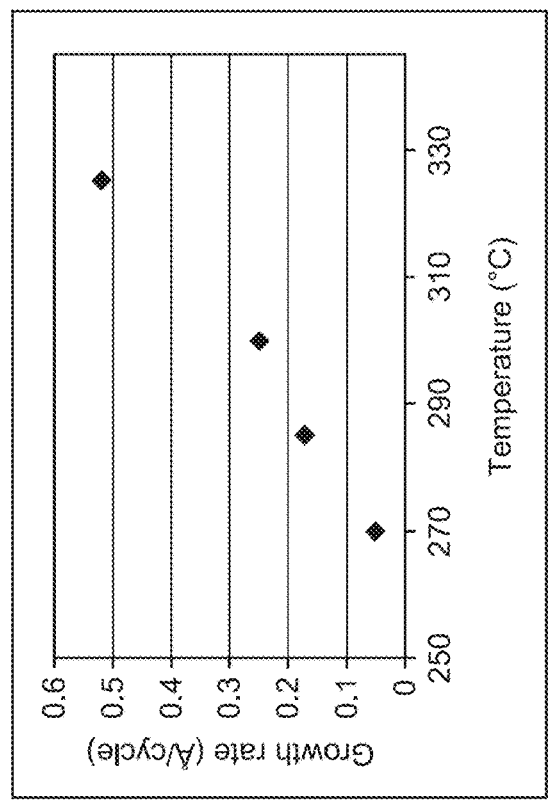
FIG. 21A
FIG. 21B

METAL SILICIDE, METAL GERMANIDE, METHODS FOR MAKING THE SAME

CROSS-REFERENCE TO RELATED APPLICATIONS

The present application is a continuation of U.S. patent application Ser. No. 14/815,633, filed Jul. 31, 2015, which is a continuation of U.S. patent application Ser. No. 13/452,402, filed Apr. 20, 2012, now U.S. Pat. No. 9,129,897, which claims priority under 35 U.S.C. § 119(e) to U.S. Provisional Application Nos. 61/478,214 filed Apr. 22, 2011; 61/485,532 filed May 12, 2011, and 61/526,607 filed Aug. 23, 2011, which are all hereby incorporated by reference in their entirety.

This application is related to U.S. patent application Ser. No. 12/339,672, filed Dec. 19, 2008, and International Application No. PCT/US10/53982, filed Oct. 25, 2010. The entire contents of all of the above applications are hereby incorporated by reference and should be considered a part of this specification.

BACKGROUND OF THE INVENTION

Field of the Invention

The invention relates generally to the field of semiconductor device manufacturing and, more particularly, to methods for depositing nickel and forming metal silicide and germanide.

Description of the Related Art

In forming advanced semiconductor devices, part of the silicon that is present in gate, source and drain structures can be converted into low-resistivity metal silicides. This is done to realize a conductive path with a low bulk resistivity on the one hand, and to ensure a good contact resistance on the other hand. In the past, $TiSi_2$ was used for this process; then later $CoSi_2$ was the silicide of choice for the most advanced devices. As both $TiSi_2$ and $CoSi_2$ consume a relatively large amount of silicon, there has been a switch to using $NiSi_x$ to form these conductive paths. This silicide combines a low bulk resistivity with a relatively low amount of silicon consumption.

A process of forming $NiSi_x$ on a substrate 80 is depicted in FIGS. 1A-1D. First, the basic structure of the transistor is formed, including a gate electrode 10, a gate dielectric 20, a source 30 and a drain 40 (FIG. 1A). On the sides of the polycrystalline silicon (poly-Si) gate, sidewall spacers 50 are deposited to insulate the sidewalls of the poly-Si/gate oxide stack from films that are subsequently formed and facilitate self-aligned doping of the source/drain regions 30/40. A nickel film 60 (Ni) is then deposited, usually through a physical vapor deposition (PVD, e.g., sputtering) process (FIG. 1B). The wafer is heated to a temperature at which the Ni reacts with the underlying Si to form nickel silicide ($NiSi_x$) 70. Depending on the anneal temperature, $NiSi_x$ as used herein can represent $Ni_2Si$, $NiSi$, $NiSi_2$ and/or a mixture thereof. The temperature is typically kept low enough (e.g., <about 600° C.) to inhibit formation of $NiSi_2$, which has a relatively high resistivity.

In principle, nickel silicide ($NiSi_x$) forms in a self-aligned fashion, i.e., only at locations where Ni and Si are both present. Self-aligned silicidation is also known in the art as "salicidation" and the self-aligned resultant metal compound has been referred to as "salicide." In the illustrated arrangement, such locations have silicon exposed below the metal Ni layer. Thus, ideally, no silicide growth takes place at the position of the spacers 50 (FIG. 1C). While the top of the gate 10 is shown as exposed to the self-aligned silicidation process, in other arrangements only the source/drain regions are silicided and the gate can include a top insulation layer to prevent silicidation.

FIG. 1C schematically shows that the formation of the silicide film continues until the Ni film has been completely consumed in the regions above exposed silicon. Above the silicon there is no Ni left to react. This process, generally referred to as RTP1 for the first rapid thermal processing step, is generally conducted at temperatures in the range of about 300-400° C.

After this process is finished, the substrate is exposed to a selective metal etch (e.g., HCl, or piranha ($H_2SO_4$:$H_2O_2$) dip). In this wet etch process, the unreacted Ni is etched while the $NiSi_x$ film remains intact (see FIG. 1D). This results in a low-resistivity silicide on top of the gate, source, drain and any other exposed silicon surfaces. By removing the unreacted Ni, these structures are electrically isolated from each other. Usually, a subsequent anneal (RTP2) at, e.g., 450° C. is applied to ensure conversion of any $Ni_2Si$ formed during silicidation to the lower resistivity phase NiSi.

Thus, in theory, the $NiSi_x$ allows the formation of a conductive path with a low bulk resistivity and a good contact resistance. In practice, however, this process may not be effective in all contexts. For example, for certain semiconductor structures, such as a nonplanar multiple gate transistor, such as FinFETs, it may be desirable to form silicide on vertical walls, in addition to the tops of the gate, source, and drain regions. In other semiconductor devices, it may be beneficial to form silicide in narrow openings or trenches. The result is that the step coverage of the Ni over the three-dimensional structure is poor due, at least in part, to the limitations in the PVD processes used for depositing the Ni. Variation in thicknesses due to a non-uniform deposition of Ni creates variation in resistivity across the structures on the surface of a substrate. Such variation is undesirable because it can introduce non-uniformities in the electrical performance of electrical devices formed using the NiSi films.

While the above describes nickel silicide contact to silicon regions, the same principles apply to solid reaction of metals with semiconductor regions more generally.

In addition to its use in formation of conductive silicides, for example in advanced semiconductor devices and magnetic heads in hard drives, nickel films can also be used in other contexts, such as catalysts for carbon nanotube growth.

Depositing metal by more conformal processes like chemical vapor deposition (CVD) or atomic layer deposition (ALD) has not been straightforward. Accordingly, there is a need for methods of forming conformal nickel films as well as conformal metal-semiconductor compound films having more uniform resistivity on complex structures. Also there is a need to form ultrathin and uniform metal compound layers.

SUMMARY OF THE INVENTION

In accordance with one aspect, a method is provided for silicidation. The method includes providing a substrate having at least one exposed silicon region and depositing an interface layer on the exposed silicon region. A metal oxide film is deposited by atomic layer deposition (ALD) over the interface layer. The substrate is heated to form a metal silicide film over the exposed silicon regions using metal from the metal oxide film.

In accordance with another aspect, a method is provided for semiconductor fabrication. The method includes depositing an antimony layer on a substrate by atomic layer deposition, where the substrate includes exposed silicon. A metal oxide film is deposited on the antimony layer by atomic layer deposition. The exposed silicon is silicided with metal from the metal oxide film In some embodiments nickel silicide (NiSi) is formed. An antimony layer is deposited on a substrate comprising exposed silicon. Nickel oxide (NiO) is deposited directly over the antimony layer, for example by ALD. Silicidation is carried out by annealing and the substrate may be etched to expose the NiSi.

In accordance with another aspect, a method is provided for selective silicidation. The method includes providing an interface film over an exposed silicon-containing region in a manner that avoids oxidation of the exposed silicon-containing region. The method also includes forming a metal oxide thin film on the interface film by at least one cycle of an atomic layer deposition (ALD) process. One cycle of the ALD process includes contacting a substrate with a metal source precursor, and contacting the substrate with an oxygen source precursor. The metal from the metal oxide film is reacted with silicon from the silicon-containing region to form a metal silicide film over remaining portions of the silicon-containing region.

In accordance with another aspect, a method for selective silicidation is provided. The method includes providing an interface film over an exposed silicon-containing region in a manner that avoids oxidation of the exposed silicon-containing region. The method also includes forming a metal oxide thin film on the interface film by chemical vapor deposition (CVD) process. The CVD process includes contacting a substrate with a metal source precursor, and contacting the substrate with an oxygen source precursor. The metal from the metal oxide film is reacted with silicon from the silicon-containing region to form a metal silicide film over remaining portions of the silicon-containing region.

In accordance with another aspect, a method for forming metal germanide is provided. The method includes providing a substrate having at least one exposed germanium region. A metal oxide film is deposited over the exposed germanium region. The substrate is heated to form a metal germanide film over the exposed germanium region using metal from the metal oxide film.

In another aspect, metal silicide is formed by a process that forms both metal germanide and metal silicide. A germanium layer is deposited over a substrate comprising exposed silicon, for example by CVD. Metal oxide is deposited over the germanium layer, for example by ALD. Silicidation and germanidation is carried out simultaneously by annealing, thus forming a metal germanide layer over a metal silicide layer. The substrate may subsequently be etched to remove the metal germanide and expose the metal silicide. In some embodiments a nickel silicide is formed by depositing NiO over a germanium interlayer, followed by silicidation/germanidation and etching.

In accordance with another aspect, a method for forming metal germanide is provided. The method includes providing a substrate having at least one exposed silicon region. A germanium layer is deposited on the exposed silicon region. A metal oxide film is deposited over germanium layer. The substrate is heated to form a metal germanide film over the exposed germanium regions using metal from the metal oxide film.

In accordance with another aspect, doped metal silicides or germanides can be formed. In some embodiments, metal oxide deposition cycles and dopant oxide deposition cycles are carried out at a specific ratio to achieve the desired dopant concentration. The oxides are reduced and a doped metal silicide or germanide is formed. In some embodiments, NiO and $PtO_x$ deposition cycles are used and annealing forms a Pt-doped Ni-silicide or germanide.

In another aspect, methods of depositing nickel thin films by vapor deposition are provided. In some embodiments a nickel thin film is formed on a substrate by a vapor deposition process comprising alternately and sequentially contacting a substrate with a vapor phase nickel precursor, such that a layer of the nickel precursor forms on the substrate surface, and a second reactant that reacts with the nickel precursor to form a nickel thin film. The nickel precursor may be, for example, bis(4-N-ethylamino-3-penten-2-N-ethyliminato)nickel (II). The second reactant may be, for example, a reducing agent, hydrogen, or forming gas. In some embodiments the vapor deposition process is an ALD-type process involving controlled surface reactions.

In some embodiments, a three step vapor deposition process is used to deposit nickel thin films. A substrate in a reaction space is alternately and sequentially contacted with a nickel precursor, an organic reducing agent and hydrogen or forming gas.

In accordance with another aspect, methods of silicidation and/or germanidation are provided in which nickel is deposited directly over a substrate, without forming an intermediate oxide. Nickel may be deposited, for example, by the vapor deposition processes disclosed herein. Briefly, nickel is deposited directly over silicon and/or germanium by a vapor deposition process, such as an ALD or ALD-type process. Following deposition, silicidation and/or germanidation is carried out by annealing, for example at 200° C. or greater, 300° C. or greater, 400° C. or greater, or even 500° C. or greater. The annealing may be carried out in a reducing atmosphere, such as in the presence of hydrogen or forming gas. Following silicidation and/or germanidation, the substrate may be etched to remove unconverted nickel or other material from the substrate surface and expose the NiSi or NiGe.

According to another aspect, methods are provided for doping the metal silicides and/or germanides with platinum or other dopant.

BRIEF DESCRIPTION OF THE DRAWINGS

The invention will be better understood from the detailed description of the preferred embodiments and from the appended drawings, which are meant to illustrate and not to limit the invention, and wherein:

FIG. 21A is a graph showing the effect of growth temperature on the Ni film growth rate from bis(4-N-ethylamino-3-penten-2-N-ethyliminato)nickel (II) and forming gas.

FIG. 21B is a graph showing the effect of growth temperature on the Ni film uniformity bis(4-N-ethylamino-3-penten-2-N-ethyliminato)nickel (II) and forming gas.

DETAILED DESCRIPTION OF THE PREFERRED EMBODIMENT

Figure 1A:
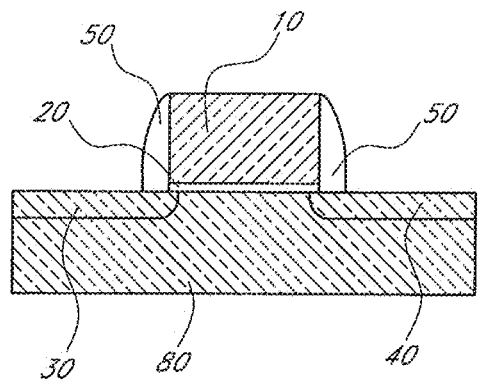
FIGS. 1A-1D are schematic cross-sections of a partially fabricated integrated circuit, illustrating the formation of $NiSi_x$ films on the top of gate, source and drain regions of a transistor in accordance with the prior art.
Figure 1B:
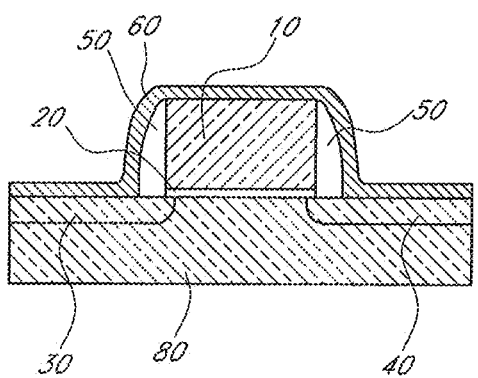
Figure 1C:
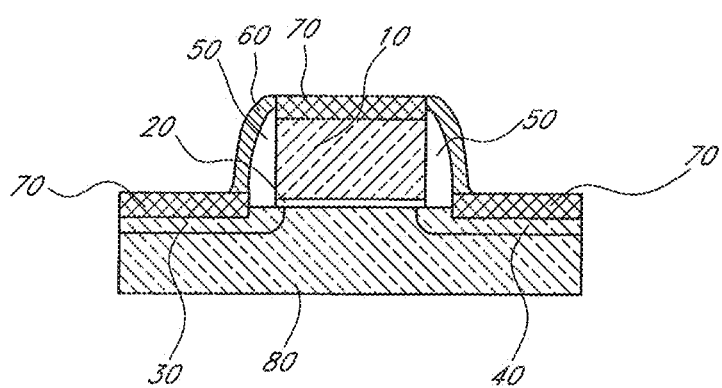

As semiconductor structures evolve due to advances in technology, dimensions shrink and new techniques in silicidation are needed in order to form uniform silicide layers. Particularly for self-aligned silicidation, a high degree of control over the composition and extent of silicidation is desirable to avoid excessive consumption of silicon in active areas with very precisely designed junction depth.

Moreover, the methods described herein can provide such control not only for traditional lateral transistor designs, with horizontal source/drain (S/D) and gate surfaces, but can also provide such control even on non-horizontal (e.g., vertical) surfaces, and on complex three-dimensional (3D) structures. Traditional methods of silicidation are most effective when the desired regions of silicide deposition are mainly horizontal surfaces, such as source and drain regions, and when there is little topography at the time of deposition. In situations in which the desired regions of silicide formation include vertical surfaces, or when deposition is conducted over a high aspect ratio features, the traditional methods utilizing physical vapor deposition (PVD) can consume too much of silicon structures in forming the silicide because traditional methods of PVD silicidation require relatively thick films to be deposited due to poor step coverage and poor uniformity across the three dimensional structures and non-uniform resistivities. Examples in which self-aligned silicidation is desired over complex 3D structures include gate walls of 3D transistors, contact surfaces within deep and narrow contact vias and topographically complicated raised source/drain structures. Non-uniformity can be a problem even with planar transistors of ever-shrinking horizontal dimensions, as the high aspect ratios created by such scaling require excess deposition by PVD to ensure the minimum required deposition reaches the most inaccessible regions of the topography. While particularly useful in transistors below technology nodes 65 nm, and preferably for the technology nodes below 45 nm, and more preferably for the technology nodes from 32 nm to 22 nm or smaller nodes, it will be appreciated that the teachings herein have applicability to forming devices of any dimension. The need for more conformal deposition is exacerbated for three-dimensional transistor structures and deposition into small or high aspect ratio openings that expose the silicon to be silicided.

One possible solution to the problem of poor step coverage in the self-aligned silicidation of high topography integrated circuit structures is to employ a known conformal deposition process, such as atomic layer deposition (ALD). Until now, ALD of Ni, however, had not been shown to provide good step coverage. Therefore, one could not simply replace the PVD step in a silicidation process flow with an ALD step in order to achieve good step coverage. Co-owned U.S. application Ser. No. 12/339,672, filed Dec. 19, 2008, published as U.S. Patent Publication No. 2010-0155859 A1 (hereinafter "the '672 application"), provides a solution for this problem in teaching deposition of a metal oxide by ALD and then converting the metal oxide to a metal. The metal can then be converted to a silicide in a self-aligned silicidation process. Thus, the '672 application provides mechanisms for conformal supply of a metal layer for use in self-aligned silicidation. The '672 application provides ALD processes for metal oxide deposition, conditions for reduction to metal and silicidation reactions, and post-anneal processes for converting metal silicides to lower resistivity phases, which are useful for employment in the sequences taught herein. The entirety of the '672 application is incorporated herein by reference.

In addition, as described below, ALD-type methods for depositing conformal nickel films have now been developed. Thus, in some embodiments conformal nickel is deposited by methods as described herein and used in salicidation or germanidation processes directly. For example, conformal Ni deposition can be used in place of the deposition of nickel oxide and subsequent reduction to nickel in embodiments described below. In some embodiments, interlayers, such as Ge or Sb interlayers, are not used when direct nickel deposition is used.

One problem encountered in the use of metal oxide en route to silicidation is a tendency to form silicon oxide at the interface of the metal oxide and silicon. The inventors have found that, depending upon the precursor and conditions employed in the process, sufficient interfacial silicon oxide can inhibit the migration of silicon and metal across the interface and thus complicate the silicidation reaction. This is also illustrated in reference Lee et al., Microelectronic Engineering 51-52 (2000) 583-594. Some precursors used in the metal oxide deposition, which are oxidative in nature, easily form silicon oxide in contact with a pure Si surface, while some other precursors do not form oxide that easily. Many of the metal precursors in metal oxide ALD processes have been found to react more easily with oxygen precursors in the metal oxide deposition. Those same precursors that most efficiently form metal oxide, however, also have the greatest tendency to induce interfacial silicon oxide that can interfere with the solid phase silicidation reaction.

The processes taught herein inhibit interaction between the deposited metal oxide and the silicon surface by providing an interfacial layer on the silicon by a process that does not oxidize the silicon surface. The interfacial layer is nevertheless capable of nucleating subsequent ALD of the desired metal oxide, and does not interfere with migration of silicon and metal across the interface for the solid phase silicidation reaction.

Figure 2A:
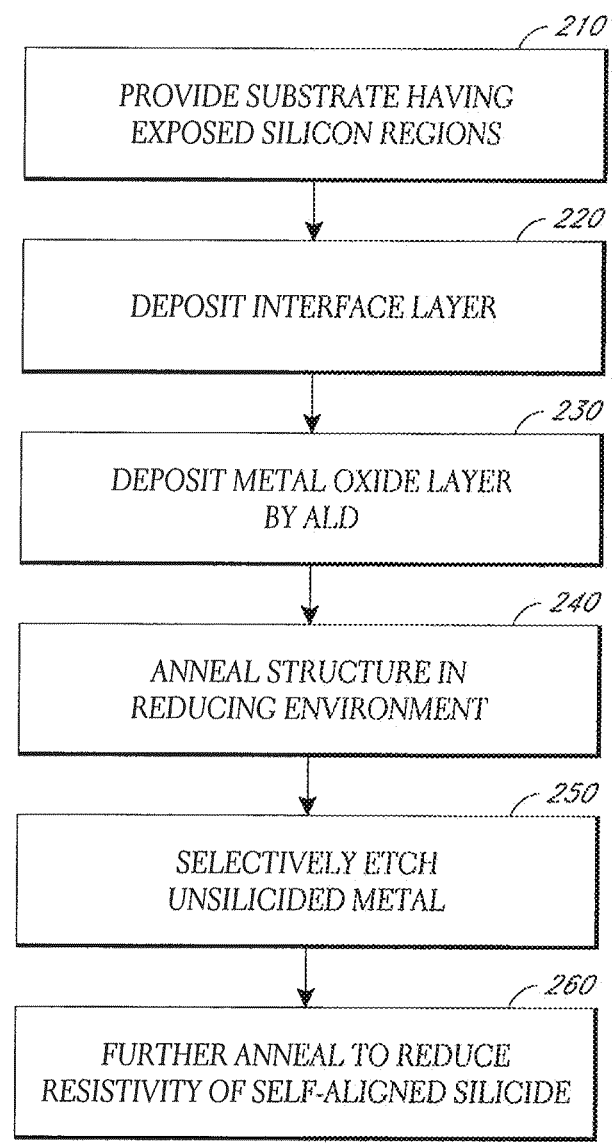
FIGS. 2A and 2B are flow charts illustrating process flows in accordance with certain embodiments of the present invention.

FIG. 2A illustrates a process of silicidation in accordance with one embodiment. Initially, a substrate is provided 210 and has exposed silicon regions. While the process is applicable to a bare blanket silicon structure or wafer, the "self-aligned" processes are of course more useful in applications with patterned substrates having exposed silicon and non-silicon regions. Typically silicon region(s) are exposed and subjected to a native oxide cleaning process prior to subsequent depositions.

The substrate may be patterned and previously partially fabricated with transistor structures, such as the planar transistor of FIG. 1A, in which silicon source and drain regions are exposed, and optionally a silicon gate may also be exposed. Non-silicon regions can include insulating regions (e.g., silicon oxide, silicon nitride, silicon oxynitride), such as sidewall spacers and field oxide. Other examples of patterned substrates include more complex three-dimensional (3D) transistor designs with exposed silicon and non-silicon regions. It will be understood that self-aligned silicidation is applicable to numerous other contexts in integrated circuit design, typically where reduced contact resistance is desired. Examples of suitable contexts are discussed below in connection with FIGS. 3A-5C.

Subsequently, an interface layer is deposited 220, preferably by conformal vapor deposition techniques such as CVD and ALD. In one example, a solid layer, preferably with a high percentage of electrical dopant, can be deposited, such as antimony (Sb), arsenic (As) or germanium antimony alloy (GeSb) or mixtures thereof; however, other types of interface layers can be employed. Desirably, the deposition of the interface does not induce oxidation of the underlying silicon, the interface film protects the silicon from oxidation during the subsequent deposition of metal oxide, and it permits ready migration of metal and/or silicon across the interface without undue energy injection. Undue energy can be such as destroys integrated circuit structures, such as transistor junctions.

Experimentation has demonstrated that a solid layer of antimony (Sb) serves the desired functions, and can additionally provide electrical advantages. Antimony can be deposited conformally by ALD methods. In one example, $SbCl_3$ and $(Et_3Si)_3Sb$ are alternately exposed to the substrate, which is maintained at 100° C., for 100 cycles, producing between about 3 nm and 5 nm of antimony (Sb). Further details and alternatives for ALD of Sb and other electrical dopants, and alloys thereof, are provided below and in international application No. PCT/US10/53982, filed Oct. 25, 2010, the entire disclosure of which is incorporated herein by reference. Methods for antimony and antimony compound deposition by ALD are also disclosed in Pore et al., "Atomic Layer Deposition of Antimony and its Compounds Using Dechlorosilylation Reactions of Tris(triethylsilyl)antimony," CHEMISTRY OF MATERIALS 23 (2011) 247-254 (available on the internet with the search term DOI:10.1021/cm102904f). The conformality of ALD facilitates deposition of a minimal thickness of the interface layer that will inhibit oxidation from the subsequently deposited metal oxide. The minimal thickness, in term, is advantageous in avoiding interference with the migration of atoms during silicidation.

Subsequently, a metal oxide layer is deposited by ALD 230 over the layer of electrical dopant. Experiments have been successfully performed using nickel oxide. Methods include those disclosed in the '672 application, incorporated hereinabove. Methods for ALD of metal oxide are also disclosed in Utriainen et al., "Studies of metallic thin film growth in an atomic layer epitaxy reactor using $M(acac)_2$ (M=Ni, Cu, Pt) precursors," APPLIED SURFACE SCIENCE 157 (2000), pp. 151-158, and Utriainen et al., "Studies of NiO thin film formation by atomic layer epitaxy", MATERIALS SCIENCE AND ENGINEERING B54 (1998), pp. 98-103, the disclosures of which are expressly incorporated herein by reference. Further details and options for the ALD of metal oxide are provided below. In alternative embodiments, the metal oxide could be deposited by other conformal techniques, such as CVD; conformality and composition control of ALD is generally superior to those of CVD, however, and the lower temperatures afforded by ALD help preserve transistor junction depth and doping profiles. Accordingly, ALD has advantages, at the expense of slower deposition.

The metal oxide is reduced to metal (e.g., NiO reduced to Ni), and the metal reacts with the silicon through the interface layer that was formed in block 220. In the illustrated embodiment, reduction and silicidation reaction are conducted simultaneously by annealing 240 in a reducing atmosphere. As discussed below with respect to FIG. 2B, in place of simultaneous reduction and silicidation, reduction can be conducted initially in a lower temperature process with strong reducing agents, and the silicidation anneal can be subsequent. Regardless of whether conducted in one or two processes, the result is silicidation of exposed silicon by migration of metal from the metal oxide and/or silicon from the underlying exposed silicon across the interface. At sufficiently high anneal temperatures (e.g., equal to or greater than about 250° C. and in some embodiments equal to or greater than about 300° C., equal to or greater than about 400° C., or even equal to or greater than about 500° C.), reduction can be accomplished by annealing in a moderately reducing atmosphere, such as hydrogen gas ($H_2$) or hydrogen and nitrogen gas (forming gas or $H_2/N_2$). In one example, reduction/silicidation was induced by annealing the substrate with an ALD NiO layer over an ALD Sb layer for 2 minutes at 550° C. in forming gas (5% $H_2$ and 95% $N_2$). X-ray diffraction analysis showed no remaining nickel or nickel oxide in the silicided regions. In some embodiments annealing is carried out at a temperature of about 350° C. or greater.

Additionally, in regions where silicon is not accessible (e.g., where the metal oxide is deposited over an insulator), the metal oxide is converted into a metal. In a typical self-aligned silicidation process, any such unreacted (reduced) metal remaining after the silicidation reaction can be removed by selective metal etch 250, as is well-known in the art. For example, dipping the substrate in dilute aqueous HCl and/or $HNO_3$ or piranha etch can etch most metals, including nickel, without appreciable attack of silicon, silicon oxide or other non-metal materials used in integrated circuit manufacture.

Anneal time can be varied to control aspects of the NiSi. For example, in some embodiments increasing anneal time can be used to increase NiSi thickness and/or to decrease resistivity. In some embodiments the anneal may be carried out for 1, 2, 3, 4, 5, 6, 7, 8, 9, 10 or more minutes.

Optionally, the structure can be further annealed 260 for reduction of resistivity if the first anneal 240 leaves a high resistivity phase of metal silicide.

Figure 10:
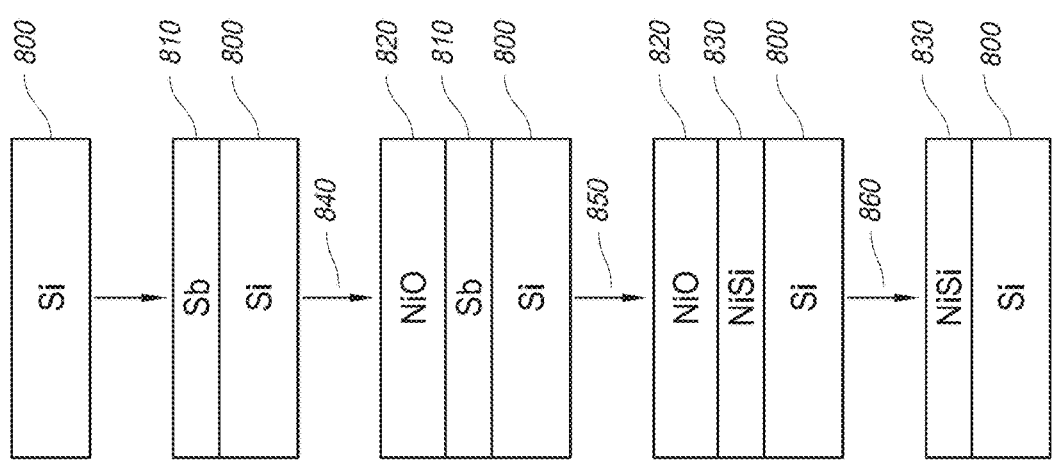
FIG. 10 illustrates a process flow for forming a nickel silicide using a Sb interlayer.

One embodiment for forming NiSi using an Sb interlayer is illustrated schematically in FIG. 10. A Sb interlayer 810 is deposited over a Si substrate 800, for example by ALD. A NiO layer 820 is subsequently deposited 840 directly over the Sb layer 810, such as by ALD and a salicidation reaction 850 is carried out by annealing, for example by heating to 500° C. In the silicidation reaction at least a portion of the nickel from the NiO layer 820 reacts with silicon in the Si layer 800 to form NiSi 830. Any remaining unreacted Ni or NiO is removed and the NiSi layer 830 exposed by etching 860, as described above, leaving a layer of NiSi 830 over the Si substrate 800. An example of such a deposition process is provided in Example 4.

Figure 2B:
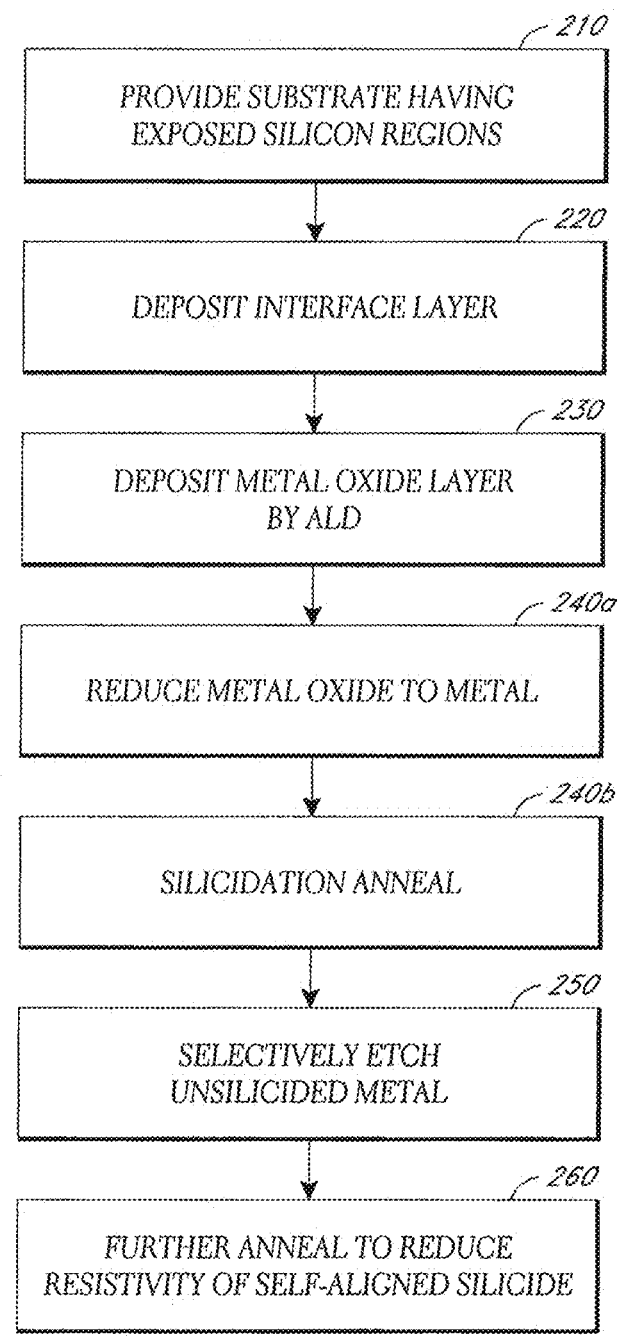

FIG. 2B illustrates another process for forming metal silicide. Similar steps to those of FIG. 2A are referenced by like reference numerals. Unlike the process of FIG. 2A, forming a metal silicide by reacting silicon with metal from the metal oxide is shown as being accomplished by distinct processes: reduction 240a of the metal oxide to metal; and silicidation anneal 240b. Reduction 240a prior to a separate silicidation reaction can be accomplished at lower temperatures (e.g., between room temperature and about 300° C.) and with stronger reducing agents, such as hydrogen containing plasma, hydrogen radicals or hydrogen atoms and reactive organic compounds, which contain at least one functional group selected from the group of alcohol (—OH), aldehyde (—CHO), and carboxylic acid (—COOH). A higher temperature anneal (e.g., greater than 400° C.) or a rapid thermal anneal can then be tailored for silicidation reaction of the already-formed metal layer over exposed silicon. The intervening interface layer may remain intact or may become partially diffused during the initial reduction. Preferably the interface layer does not form a silicide or is not capable of forming silicide under the used process conditions. Further options and conditions for metal oxide reduction and silicidation anneal are provided below.

Figure 3A:
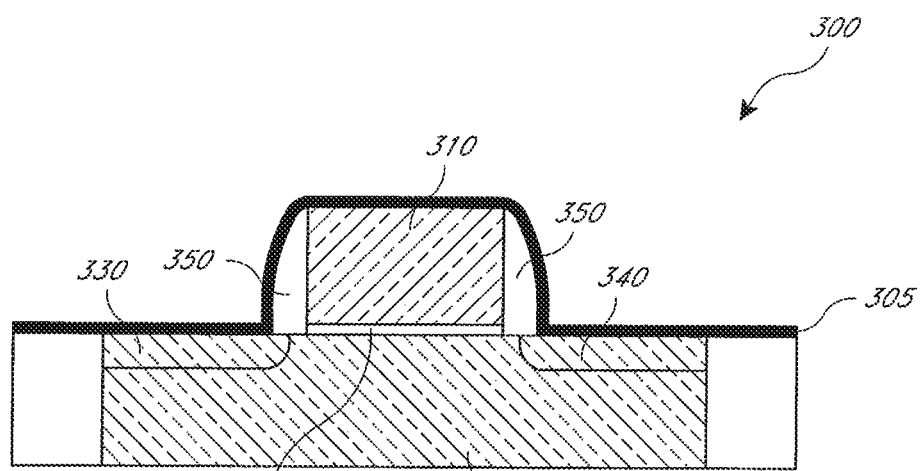
FIGS. 3A-3C are a series of schematic cross-sections of a planar transistor, illustrating silicidation of source/drain and gate regions in accordance with an embodiment of the present invention.

With reference now to FIG. 3A, a planar transistor 300 is shown after formation of an interface layer 305. The interface layer 305 can be formed as described about with respect to block 220 of FIG. 2B, e.g., by ALD of a suitable film for the functions described herein, in some cases an electrical dopant, particularly solid antimony (Sb). The transistor 300 is formed within and on a substrate 380 and includes a gate electrode 310 over a gate dielectric 320. The gate dielectric 320 overlies a transistor channel, which is sandwiched between heavily doped source region 330 and drain region 340. The gate electrode 10 is protected by dielectric sidewall spacers 350, which can facilitate self-aligned source/drain doping as well as partially self-aligned contact formation. Field isolation 355 (e.g., shallow trench isolation) is also shown for electrical isolation of the transistor 300 from adjacent devices.

Figure 3B:
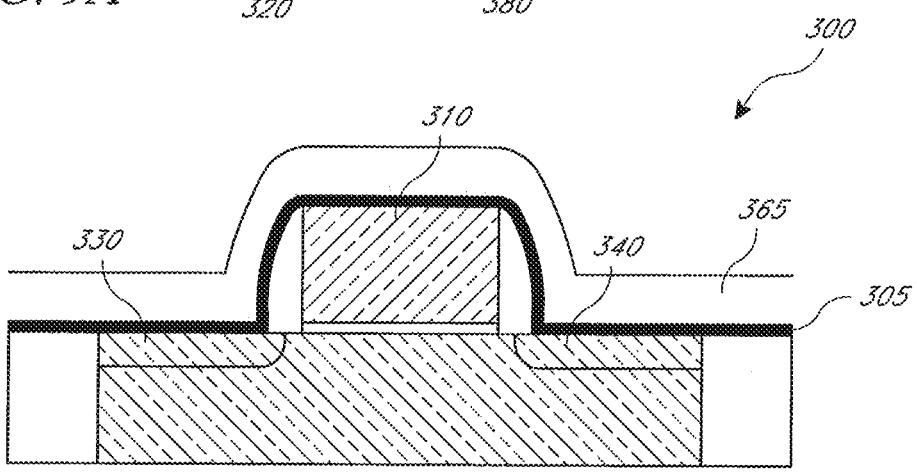

Referring to FIG. 3B, the transistor 300 is shown after deposition of a metal oxide layer 365. As discussed above, ALD of metal oxide, such as nickel oxide (NiO) advantageously forms a conformal layer such that the same thickness of the metal oxide layer 365 forms at both high points (e.g., over the gate electrode 310) and low points (e.g., over the source/drain regions 330/340).

Figure 1D:
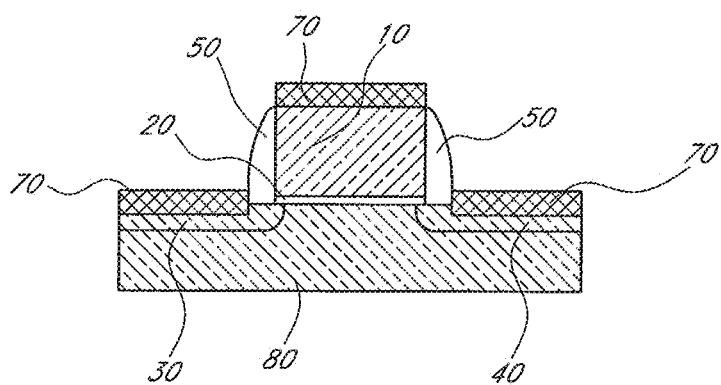
Figure 3C:
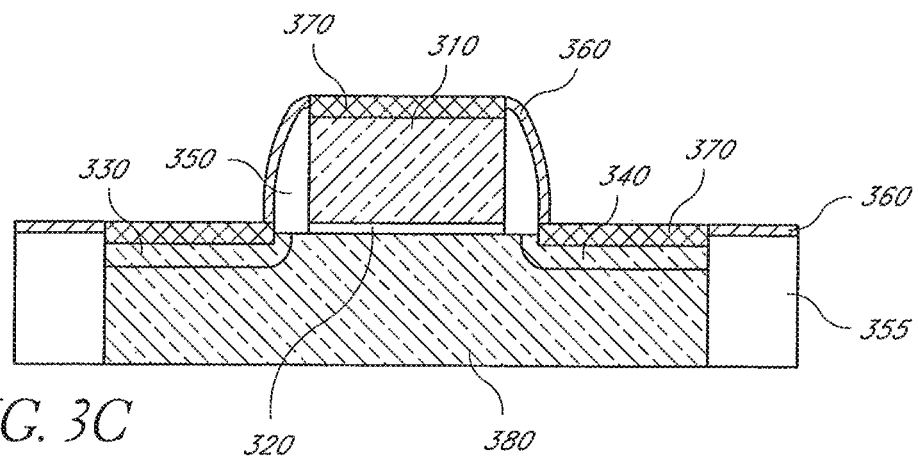

Referring to FIG. 3C, the transistor 300 is shown after reduction and silicidation reactions. As discussed with respect to FIGS. 2A and 2B, these reactions can occur in one process or in distinct processes. Metal and silicon readily migrate across the interface formed by the interface layer 305 (FIG. 3B) to form a metal silicide 370 at regions where silicon was exposed to the interface layer deposition, e.g., at the upper surfaces of the source 330, drain 340 and gate electrode 310. Moreover, the metal oxide is reduced to a metal layer 360 in regions where silicon is not accessible (e.g., over the field isolation 355 and dielectric sidewall spacers 350). As discussed above with respect to FIG. 1D, the unreacted metal can be readily selectively etched without harm to the remaining metal silicide, silicon and dielectric structures.

Figure 4A:
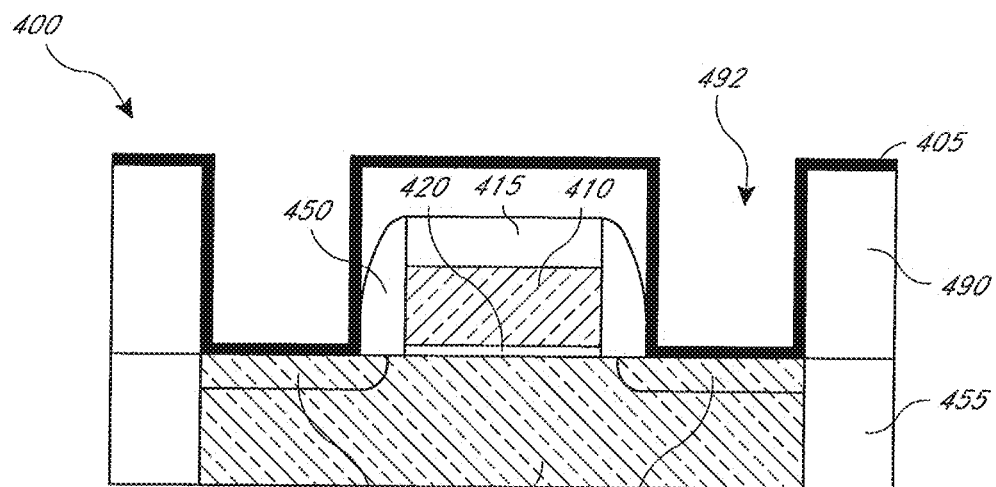
FIGS. 4A-4C are a series of schematic cross-sections a transistor with contacts to be formed after insulation by a thick interlayer dielectric, illustrating silicidation of source/drain regions in accordance with another embodiment.
Figure 4B:
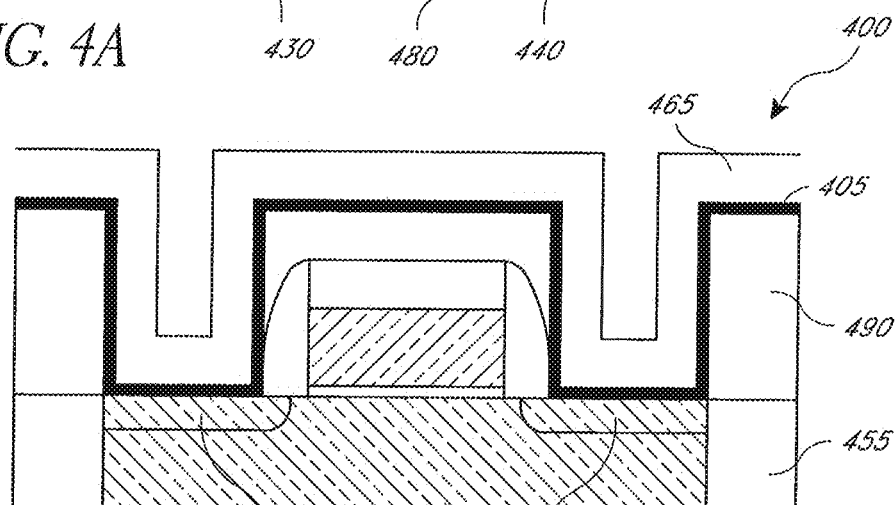
Figure 4C:
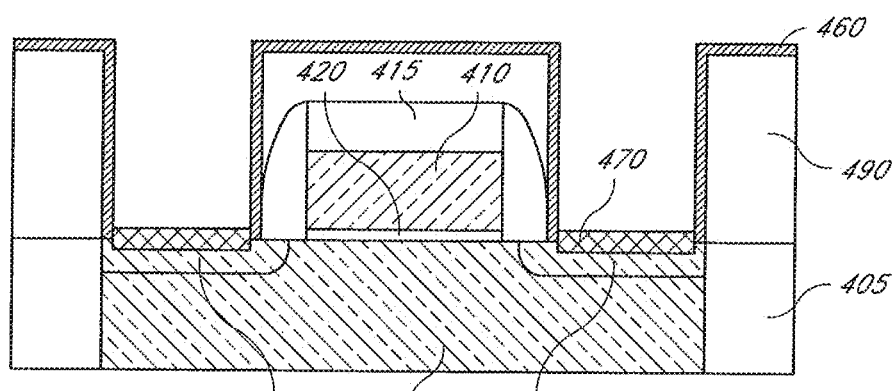

FIGS. 4A-4C illustrate a similar sequence on a similar planar transistor 400. Similar parts to those of FIGS. 3A-3C are referenced by similar reference numerals in the 400 range. The difference between FIGS. 3A-3C and FIGS. 4A-4C is that in FIGS. 4A-4C the interface layer 405 and the metal oxide layer 465 are provided over a thick insulating layer 490 through which contact vias 492 have been formed to open contacts to the source region 430 and drain region 440. In the illustrated arrangement the gate electrode 410 is protected on an upper surface by a dielectric cap 415. The skilled artisan will appreciate that at other locations of the integrated circuit, a contact opening to the gate electrode may be opened simultaneously with the contact vias 492 shown in the cross-section of FIG. 4A.

As integrated circuit dimensions are scaled, the aspect ratio (height:width) of such contact openings 492 continue to climb, making deposition therein challenging. ALD, as described herein, of both the interface layer 405 and the metal oxide layer 465 that provides metal for the silicidation facilitates conform coating such that sufficient metal can be provided at the bottoms of the vias 492 without the need for excess deposition at higher regions. Better control of the supply of metal is thereby afforded, and excess silicon consumption during the silicidation can be avoided.

FIG. 4C shows the result of metal oxide reduction and silicidation, leaving metal silicide layers 470 at the surface of the source/drain regions 430/440. A metal layer 460 is left over regions without access to silicon, such as over surfaces of the insulating layer 490, which can then be removed by selective metal etching, and the contact vias 492 can be filled with a contact plug, as is known in the art.

Figure 5A:
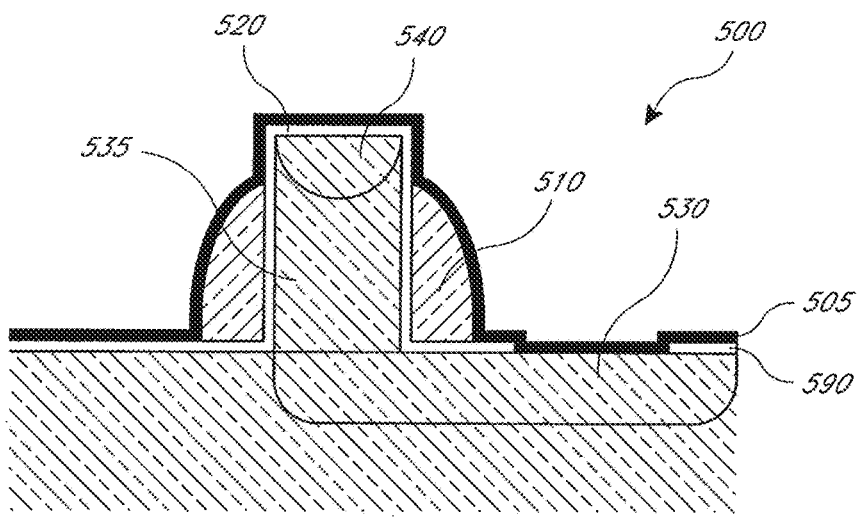
FIGS. 5A-5C are a series of schematic cross-sections of a three-dimensional transistor, illustrating silicidation of source/drain regions and vertical gate sidewalls in accordance with another embodiment.
Figure 5B:
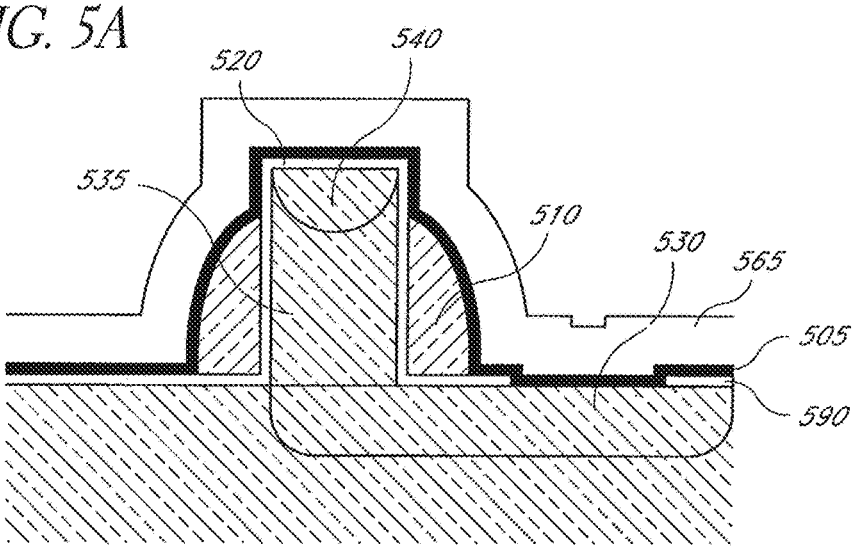
Figure 5C:
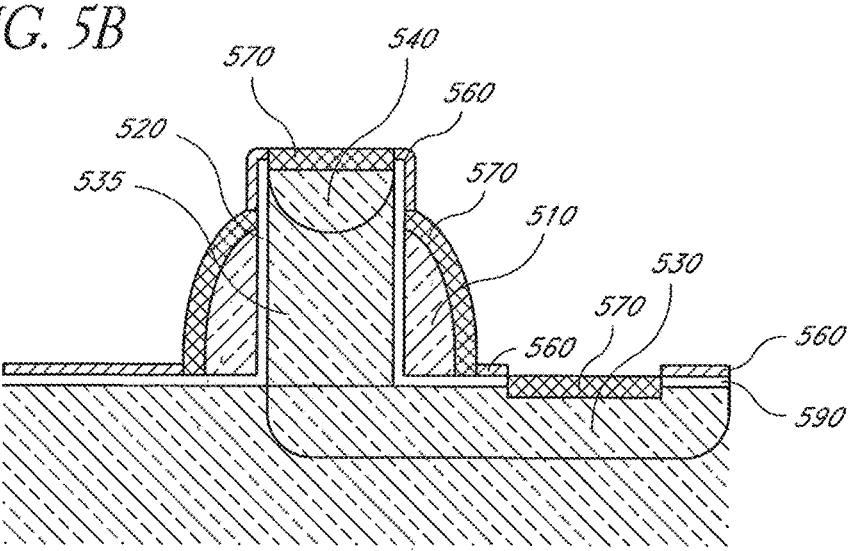

Referring to FIGS. 5A-5C, silicidation according to the methods described herein is illustrated in the context of a three-dimensional transistor. In particular, FIG. 5A shows a vertical transistor 500 with a source region 530 at the base of a vertically extending pillar 535 of semiconductor material. The source region 530 extends laterally to a contact opening in an insulating layer 590, where it is exposed for silicidation of its surface. A drain region 540 is formed at an upper end of the semiconductor pillar 535. A gate dielectric 520 is formed on the sidewall surfaces of the pillar 535, separating the pillar 535 from a gate electrode 510. The gate electrode 510 can be formed, e.g., as a sidewall spacer surrounding the semiconductor pillar 535. In the illustrated embodiment, the gate electrode 510 comprises silicon (e.g., amorphous or polysilicon) and exposed for silicidation prior to deposition of the interface layer 505 of, e.g., solid antimony.

Referring to FIG. 5B, after deposition of the interface layer 505, a metal oxide layer 565 is deposited. ALD for both the interface layer 505 and metal oxide layer 565 facilitate conformal formation over the 3D structure, and an even thickness can be formed not only on the exposed horizontal surface of the source region 530 and the drain region 540, but also on the vertical sidewalls of the gate electrode 510.

Referring to FIG. 5C, the result of reduction of the metal oxide and silicidation is shown. A metal silicide 570 is formed where the interface layer and metal oxide layer had access to silicon, particularly the exposed surfaces of the source region 530, drain region 540, and gate electrode 510. Additionally, a metal layer 560 from the metal oxide is left on surfaces with no access to free silicon, such as over the insulating layer 590 and gate dielectric 520. As noted above, this excess or unreacted metal 560 can be readily removed by selective metal etch prior to further processing.

FIGS. 5A-5C illustrate self-aligned silicidation on a particularly simple example of a 3D transistor design. In certain embodiments, the three-dimensional transistor may include double-gate field effect transistors (DG FET), and other types of multiple gate FETs, including FinFETs for example as found in IBM J. Res. & Dev. Vol. 46 No. 2/3 (2002) by H.-S. P. Wong and Tri-gate FET's for example as found in VLSI Technology Digest of Technical Papers, June 2006, pp. 62-63 by J. Kavalieros and which are each incorporated herein by reference.

Another 3D structure for which the silicidation techniques taught herein are particularly useful is a 3D elevated source/drain structure, as taught in U.S. Patent Publication No. 2009/0315120 A1 by Shifren et al., the disclosure of which is incorporated herein by reference in its entirety. Shifren et al. teach elevated source/drain structures that include vertical sidewalls, which would be difficult to silicidize in a self-aligned manner without the methods taught herein.

In some embodiments, a germanium substrate can be used instead of a silicon substrate, or a silicon substrate with germanium regions can be used. In such cases, after a solid source of metal is formed thereover and reacted, a metal germanide will form over exposed germanium regions. In some embodiments, a metal silicide is not formed. The reaction can be called germanidation. Germanidation works similarly to silicidation and thus the silicidation techniques described herein can also be applied to germanidation of exposed germanium regions using metal oxide deposition and reduction/germanidation reaction. In fact, experimentation has found that germanidation by this technique can be successfully performed, and the problems of native oxide avoided, without depositing an interface layer between the germanium and metal oxide. Moreover, reduction of metal oxide and germanidation has been found to advantageously avoid intervening high resistivity phases of metal germanide. See, e.g., Example 3 below.

Figure 12:
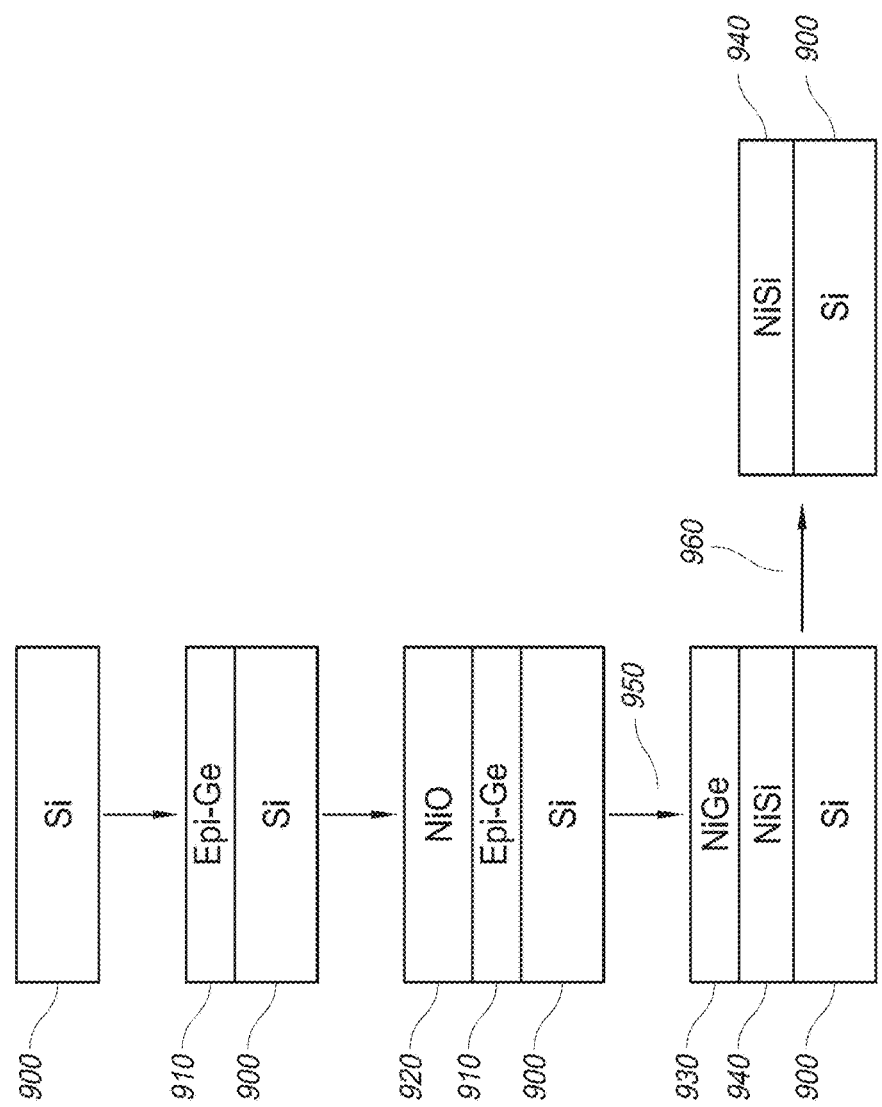
FIG. 12 illustrates a process flow for forming a nickel silicide using a germanium interlayer.

In some embodiments, in addition to a metal germanide, metal silicide is also formed. The metal germanide may be removed, along with any remaining metal or metal oxide, by etching, leaving a metal silicide layer over the silicon substrate. An exemplary embodiment is illustrated in FIG. 12. A germanium layer 910 is deposited over a silicon substrate 900. For example, an epitaxial germanium layer (epi-Ge) may be deposited by CVD on a silicon substrate. A metal oxide layer 920, here shown as a nickel oxide layer, is deposited directly over the germanium layer 910. Salicidation/germanidation 950 is carried out, such as by annealing. For example, annealing may be at about 350° C. or greater, or even 400° C. or greater. In some embodiments annealing is carried out in forming gas. The salicidation/germanidation process forms a layer of germanide 930, here NiGe, over a silicide layer 940, here NiSi. Etching 960 may subsequently be performed to remove the germanide layer 930, leaving a metal silicide 940 over the silicon substrate. Examples of such processes are described in Example 5.

Atomic Layer Deposition (ALD)

As noted above, processes described herein enable use of vapor deposition techniques to deposit conformal layers that serve as solid sources of metal for silicidation, such as chemical vapor deposition (CVD) or atomic layer deposition (ALD). Among vapor deposition techniques, ALD has the advantage of providing high conformality at low temperatures. Both conformality and low temperatures afford precise control over the degree of silicidation and preserve designed transistor junction depths, increasing yield.

ALD type processes are based on controlled, self-limiting surface reactions of precursor chemicals. Gas phase reactions are avoided by feeding the precursors alternately and sequentially into the reaction chamber. Vapor phase reactants are separated from each other in the reaction chamber, for example, by removing excess reactants and/or reactant by-products from the reaction chamber between reactant pulses.

Briefly, a substrate is loaded into a reaction chamber and is heated to a suitable deposition temperature, generally at lowered pressure. Deposition temperatures are maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved.

A first reactant is conducted into the chamber in the form of vapor phase pulse and contacted with the surface of a substrate comprising a three dimensional structure. Conditions are preferably selected such that no more than about one monolayer of the precursor is adsorbed on the substrate surface in a self-limiting manner. Excess first reactant and reaction byproducts, if any, are purged from the reaction chamber, often with a pulse of inert gas such as nitrogen or argon.

Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 to 20 seconds, more preferably between about 1 and 10, and still more preferably between about 1 and 2 seconds. However, other purge times can be utilized if necessary, such as when depositing layers over extremely high aspect ratio structures or other structures with complex surface morphology is needed. The appropriate pulsing times can be readily determined by the skilled artisan based on the particular circumstances.

A second gaseous reactant is pulsed into the chamber where it reacts with the first reactant bound to the surface. Excess second reactant and gaseous by-products of the surface reaction are purged out of the reaction chamber, preferably with the aid of an inert gas. The steps of pulsing and purging are repeated until a thin film of the desired thickness has been formed on the substrate, with each cycle leaving no more than a molecular monolayer. Some ALD processes can have more complex sequences with three or more precursor pulses alternated, where each precursor contributes elements to the growing film. Reactants can also be supplied in their own pulses or with precursor pulses to strip or getter adhered ligands and/or free by-product, rather than contribute elements to the film. Additionally, not all cycles need to be identical. For example, a binary film can be doped with a third element by infrequent addition of a third reactant pulse, e.g., every fifth cycle, in order to control stoichiometry of the film, and the frequency can change during the deposition in order to grade film composition.

As mentioned above, each pulse or phase of each cycle is preferably self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space provide near perfect self-limiting behavior and thus maximum conformality, but steric hindrance results in less than one molecular layer per cycle. Limited CVD reactions mixed with the self-limiting ALD reactions can raise the deposition speed.

Examples of suitable reactors that may be used include commercially available ALD equipment such as the F-120® reactor, Pulsar® reactor and Advance® 400 Series reactor, available from ASM America, Inc of Phoenix, Ariz. and ASM Europe B.V., Almere, Netherlands. In addition to these ALD reactors, many other kinds of reactors capable of ALD growth of thin films, including CVD reactors equipped with appropriate equipment and means for pulsing the precursors can be employed. In some embodiments a flow type ALD reactor is used. Preferably, reactants are kept separate until reaching the reaction chamber, such that shared lines for the precursors are minimized. However, other arrangements are possible, such as the use of a pre-reaction chamber as described in U.S. application Ser. No. 10/929,348, filed Aug. 30, 2004 and Ser. No. 09/836,674, filed Apr. 16, 2001, the disclosures of which are incorporated herein by reference.

The Sb and metal oxide ALD processes described below can optionally be carried out in a reactor or reaction space connected to a cluster tool. In a cluster tool, because each reaction space is dedicated to one type of process, the temperature of the reaction space in each module can be kept constant, which improves the throughput compared to a reactor in which is the substrate is heated up to the process temperature before each run.

A stand-alone reactor can be equipped with a load-lock. In that case, it is not necessary to cool down the reaction space between each run.

Interface Layer

As noted above, the interface layer is selected such that the deposition thereof does not induce oxidation of the underlying silicon, the interface film protects the silicon from oxidation during the subsequent deposition of metal oxide, and it permits ready migration of metal and/or silicon across the interface without undue energy injection. Thus, the material of the interface does not react with the underlying silicon or the metal oxide precursors, under conditions of the metal oxide deposition, in a manner that inhibits the later silicidation reaction. The intervening interface layer may remain intact or may become partially diffused during the initial reduction of metal oxide to metal. Preferably the interface layer does not form a silicide or is not capable of forming silicide under the process conditions. Some thin (e.g., less than 5 nm) semiconductor layers serve well as the interface layer. The interface layer can be an elemental film, or can be a mixture of elemental films. In order to maintain an optimally thin layer to minimize interference with the silicidation reaction while ensuring full coverage, conformal deposition processes, such as CVD or ALD, are preferred.

In some embodiments, germanium films, preferably epitaxial germanium films are deposited on at least exposed silicon windows of the substrate as an interface layer over exposed regions of silicon. Germanium deposition can be conducted by CVD, e.g., by providing germane ($GeH_4$) and hydrogen gas ($H_2$). Careful control of conditions, such as providing a clean, oxide-free silicon surface, can provide epitaxial growth of the Ge on exposed silicon surfaces. Moreover, the Ge deposition can be performed selectively over the exposed silicon, as Ge naturally nucleates more readily over silicon compared to over oxides, and addition of HCl or $Cl_2$ can aid selectivity. After loading the patterned substrate into a deposition chamber, a clean silicon interface can first be provided by a high temperature (e.g., 600° C. or higher) bake process, which is known in the art for sublimation of native oxide and other contaminants. After the bake process, the substrate temperatures are generally reduced to Ge deposition temperatures (e.g., 450° C. or lower), during which reoxidation can be prevented either by exclusion of oxygen and moisture from the reactor, or by provision of a small flow of surface active compound such as dichlorosilane (DCS) or other Si or Ge precursor, as disclosed, e.g., in U.S. Pat. No. 7,238,595, the entire disclosure of which is incorporated herein by reference. Deposition of pure Ge over Si can then proceed, e.g., using the seed-phase deposition and subsequent higher speed depositions disclosed in U.S. Pat. No. 7,329,593, the entire disclosure of which is incorporated herein by reference.

A Ge interface layer is preferably thick enough to avoid oxidation of the underlying silicon during the subsequent deposition of metal oxide. At the same time, the layer is thin enough to not consume all the metal of the overlying metal oxide when forming the metal germanide, and thin enough that the resultant metal germanide allows diffusion of metal therethrough for reaction with the underlying silicon. For example, the Ge interface layer may be between about 1 nm and 5 nm. However, even thicker Ge interface layers may allow diffusion and silicidation of underlying silicon. Example 2 below and FIG. 8 indicates that Ge films of 7 nm to 15 nm allowed silicidation below the resultant metal germanide. In separate experiments, Ge films of 4 nm were also observed to allow silicidation of the underlying Si.

In another embodiment, the overlying metal oxide and the thickness of the Ge interface layer are such that the supply of metal is consumed by metal germanidation, or the extent of the anneal is limited, and little or no silicidation occurs below the metal germanide. In these cases, the resultant structure may be metal germanide between the silicon substrate and the contact plug, with no intervening metal silicide. In some arrangements it is possible to use a thick enough Ge interface layer to leave some unreacted Ge as well.

Unlike silicon substrates where SiO tends to interfere with silicidation, metal oxide deposited over Ge has been shown to effectively react with Ge to form a metal germanide without interference from oxides. However, germanium oxides can be spotty and dirty, introducing non-uniformities, such that it may be desirable (depending upon the purity of the environment between interface formation and germanidation) to clean any native oxide off the Ge surface prior to metal oxide deposition. For example, chemical treatment and/or annealing can readily remove the relatively volatile native GeO. An intentional formation of a $GeO_2$ layer thereafter, or other modification of Ge surface, can provide a smoother starting surface for subsequent metal oxide deposition and obtain a better interface below the metal germanide.

As noted above and discussed in more detail below, if the substrate itself is a Ge substrate or an epitaxial Ge layer thick enough for device formation, there is no need to deposit a separate interface layer. See Example 3 below, FIG. 9 and attendant description.

In some embodiments, the interface layer comprises an electrical dopant layer. As noted above, international application no. PCT/US10/53982, filed Oct. 25, 2010, the entire disclosure of which is incorporated herein by reference, discloses methods of depositing electrical dopant layers, and layers of alloys of electrical dopants, by ALD. Examples for antimony (Sb), arsenic (As) and germanium antimony (GeSb) and mixtures thereof are provided below as particularly suitable interface layers for nucleating subsequent ALD or CVD of metal oxide and for allowing migration of metal and silicon across the interface in the solid phase silicidation reaction. Further details on the processes and precursors therefore can be found in the incorporated international application.

In some embodiments, elemental antimony (Sb) films are deposited by ALD preferably without the use of plasma.

The discovery of suitable Sb precursors for use in an ALD process without plasma allows for deposition of elemental antimony. In some embodiments, elemental antimony can be used as a phase change material. In some embodiments, Sb deposition cycles can also be used in combination with deposition cycles of other materials. The ratio of cycles can be selected to control the stoichiometry, including Sb content, in the deposited film to achieve a film with a desired composition and structure. For example, films comprising Sb—Te, Ge—Sb—Te, and Ge—Sb can be deposited.

Figure 6:
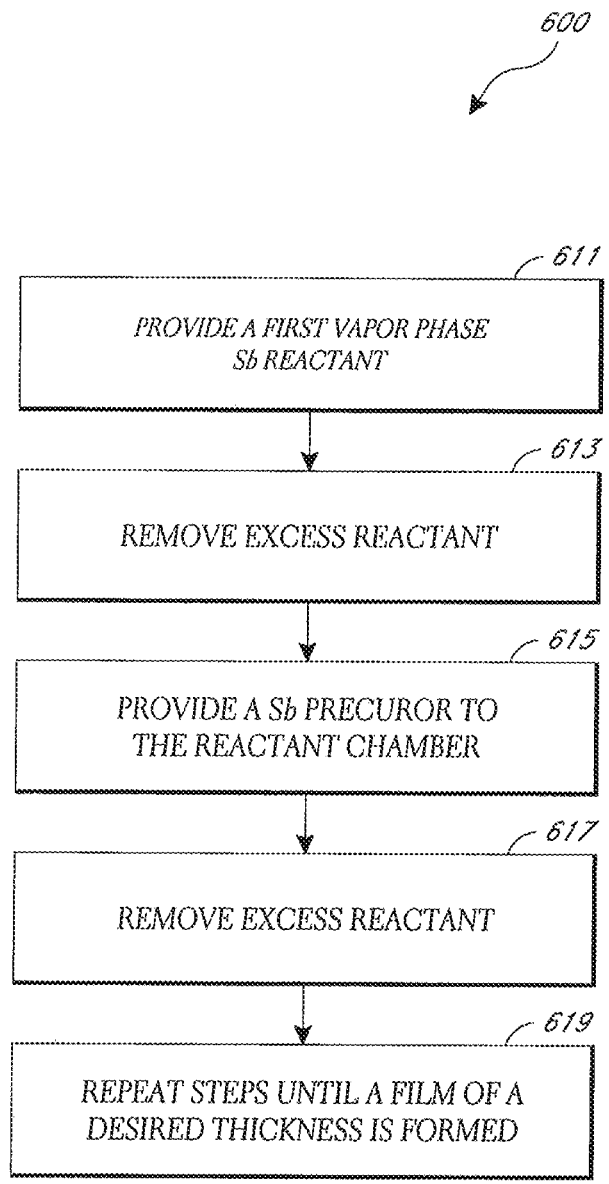
FIG. 6 is a flow chart illustrating a sequence for depositing a solid antimony film by atomic layer deposition (ALD), which is useful as an interface layer prior to depositing metal oxide.

FIG. 6 is a flow chart generally illustrating a method 600 for forming a Sb thin film in accordance with one embodiment. According to some embodiments, an elemental Sb thin film is formed on a substrate in a reaction chamber by an ALD type process comprising multiple Sb deposition cycles, each deposition cycle comprising:

providing a first vapor phase reactant pulse comprising a first Sb precursor 611 into the reaction chamber to form no more than about a single molecular layer of the Sb precursor on the substrate;

removing excess first reactant from the reaction chamber 613;

providing a second vapor phase reactant pulse comprising a second Sb precursor 615 to the reaction chamber such that the second Sb precursor reacts with the first Sb precursor on the substrate to form Sb; and removing excess second reactant and reaction byproducts, if any, from the reaction chamber 617.

This can be referred to as the Sb deposition cycle. Each Sb deposition cycle typically forms at most about one monolayer of Sb. The Sb deposition cycle is repeated until a film of a desired thickness is formed 619. In some embodiments a Sb film of from about 10 Å to about 2000 Å, preferably from about 20 Å to about 60 Å, is formed for use as an interface layer prior to metal oxide deposition.

Although the illustrated Sb deposition cycle begins with provision of the first Sb precursor, in other embodiments the deposition cycle begins with the provision of the second Sb precursor. It will be understood by the skilled artisan that provision of the first Sb precursor and second Sb precursor are interchangeable in the ALD cycle.

In some embodiments, the reactants and reaction byproducts can be removed from the reaction chamber by stopping the flow of Sb precursor while continuing the flow of an inert carrier gas such as nitrogen or argon.

In preferred embodiments the first Sb precursor has a formula of $SbX_3$, wherein X is a halogen element. More preferably the Sb source is $SbCl_3$, $SbBr_3$, $SbF_3$ or $SbI_3$. Most preferably the Sb source is $SbCl_3$.

In some embodiments, the reactants do not include an oxygen source. The term "oxygen source" refers to reactants that comprise oxygen, such as water, ozone, alcohol, oxygen atoms, oxygen plasma and oxygen radicals, typically used in ALD for depositing metal oxides. In preferred embodiments the reactants do not include water, ozone or alcohol.

Preferably, the second reactant is a Sb precursor with a formula of $Sb(SiR^1R^2R^3)_3$, wherein $R^1$, $R^2$, and $R^3$ are alkyl groups comprising one or more carbon atoms. The $R^1$, $R^2$, and $R^3$ alkyl groups can be selected based on the desired physical properties of the precursor such as volatility, vapor pressure, toxicity, etc In some embodiments the first Sb precursor is $SbCl_3$ and the second Sb precursor is $Sb(SiEt_3)_3$ or $Sb(SiMe_3)_3$.

The substrate temperature during forming the Sb thin film deposition is preferably less than 250° C. and more preferably less than 200° C. and even more preferably below 150° C.

Pressure of the reactor can vary much depending from the reactor used for the depositions. Typically reactor pressures are below normal ambient pressure.

The skilled artisan can determine the optimal reactant evaporation temperatures based on the properties of the selected precursors. The evaporation temperatures for the second Sb precursor, such as $Sb(SiEt_3)_3$, which can be synthesized by the methods described herein, is typically about 85° C. The evaporation temperature for the first Sb precursor, such as $SbCl_3$, is typically about 30° C. to 35° C.

The skilled artisan can determine the optimal reactant pulse times through routine experimentation based on the properties of the selected precursors and the desired properties of the deposited Sb thin film. Preferably the first and second Sb reactants are pulsed for about 0.05 to 10 seconds, more preferably about 0.2 to 4 seconds, and most preferably about 1 to 2 seconds. The purge steps in which excess reactant and reaction by-products, if any, are removed are preferably about 0.05 to 10 seconds, more preferably about 0.2-4 seconds, and most preferably 1 to 2 seconds in length.

The growth rate of the elemental Sb thin films will vary depending on the reaction conditions. As described below, in initial experiments, the growth rate varied between about 0.3 and about 0.5 Å/cycle.

In experiments, elemental Sb thin films were formed using alternating and sequential pulses of $SbCl_3$ and $(SiEt_3)_3Sb$. 1000 cycles were applied. The elemental Sb thin films were formed on soda lime glass and silicon substrates with native oxide. $Sb(SiEt_3)_3$ is a liquid at room temperature and was evaporated from an open boat at a temperature of 85° C. The substrate temperature during deposition was 95° C. The pulse and purge length for the $SbCl_3$ precursor was 1 second and 2 seconds, respectively. The pulse length for $Sb(SiEt_3)_3$ was varied between 0.5 and 2.0 seconds, with a purge length of 2 seconds. Average growth rate per cycle for Sb films deposited at 0.5, 1.0, and 2.0 second pulse lengths of $(Et_3Si)_3Sb$ were 0.35, 0.45 and 0.45 Å/cycle, respectively. The antimony films were clear and mirror like as deposited.

A gracing incidence XRD (GIXRD) pattern of the Sb film shows a polycrystalline Sb film with all of the reflections identified as rhombohedral Sb (iron black, PDF 00-035-0732). The deposited film was also studied by energy dispersive x-ray (EDX) measurement. The EDX measurement confirmed that the films consisted of antimony with no chlorine present in the deposited film. Film thicknesses were about 45 nm.

Figure 7:
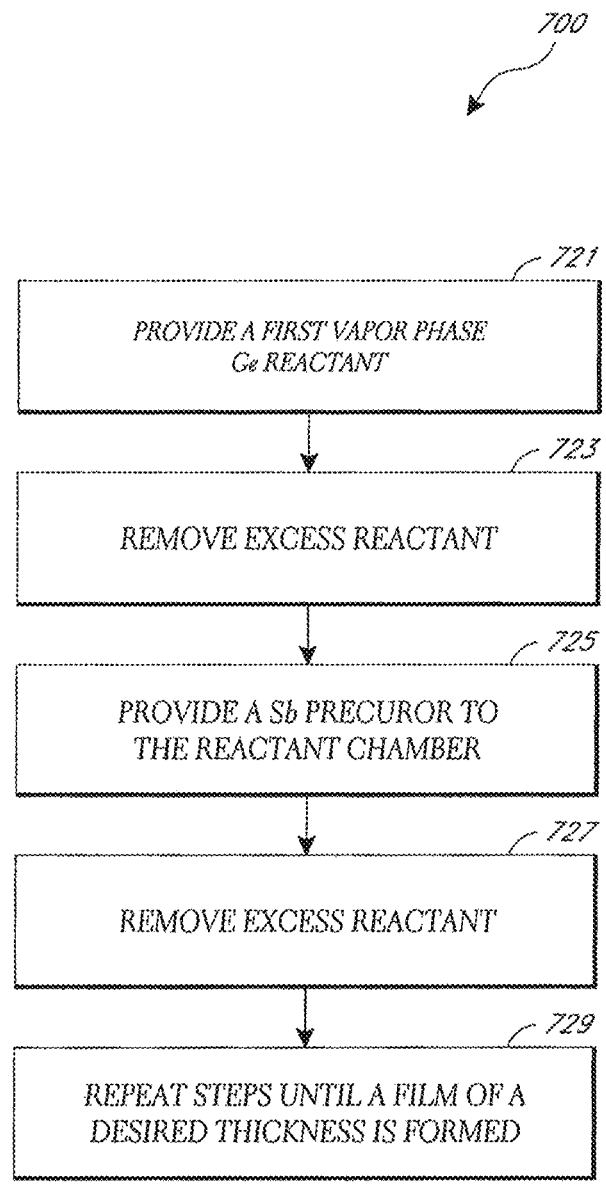
FIG. 7 is a flow chart illustrating a sequence for depositing a germanium antimony film by ALD, which can also be useful as an interface layer prior to depositing metal oxide.

In some embodiments, a $Ge_xSb_y$ thin film is formed by ALD without the use of plasma. FIG. 7 is a flow chart generally illustrating a method 700 for forming a Ge—Sb thin film in accordance with one embodiment. A Ge—Sb thin film is formed on a substrate by an ALD type process comprising multiple Ge—Sb deposition cycles, each deposition cycle comprising:

providing a first vapor phase reactant pulse comprising a Ge precursor 721 into the reaction chamber to form no more than about a single molecular layer of the Ge precursor on the substrate;

removing excess first reactant from the reaction chamber 723;

providing a second vapor phase reactant pulse comprising a Sb precursor 725 to the reaction chamber such that the Sb precursor reacts with the Ge precursor on the substrate; and removing excess second reactant and reaction byproducts, if any, from the reaction chamber 727.

This can be referred to as the Ge—Sb deposition cycle. Each Ge—Sb deposition cycle typically forms at most about one monolayer of Ge—Sb. The Ge—Sb deposition cycle is repeated until a film of a desired thickness is formed 729. In some embodiments a Ge—Sb film of from about 10 Å to about 2000 Å, preferably from about 20 Å to about 60 Å, is formed for use as an interface layer prior to metal oxide deposition.

The x and y values and composition of the $Ge_xSb_y$ film can vary. In some embodiments, x and y are less than 1. In some embodiments, the sum of x and y is equal to about 1, or 100 if the x and y values are expressed as a percentage.

Although the illustrated Ge—Sb deposition cycle begins with provision of the Ge precursor, in other embodiments the deposition cycle begins with the provision of the Sb precursor.

In some embodiments, the reactants and reaction by-products can be removed from the reaction chamber by stopping the flow of Ge or Sb precursor while continuing the flow of an inert carrier gas such as nitrogen or argon.

Preferably, the Ge source is $GeX_2$ or $GeX_4$, wherein X is a halogen element. Preferably the oxidation state of Ge is +II. In some embodiments the Ge source is $GeBr_2$. In some embodiments the Ge source is germanium halide with coordinating ligands, such as dioxane ligands. Preferably the Ge source with coordinating ligands is germanium dihalide complex, more preferably a germanium dichloride dioxane complex $GeCl_2 \cdot C_4H_8O_2$.

The Sb precursor can be any of the Sb precursors described above. Preferably, the second Sb precursor has a formula of $Sb(SiR^1R^2R^3)_2$, wherein $R^1$, $R^2$, and $R^3$ are alkyl groups comprising one or more carbon atoms. The $R^1$, $R^2$, and $R^3$ alkyl groups can be selected based on the desired physical properties of the precursor such as volatility, vapor pressure, toxicity, etc.

The substrate temperature during forming the Ge—Sb thin film is preferably less than 250° C. and more preferably less than 200° C. and even more preferably below 100° C. If an amorphous thin film is desired the temperature can be lowered even further down to at or below about 90° C. In some embodiments the deposition temperature can be below about 80° C., below about 70° C., or even below about 60° C.

The skilled artisan can determine the optimal reactant evaporation temperatures based on the properties of the selected precursors.

The skilled artisan can determine the optimal reactant pulse times through routine experimentation based on the properties of the selected precursors and the desired properties of the deposited Ge—Sb thin film.

Preferably the Ge and Sb reactants are pulsed for about 0.05 to 10 seconds, more preferably about 0.2 to 4 seconds, and most preferably about 1 to 4 seconds. The purge steps in which excess reactant and reaction by-products, if any, are removed are preferably about 0.05 to 10 seconds, more preferably about 0.2-4 seconds. In some cases like in batch ALD reactors the pulse and purge times can vary much more and longer pulse times may be used even in order of minutes.

In some embodiments the deposited Ge—Sb thin films are amorphous. In some embodiments, the deposited Ge—Sb thin films are crystalline.

In some embodiments, the deposited Ge—Sb film can be annealed.

Experiments were conducted to deposit Ge—Sb films on substrates at approximately 95° C. using $Sb(SiEt_3)_3$ as the Sb source and $GeCl_2 \cdot C_4H_8O_2$ as the Ge source, using a deposition cycle comprising:

a 4 second $GeCl_2 \cdot C_4H_8O_2$ pulse;
a 6 second purge;
a 2 second $Sb(SiEt_3)_3$ pulse; and
a 2 second purge.

The growth rate per cycle was calculated at about 0.23 Å/cycle. X-ray diffractogram results indicated that the deposited film was amorphous. Energy dispersive x-ray (EDX) analysis showed that the deposited film was $Ge_{0.82}Sb_{0.18}$ (82 at % Ge and 18 at % Sb).

ALD of Metal Oxide

According to some embodiments, a metal oxide thin film is formed on the interface layer by a vapor deposition process, such as by an ALD type process comprising multiple pulsing cycles, each cycle comprising:

pulsing a vaporized metal precursor into the reaction chamber to form at most a molecular monolayer of the metal precursor on the substrate, purging the reaction chamber to remove excess metal precursor and reaction by products, if any, providing a pulse of a second reactant comprising an oxygen source onto the substrate, purging the reaction chamber to remove excess second reactant and any gaseous by-products formed in the reaction between the metal precursor layer on the first surface of the substrate and the second reactant, and repeating the pulsing and purging steps until a metal oxide thin film of the desired thickness has been formed.

The thin metal oxide film typically comprises multiple monolayers of a single metal oxide. However, in other embodiments, the final metal structure may comprise two or more different metal oxides. For example, the growth can be started with the deposition of a first metal oxide and ended with the deposition of a second metal oxide. In other embodiments, alternating layers of metal oxides can be deposited.

The metal oxide is preferably selected from the group consisting of Ni, Ti, Zr, Hf, V, Nb, Ta, Cr, Mo, W, Co, Cu, Fe, Ru, Jr, Rh, Pd and Pt oxides and may be in some cases electrically conductive, such as in a case of $IrO_2$ or $RuO_2$.

Suitable metal precursors may be selected by the skilled artisan. In general, metal compounds where the metal is bound or coordinated to oxygen, nitrogen, carbon or a combination thereof are preferred. In some embodiments the metal precursors are organic compounds. More preferably betadiketonate, betadiketiminato compounds, amidinate compounds, aminoalkoxide, ketoiminate or cyclopentadienyl compounds or derivatives thereof are used. In some embodiments, $X(acac)_y$ or $X(thd)_y$ compounds are used, where X is a metal, y is generally, but not necessarily between 2 and 3 and thd is 2,2,6,6-tetramethyl-3,5-heptanedionato. Some examples of suitable betadiketiminato (e.g., $Ni(pda)_2$) compounds are mentioned in U.S. Patent Publication No. 2009-0197411 A1, the disclosure of which is incorporated herein in its entirety. Some examples of suitable amidinate compounds (e.g., $Ni(^iPr-AMD)_2$) are mentioned in U.S. Patent Publication No. 2006-0141155 A1, the disclosure of which is incorporated herein in its entirety. Some examples of suitable aminoalkoxide compounds are mentioned in U.S. Patent Publication No. 2008-0171890 A1, the disclosure of which is incorporated herein in its entirety.

When depositing nickel oxide thin films, preferred metal precursors can be selected from the group consisting of nickel betadiketonate compounds, nickel betadiketiminato compounds, nickel amidinate compounds, nickel cyclopentadienyl compounds, nickel carbonyl compounds and combinations thereof. The nickel precursor may also comprise one or more halide ligands. In preferred embodiments, the precursor is nickel betadiketiminato compound, such bis(4-N-ethylamino-3-penten-2-N-ethyliminato)nickel (II) [Ni(EtN-EtN-pent)$_2$], nickel ketoiminate, such bis(3Z)-4-nbutylamino-pent-3-en-2-one-nickel(II), nickel amidinate compound, such as methylcyclopentadienyl-isopropylacetamidinate-nickel (II), nickel betadiketonato compound, such as $Ni(acac)_2$, $Ni(thd)_2$ or nickel cyclopentadienyl compounds, such $Ni(cp)_2$, $Ni(Mecp)_2$, $Ni(Etcp)_2$ or derivatives thereof, such as methylcyclopentadienyl-isopropylacetamidinate-nickel (II). In more preferred embodiment, the precursor is bis(4-N-ethylamino-3-penten-2-N-ethyliminato)nickel (II).

In some embodiments nickel oxide, preferably NiO, is deposited from alternating and sequential pulses of a Ni precursor and an oxygen source, like water, ozone, oxygen plasma, oxygen radicals or oxygen atoms. The Ni precursor preferably comprises a betadiketonate or betadiketiminato compounds and more preferably is $Ni(acac)_2$. In some embodiments the Ni precursors have at least one Ni—N bond. The reaction temperature is preferably less than about 300° C., more preferably less than about 200° C. In some embodiments, the reaction temperature can be in the range of about 60° C. to about 150° C. for example, in the case of $Ni(cp)_2$.

The metal precursor employed in the ALD type processes may be solid, liquid or gaseous material under standard conditions (room temperature and atmospheric pressure), provided that the metal precursor is in vapor phase before it is conducted into the reaction chamber and contacted with the substrate surface. "Pulsing" a vaporized precursor onto the substrate means that the precursor vapor is conducted into the chamber for a limited period of time. Typically, the pulsing time is from about 0.05 to 10 seconds. However, depending on the substrate type and its surface area, the pulsing time may be even higher than 10 seconds.

Preferably, for a 300 mm wafer in a single wafer ALD reactor, the metal precursor is pulsed for from about 0.05 to 10 seconds, more preferably for from about 0.1 to 5 seconds and most preferably for from about 0.3 to 3.0 seconds. The oxygen-containing precursor is preferably pulsed for from about 0.05 to 10 seconds, more preferably for from about 0.1 to 5 seconds, most preferably for from about 0.2 to 3.0 seconds. However, pulsing times can be on the order of minutes in some cases. The optimum pulsing time can be readily determined by the skilled artisan based on the particular circumstances.

The mass flow rate of the metal precursor can be determined by the skilled artisan. In one embodiment, for deposition on 300 mm wafers the flow rate of the metal precursor is preferably between about 1 and 1000 sccm without limitation. The mass flow rate of the metal precursor is usually lower than the mass flow rate of the oxygen source, which is usually between about 10 and 10000 sccm without limitation, more preferably between about 100-2000 sccm and most preferably between about 100-1000 sccm.

The pressure in the reaction chamber is typically from about 0.01 to 20 mbar, more preferably from about 1 to about 10 mbar. However, in some cases the pressure will be higher or lower than this range, as can be readily determined by the skilled artisan.

The oxygen source may be an oxygen-containing gas pulse and can be a mixture of oxygen and inactive gas, such as nitrogen or argon. In some embodiments the oxygen source may be a molecular oxygen-containing gas pulse. The preferred oxygen content of the oxygen-source gas is from about 10 to 25%. Thus, one source of oxygen may be air. In some embodiments, the oxygen source is molecular oxygen. In some embodiments, the oxygen source comprises an activated or excited oxygen species. In some embodiments, the oxygen source comprises ozone. The oxygen source may be pure ozone or a mixture of ozone, molecular oxygen, and another gas, for example an inactive gas such as nitrogen or argon. Ozone can be produced by an ozone generator and it is most preferably introduced into the reaction space with the aid of an inert gas of some kind, such as nitrogen, or with the aid of oxygen. In some embodiments, ozone is provided at a concentration from about 5 vol-% to about 40 vol-%, and preferably from about 15 vol-% to about 25 vol-%. In other embodiments, the oxygen source is oxygen plasma.

As mentioned above, the metal oxide ALD process typically comprises alternating pulses of metal precursor and a reactant comprising an oxygen source. The oxygen source pulse may be provided, for example, by pulsing ozone or a mixture of ozone and another gas into the reaction chamber. In other embodiments, ozone is formed inside the reactor, for example by conducting oxygen containing gas through an arc. In other embodiments, an oxygen containing plasma is formed in the reactor. In some embodiments, the plasma may be formed in situ on top of the substrate or in close proximity to the substrate. In other embodiments, the plasma is formed upstream of the reaction chamber in a remote plasma generator and plasma products are directed to the reaction chamber to contact the substrate. As will be appreciated by the skilled artisan, in the case of a remote plasma the pathway to the substrate can be optimized to maximize electrically neutral species and minimize ion survival before reaching the substrate.

Before starting the deposition of the film, the substrate is typically heated to a suitable growth temperature. Preferably, the growth temperature of the metal thin film is less than about 400° C., more preferably less than about 350° C. and even more preferably less than about 200° C. The preferred deposition temperature may vary depending on a number of factors such as, and without limitation, the reactant precursors, the pressure, flow rate, the arrangement of the reactor, and the composition of the substrate including the nature of the material to be deposited on. The specific growth temperature may be selected by the skilled artisan using routine experimentation.

The processing time depends on the thickness of the layer to be produced and the growth rate of the film. In ALD, the growth rate of a thin film is determined as thickness increase per one cycle. One cycle consists of the pulsing and purging steps of the precursors and the duration of one cycle is typically between about 0.2 and 30 seconds, more preferably between about 1 and 10 seconds, but it can be on order of minutes or more in some cases, for example, where large surface areas and volumes are present.

A metal oxide, such as nickel oxide, is deposited by ALD over the interface layer to form a conformal thin film of between about 1 nm and about 200 nm, preferably between about 3 nm and about 100 nm in thickness. As described above, in some embodiments, the metal oxide is deposited conformally over vertical and horizontal surfaces. Although described in terms of NiO deposition, the method may be readily adjusted to deposit other metal oxides. As discussed previously, deposition of metal oxide takes place in a reaction space maintained at less than about 300° C., more preferably less than about 250° C. and even more preferably less than about 200° C. and between about 0.01 and about 20 mbar, more preferably between about 1 and about 10 mbar. In certain embodiments, deposition by ALD comprises contacting the substrate with a vapor phase metal source chemical and a vapor phase oxygen source chemical. This may be done sequentially with either the metal source chemical or the oxygen source chemical being pulsed into the reaction space before the other. In certain embodiments, a purge gas may be introduced into the reaction space between sequential pulses of the metal and oxygen source chemicals to aid in removing excess reactant and reaction byproducts, if any, from the reaction space. In certain embodiments, purging may take place with the aid of a vacuum pump. In other embodiments, if an inert carrier gas is used to help flow in the metal or oxygen source chemicals, the inert gas may also function as the purge gas.

The metal source chemical may comprise Ni, Ti, Zr, Hf, V, Nb, Ta, Cr, Mo, W, Co, Cu, Fe, Ru, Ir, Rh, Pd and Pt. The oxygen source chemical may be chosen from $O_2$, $H_2O$, $O_3$, oxygen plasma, oxygen radicals or oxygen atoms or a reactive oxygen gas. By depositing metal oxide by ALD, the metal oxide is placed in direct contact with the interface layer in at least one location, but preferably a plurality of regions, and the interface layer thus prevents direct exposure of the underlying silicon to the oxidizing environment of the metal oxide deposition.

CVD of Metal Oxide

The skilled artisan will appreciate that the metal oxide need not be deposited by ALD and that other conformal techniques (e.g., CVD) can also be used. CVD of nickel oxide, for example, can be conducted by known techniques, such as the provision of metal organic nickel source with an oxidizing source.

CVD processes typically involve gas phase reactions between two or more reactants. The reactants can be provided simultaneously to the reaction space or substrate. The substrate or reaction space can be heated to promote the reaction between the gaseous reactants. CVD deposition occurs when the reactants are provided to the reaction space. In some embodiments the reactants are provided until a thin film having a desired thickness is deposited. In some embodiments cyclical CVD can be used with multiple cycles used to deposit a thin film having a desired thickness. In some embodiments one or more plasma reactants can be used in the CVD process.

In some embodiments the ALD-processes can be modified to be partial CVD processes. In some embodiments the ALD processes can be modified to be pulsed CVD processes. In some embodiments the ALD processes are modified to use overlapping or partially overlapping pulses of reactants. In some embodiments the ALD processes are modified to use extremely short purge times, such as below 0.1 s (depending on the reactor). In some embodiments the ALD processes are modified to use no purge at all. In some embodiments the no purge s used after the metal reactant pulse. In some embodiments no purge is used after the oxygen reactant pulse. In some embodiments no purge is used after either the metal reactant pulse or the oxygen reactant pulse.

Reduction and Solid State Reaction

As noted above, reduction of the metal oxide to metal can be conducted simultaneously with silicidation reaction using a moderately reducing environment (e.g., $H_2$ or $H_2/N_2$) at temperatures (e.g., greater than about 250° C., more preferably greater than about 300° C. and in some embodiments 400° C. or greater or even 500° C. or greater) sufficient to effect silicidation through the interface layer. In other arrangements, reduction can be conducted independently of silicidation, especially at lower temperatures using stronger reducing agents. More details and options for the reduction and silicidation reactions are provided below.

Regardless of whether simultaneous with the solid phase reaction or preceding it, the metal oxide layer, such as nickel oxide, is reduced to metal. In certain embodiments, as discussed in U.S. Pat. No. 6,921,712, the entire disclosure of which is incorporated by reference, the metal oxide layer is contacted with vapor phase reducing agents, which may include $H_2$, $NH_3$, hydrogen containing plasma, hydrogen radicals or hydrogen atoms and reactive organic compounds, which contain at least one functional group selected from the group of alcohol (—OH), aldehyde (—CHO), and carboxylic acid (—COOH). The vapor phase reducing agents form stronger bonds with the oxygen in the metal oxide layer than the metal to the oxygen. Thus, the gaseous reducing agent is capable of taking away the oxygen that was bound to the metal oxide and thus leaving an elemental metal layer on the substrate surface. This reduction step can be performed at temperatures between about 25° C. and about 400° C. and has the benefit of a high rate of reduction, an operation time of between about 1 s and about 1000 s, and low levels of carbon or hydrogen impurities. A skilled artisan will recognize that the metal oxide layer may be reduced to metal by other methods known in the art, such as for example by $H_2$ plasma, formic acid or ethanol.

In one embodiment, the NiO layer is reduced by exposure to an organic reducing agent that is capable of removing oxygen from the metal oxide, leaving elemental nickel on the substrate. Preferably the NiO layer is reduced by exposure to an organic reducing agent in vapor form.

The substrate containing the nickel oxide layer to be reduced is placed in a reaction space, such as an ALD reaction chamber, and the reaction space is evacuated to vacuum. The organic reducing agent is preferably vaporized and fed to the reaction space, optionally with the aid of an inert carrier gas, such as nitrogen. In one embodiment a vapor mixture is used, comprising two or more reducing agents.

The reducing agent vapor is contacted with the substrate, preferably at low pressure, whereby the nickel oxide layer is reduced at least partly to nickel metal and the reducing agent is oxidized. Typically the reaction space is then purged with an inert carrier gas to remove the unreacted organic reducing agent and the reaction products and/or by-products.

The reactions between nickel oxide and the organic reducing agent may be carried out in a wide temperature range, even as low as room temperature. Preferably, reduction with an organic reducing agent is carried out at low temperatures. Kinetic factors and the diffusion rate of oxygen from nickel oxide to the nickel surface set a lower limit to the actual process temperatures that can be applied successfully. The temperature in the reaction space is preferably in the range of 200 to 450° C., more preferably 300 to 430° C. and even more preferably 310 to 400° C. In some cases, such as the case of very thin metal oxide films, the reduction temperature can be even lower than 200° C. For example, in case of hydrogen containing plasma, hydrogen radical or hydrogen atom reduction can be performed from about 20° C. to about 450° C. If reduction and subsequent process steps are not carried out in situ, the reduction temperature may be less than 400° C. Reduction and silicidation may also happen simultaneously.

The pressure in the reaction space is preferably from 0.01 to 20 mbar, more preferably from 1 to 10 mbar.

The processing time will vary according to the thickness of the layer to be reduced. A layer of nickel oxide having a thickness of up to 300 to 400 nm can be reduced in approximately 3 to 5 minutes. For layers having a thickness of approximately 0.1 to 10 nm, the processing time is in the order of seconds. Reduction may be somewhat faster in case of plasma reduction.

According to one embodiment, NiO is reduced to nickel with one or more organic reducing agents. The organic reducing agents preferably have at least one functional group selected from the group consisting of alcohol (—OH), aldehyde (—CHO), and carboxylic acid (—COOH).

Such reducing agents have the advantage that the reaction by-products are volatile and can be easily removed from the reaction space. In the reduction of nickel oxide, the reducing agent is oxidized. Thus, alcohols are oxidized into aldehydes and ketones, aldehydes are oxidized into carboxylic acids and carboxylic acids are oxidized into carbon dioxide. Depending on the specific reactants, water may be formed as a gaseous by-product.

These bulky source chemical molecules also do not easily diffuse inside the metal oxide film. Thus, the reduction reaction takes place only at the surface of the metal oxide layer. Gaseous by-products are not formed inside the film, but only at the surface. The structural integrity of the metal film is thereby preserved and the formation of pinholes in the film is avoided.

Reducing agents containing at least one alcohol group are preferably selected from the group consisting of primary alcohols, secondary alcohols, tertiary alcohols, polyhydroxy alcohols, cyclic alcohols, aromatic alcohols, halogenated alcohols, and other derivatives of alcohols.

Preferred primary alcohols have an —OH group attached to a carbon atom which is bonded to another carbon atom, in particular primary alcohols according to the general formula (I):

$$R^1\text{—OH} \qquad (I)$$

wherein $R^1$ is a linear or branched $C_1$-$C_{20}$ alkyl or alkenyl groups, preferably methyl, ethyl, propyl, butyl, pentyl or hexyl. Examples of preferred primary alcohols include methanol, ethanol, propanol, butanol, 2-methyl propanol and 2-methyl butanol.

Preferred secondary alcohols have an —OH group attached to a carbon atom that is bonded to two other carbon atoms. In particular, preferred secondary alcohols have the general formula (II):

$$\begin{array}{c} \text{OH} \\ | \\ R^1\text{—CH—}R^1 \end{array} \qquad (II)$$

wherein each $R^1$ is selected independently from the group of linear or branched $C_1$-$C_{20}$ alkyl and alkenyl groups, preferably methyl, ethyl, propyl, butyl, pentyl or hexyl. Examples of preferred secondary alcohols include 2-propanol and 2-butanol.

Preferred tertiary alcohols have an —OH group attached to a carbon atom that is bonded to three other carbon atoms. In particular, preferred tertiary alcohols have the general formula (III):

$$\begin{array}{c} \text{OH} \\ | \\ R^1\text{—C—}R^1 \\ | \\ R^1 \end{array} \qquad (III)$$

wherein each $R^1$ is selected independently from the group of linear or branched $C_1$-$C_{20}$ alkyl and alkenyl groups, preferably methyl, ethyl, propyl, butyl, pentyl or hexyl. An example of a preferred tertiary alcohol is tert-butanol.

Preferred polyhydroxy alcohols, such as diols and triols, have primary, secondary and/or tertiary alcohol groups as described above. Examples of preferred polyhydroxy alcohol are ethylene glycol and glycerol.

Preferred cyclic alcohols have an —OH group attached to at least one carbon atom which is part of a ring of 1 to 10, more preferably 5-6 carbon atoms.

Preferred aromatic alcohols have at least one —OH group attached either to a benzene ring or to a carbon atom in a side chain. Examples of preferred aromatic alcohols include benzyl alcohol, o-, p- and m-cresol and resorcinol.

Preferred halogenated alcohols have the general formula (IV):

$$CH_nX_{3-n}—R^2—OH \qquad (IV)$$

wherein X is selected from the group consisting of F, Cl, Br and I, n is an integer from 0 to 2 and $R^2$ is selected from the group of linear or branched $C_1$-$C_{20}$ alkyl and alkenyl groups, preferably methyl, ethyl, propyl, butyl, pentyl or hexyl. More preferably X is selected from the group consisting of F and Cl and $R^2$ is selected from the group consisting of methyl and ethyl. An example of a preferred halogenated alcohol is 2,2,2-trifluoroethanol.

Other preferred derivatives of alcohols include amines, such as methyl ethanolamine.

Preferred reducing agents containing at least one aldehyde group (—CHO) are selected from the group consisting of compounds having the general formula (V), alkanedial compounds having the general formula (VI), halogenated aldehydes and other derivatives of aldehydes.

Thus, in one embodiment preferred reducing agents are aldehydes having the general formula (V):

$$R^3—CHO \qquad (V)$$

wherein $R^3$ is selected from the group consisting of hydrogen and linear or branched $C_1$-$C_{20}$ alkyl and alkenyl groups, preferably methyl, ethyl, propyl, butyl, pentyl or hexyl. More preferably, $R^3$ is selected from the group consisting of methyl or ethyl. Examples of preferred compounds according to formula (V) are formaldehyde, acetaldehyde and butyraldehyde.

In another embodiment preferred reducing agents are aldehydes having the general formula (VI):

$$OHC—R^4—CHO \qquad (VI)$$

wherein $R^4$ is a linear or branched $C_1$-$C_{20}$ saturated or unsaturated hydrocarbon. Alternatively, the aldehyde groups may be directly bonded to each other ($R^4$ is null).

Preferred reducing agents containing at least one —COOH group are preferably selected from the group consisting of compounds of the general formula (VII), polycarboxylic acids, halogenated carboxylic acids and other derivatives of carboxylic acids.

Thus, in one embodiment preferred reducing agents are carboxylic acids having the general formula (VII):

$$R^5—COOH \qquad (VII)$$

wherein $R^5$ is hydrogen or linear or branched $C_1$-$C_{20}$ alkyl or alkenyl group, preferably methyl, ethyl, propyl, butyl, pentyl or hexyl, more preferably methyl or ethyl. Examples of preferred compounds according to formula (VII) are formic acid and acetic acid, most preferably formic acid (HCOOH).

As noted, other methods of reduction are contemplated. In one embodiment, nickel oxide is reduced by treatment with $H_2$ plasma. Briefly, the substrate comprising the nickel oxide is placed in a reaction chamber, such as an ALD reaction chamber. A gas mixture comprising $H_2$ is allowed to flow into the chamber and Radio Frequency (RF) power is applied to create a plasma discharge in the $H_2$ gas. The plasma discharge reduces the nickel oxide, leaving elemental nickel. Care must be taken not to damage the nickel surface or other exposed substrate surfaces.

In a further embodiment, nickel oxide is reduced by exposure to $H_2$ gas or forming gas at elevated temperature. Briefly, the substrate comprising the nickel oxide is placed in a reaction chamber. $H_2$ gas is allowed to flow into the reaction chamber. The temperature of the reaction chamber is set to between about 200° C. and 600° C., more preferably at between about 300° C. and 500° C. Reduction with moderate reducing agents at such elevated temperatures has been found to simultaneously effect silicidation, obviating a subsequent silicidation anneal.

Where the metal oxide to is independently reduced to metal without silicidation, or with incomplete silicidation, the substrate is then annealed at a silicidation temperature, i.e., the temperature at which conversion of the metal layer to a silicide occurs. For example, the silicidation temperature is the temperature at which conversion of the Ni layer into $NiSi_x$ takes place. In some embodiments, the temperature of conversion is between about 200° C. and about 300° C. Preferably, the anneal is a rapid thermal anneal, in which heating is conducted for less than about 2 minutes, more preferably less than about 1 minute. The silicide film formed by annealing advantageously has better adhesion to the underlying silicon substrate and has a more diffuse boundary than a similar film formed by, e.g., deposition processes. It will be appreciated that in certain embodiments, the silicide films preferably contact underlying source and drains regions.

It will also be appreciated that the annealing step can be performed in the same reaction space as the previous metal oxide layer deposition and/or reduction. The annealing step may also be performed in an anneal station different from the reaction space for the deposition and/or reduction. Such an anneal station can be, e.g., the reactor of a Levitor® system, commercially available from ASM International, N.V. of Bilthoven, The Netherlands. A reactor according to the Levitor® design is described in U.S. Pat. No. 6,183,565, the entire disclosure of which is incorporated herein by reference.

In some embodiments where Ge interface layer is used, a formation of metal germanide, for example, $NiGe_x$, can occur. Depending on the thickness of the deposited metal oxide layer and Ge interface layer all of the Ge interface layer maybe consumed to form metal germanide, for example $NiGe_x$, and additional metal from the metal oxide can also react with the underlying silicon to form metal silicide, for example $NiSi_x$. For example, if the metal oxide layer is thick and germanium interface layer thin, the metal oxide will first consume the germanium layer and form a metal germanide and then diffuse through the metal germanide to consume some of the underlying silicon to form metal silicide. Advantageously, the metal germanide formed from the reduction of metal oxide can avoid intermediate high resistivity phases of metal germanide. Because NiGe formation begins at the same temperature where NiO starts to reduce and release oxygen, the formation of unwanted phases such as $Ni_5Ge_3$ is prevented. As is known in the art (see Gaudet et al, J. Appl. Phys. 100 (2006) 034306), when elemental metal and germanium are reacted in a solid phase germanidation, the higher resistivity $Ni_5Ge_3$ forms first at a lower temperature, followed by NiGe formation at a higher temperatures.

In another embodiment, the overlying metal oxide and the thickness of the Ge interface layer are such that the supply of metal is consumed by metal germanidation, or the extent of the anneal is limited, and little or no silicidation occurs below the metal germanide. For example, if the metal oxide layer is thin and germanium layer is thick, it might be that no metal silicide is formed, only metal germanide is formed. In these cases, the resultant structure may be metal germanide between the silicon substrate and the contact plug, with no intervening metal silicide.

In still another embodiment (see Example 3 below and FIG. 9), metal oxide is provided directly over a germanium substrate or germanium epitaxial layer over silicon, such that the Ge forms the upper surface of the substrate and no separate interface layer is provided. In that case, the resultant structure can have a metal germanide between germanium substrate or epitaxial germanium and the contact plug, and the metal germanide can serve to provide ohmic contact to germanium semiconductor regions. Desirably, the amount of metal in the metal oxide, or the extent of germanidation anneal, are insufficient to fully consume the germanium or the transistor junction. An example of metal germanide contact layers to a germanium transistor regions can be found, e.g., at http://www.electrochem.org/meetings/scheduler/abstracts/216/2395.pdf. Relative to conventional processes, the use of metal oxide as a source for metal germanidation advantageously enables more conformal deposition, and therefore more uniform germanidation, and also avoids the intermediate formation of high resistivity germanide phases.

Doping of Metal Silicides or Germanides

In some embodiments, metal silicides or metal germanides, such as NiSi or NiGe, may be doped, for example with one or more metals such as Pt. A dopant is deposited before, during or after deposition of the primary metal in the metal silicide or germanide, such that a metal silicide or germanide of the primary metal with the desired dopant concentration is formed after annealing.

In some embodiments, a metal oxide comprising the primary metal of the silicide or germanide, such as nickel oxide is deposited. For example the primary metal oxide may be deposited by multiple cycles of an ALD process in which the substrate is alternately and sequentially contacted with vapor phase pulses of a metal reactant and an oxidant, as described hereinabove (the primary metal oxide deposition cycle). One or more dopant oxide deposition cycles are provided before, during or immediately after the primary metal oxide deposition cycles. In the case of CVD deposition of the primary metal oxide, the dopant deposition cycles may be carried out after deposition of the oxide.

Dopant oxide deposition may be carried out essentially as described above for the primary metal oxide deposition. However, fewer ALD cycles will be used than for ALD of the primary metal oxide (if used), as less of the dopant will be present in the silicide or germanide than the primary metal.

In order to achieve the desired dopant concentration, the primary metal oxide and dopant metal oxide are deposited at a desired ratio. Following deposition of the primary metal oxide and the dopant metal oxide, the oxides are reduced and silicidation and/or germanidation is carried out, as described herein. In some embodiments the primary metal oxide may be reduced to metal prior to deposition of the dopant oxide and subsequent reduction to dopant. In other embodiments, the primary metal oxide and dopant oxide are both deposited and then reduced simultaneously. Similarly, silicidation and/or germanidation may take place concurrently with reduction of one or both of the primary metal oxide and the dopant metal oxide. In other embodiments silicidation and/or germanidation may take place after reduction of both the primary metal oxide and the dopant oxide.

In some embodiments one or both of the primary metal and the dopant may be deposited directly, rather than by depositing and reducing an oxide. In some embodiments a primary metal oxide is deposited and a metal dopant is deposited directly thereon. The primary metal oxide may then be reduced and silicidation and/or germanidation carried out. In some embodiments, a primary metal and a dopant metal may be deposited at a desired ratio, without forming an intervening oxide. Silicidation and/or germanidation are then carried out by annealing. In all cases a silicide or germanide is formed that comprises the desired amount of the dopant.

In some embodiments a Pt-doped Ni silicide or Ni germanide is formed. An ALD cycle for forming NiO is used in combination with one or more ALD cycles for depositing PtOx. The PtOx cycles may be provided intermittently, prior to or after the NiO cycles to obtain the desired level of dopant. That is, the dopant deposition cycle (such as PtOx) is carried out at a desired ratio to the primary metal deposition cycle (such as NiO) in order to obtain the doped metal film with the desired dopant concentration. Following deposition, the NiO and PtOx are reduced. Reduction, in the case of oxide deposition, and annealing to form silicides and germanides, can be as described elsewhere herein. Annealing is used to form Pt doped NiSi or NiGe.

In some embodiments instead of depositing a PtOx, a metallic Pt film is formed. Examples for depositing a metallic Pt film are described in reference Aaltonen et al., Chemistry of Materials (2003) Volume: 15, Issue: 9, Publisher: American Chemical Society, Pages: 1924-1928 and Hämäläinen et al., Chemistry of Materials (2008) Volume: 20, Issue: 21, Pages: 6840-6846, the disclosures of which are incorporated herein in their entireties. Similarly, in some embodiments Ni can be deposited directly, without forming an intervening oxide, for example as described herein. Thus, in some embodiments, a Ni deposition cycle can be used in a desired ratio with a Pt deposition cycle. Following deposition, Pt doped NiSi or NiGe is formed by annealing.

The dopant content can be expressed as a percentage of the overall metal content in the film, e.g. Ni/(Ni+Pt). In some embodiments the ratio in the deposited film is about 0-10%, 0-20% or about 0-50%.

In some embodiments growth of the dopant is by ALD and therefore self-limited; thus an even distribution of up to a monolayer of dopant across the substrate surface is obtained in each cycle.

When platinum is being used as a dopant, preferred metal precursors for depositing Pt and/or PtO, include cyclopentadienyl compounds of Pt, such as (trimethyl)methylcyclopentadienylplatinum(IV), and betadiketonate compounds of Pt, such as platinum (II) acetylacetonato and bis(2,2,6,6-tetramethyl-3,5-heptanedionato)platinum(TI) and their derivatives.

Deposition of Ni by ALD

In some embodiments, nickel thin films can be deposited by alternating and sequentially contacting a substrate with vapor phase pulses of a nickel precursor and one or more additional reactants. In some embodiments the reactions are controlled surface reactions. Highly conformal thin nickel films can be deposited. Although described herein essentially in the context of silicidation, the skilled artisan will appreciate that nickel film deposition by vapor deposition processes finds application in many different contexts, for example as catalysts for carbon nanotube growth.

In some embodiments, a nickel thin film is formed on a substrate by a vapor deposition process comprising multiple pulsing cycles, each cycle comprising:

Pulsing a vaporized nickel precursor into a reaction space comprising a substrate to form a layer of nickel precursor on the substrate surface;

Purging the reaction space to remove excess nickel precursor and reaction products, if any;

Providing a pulse of a second reactant to the reaction space, wherein the second reactant reacts with the nickel precursor to form nickel; and Purging the reaction space to remove excess second reactant and any gaseous by-products formed in the reaction between the second reactant and the nickel precursor.

The cycle is repeated until a nickel thin film of the desired thickness has been formed.

In some embodiments the each reaction is self-limiting and monolayer by monolayer growth is achieved. These may be referred to as "true ALD" reactions. In some such embodiments the nickel precursor may adsorb on the substrate surface in a self-limiting manner. The second reactant in turn will react with the adsorbed nickel precursor to form up to a monolayer of nickel on the substrate.

However, in some embodiments ALD-type reactions are provided, in which there may be some precursor decomposition, but the growth saturates. That is, in some embodiments although a certain amount of film growth may be caused by thermal decomposition of the nickel precursor at some deposition temperatures, saturated growth is preferably achieved when the second reactant is utilized. Such a reaction is an example of an ALD-type reaction. In such ALD-type reactions, films with good uniformity and relatively few impurities can be deposited.

In some embodiments thermal decomposition of one or more precursors occurs, in particular the nickel precursor. In such cases, the growth rate may not fully plateau with increasing pulse times. Rather, the growth rate may continue to rise with increased pulse times, although the growth rate may increase more slowly with ever increasing pulse times. Thus in some embodiments a pulsed-CVD type deposition process is used, in which reactants are provided alternately and separately, but some gas-phase reactions may occur. Preferably the conditions are selected such that surface controlled decomposition is the mechanism for the decomposition, which leads to good uniformity and good step coverage. Reaction conditions can also be selected such that good control of the reactions is maintained, leading to good quality films with low impurities.

Thus, in some embodiments the deposition temperature is below the thermal decomposition temperature of the nickel precursor while in other embodiments the deposition temperature may be at or above the thermal decomposition temperature.

Figure 25:
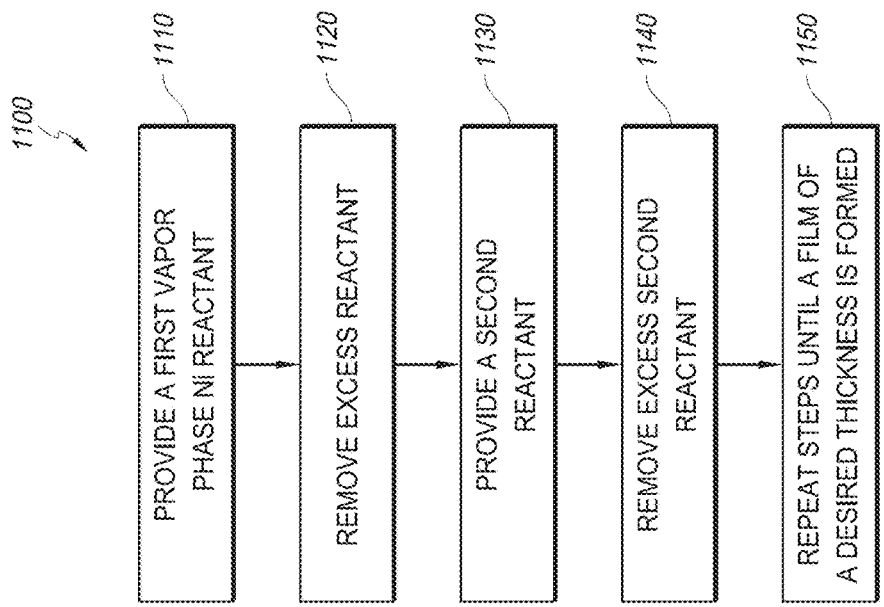
FIG. 25 is a flow chart illustrating a two-step ALD-type process for depositing Ni from a Ni precursor and a second precursor.

FIG. 25 is a flow chart generally illustrating a method 1100 for forming a Ni thin film in accordance with one embodiment. An elemental Ni thin film is formed on a substrate in a reaction chamber by an ALD type process comprising multiple Ni deposition cycles, each deposition cycle comprising:

providing a first vapor phase reactant pulse comprising a first Ni precursor 1110 into the reaction chamber to form a layer of the Ni precursor on the substrate;

removing excess first reactant from the reaction chamber 1120;

providing a second vapor phase reactant pulse 1130 to the reaction chamber such that the second reactant reacts with the first Ni precursor on the substrate in a self-limiting manner to form Ni; and removing excess second reactant and reaction byproducts, if any, from the reaction chamber 1140.

This can be referred to as the Ni deposition cycle. Each Ni deposition cycle typically forms at most about one monolayer of Ni. In some cases where the deposition temperature is above the decomposition temperature of the Ni precursor, more than one monolayer of Ni can be formed in each Ni deposition cycle. The Ni deposition cycle is repeated until a film of a desired thickness is formed 1150.

Although the illustrated Ni deposition cycle begins with provision of the first Ni precursor, in other embodiments the deposition cycle begins with the provision of the second reactant. It will be understood by the skilled artisan that provision of the first Ni precursor and second reactant are interchangeable in the ALD cycle.

In some embodiments, the reactants and reaction by-products can be removed from the reaction chamber by stopping the flow of reactant while continuing the flow of an inert carrier gas such as nitrogen or argon.

Suitable nickel precursors may be selected by the skilled artisan. In general, nickel compounds where the metal is bound or coordinated to oxygen, nitrogen, carbon or a combination thereof are preferred. In some embodiments the nickel precursors are organic compounds. In some embodiments, nickel precursors can be selected from the group consisting of nickel betadiketonate compounds, nickel betadiketiminato compounds, nickel aminoalkoxide compounds, nickel amidinate compounds, nickel cyclopentadienyl compounds, nickel carbonyl compounds and combinations thereof. In some embodiments, $X(acac)_y$ or $X(thd)_y$ compounds are used, where X is a metal, y is generally, but not necessarily between 2 and 3 and thd is 2,2,6,6-tetramethyl-3,5-heptanedionato. Some examples of suitable betadiketiminato (e.g., $Ni(pda)_2$) compounds are mentioned in U.S. Patent Publication No. 2009-0197411 A1, the disclosure of which is incorporated herein in its entirety. Some examples of suitable amidinate compounds (e.g., $Ni(^iPr-AMD)_2$) are mentioned in U.S. Patent Publication No. 2006-0141155 A1, the disclosure of which is incorporated herein in its entirety.

The nickel precursor may also comprise one or more halide ligands. In preferred embodiments, the precursor is nickel betadiketiminato compound, such bis(4-N-ethylamino-3-penten-2-N-ethyliminato)nickel (II) [$Ni(EtN-EtN-pent)_2$], nickel ketoiminate, such bis(3Z)-4-nbutylamino-pent-3-en-2-one-nickel(II), nickel amidinate compound, such as methylcyclopentadienyl-isopropylacetamidinate-nickel (II), nickel betadiketonato compound, such as $Ni(acac)_2$, $Ni(thd)_2$ or nickel cyclopentadienyl compounds, such $Ni(cp)_2$, $Ni(Mecp)_2$, $Ni(Etcp)_2$ or derivatives thereof, such as methylcyclopentadienyl-isopropylacetamidinate-nickel (II). In more preferred embodiment, the precursor is bis(4-N-ethylamino-3-penten-2-N-ethyliminato)nickel (II).

In some embodiments the first Ni precursor is bis(4-N-ethylamino-3-penten-2-N-ethyliminato)nickel (II).

In some embodiments the second reactant is selected from hydrogen and forming gas.

In other embodiments the second reactant may be an alcohol, such as EtOH.

In some embodiments the second reactant is an organic reducing agent. The organic reducing agents preferably have at least one functional group selected from the group consisting of alcohol (—OH), as mentioned above, or aldehyde (—CHO), or carboxylic acid (—COOH).

Reducing agents containing at least one alcohol group may be selected from the group consisting of primary alcohols, secondary alcohols, tertiary alcohols, polyhydroxy alcohols, cyclic alcohols, aromatic alcohols, halogenated alcohols, and other derivatives of alcohols.

Preferred primary alcohols have an —OH group attached to a carbon atom which is bonded to another carbon atom, in particular primary alcohols according to the general formula (I):

$$R^1—OH \qquad (I)$$

wherein $R^1$ is a linear or branched $C_1$-$C_{20}$ alkyl or alkenyl groups, preferably methyl, ethyl, propyl, butyl, pentyl or hexyl. Examples of preferred primary alcohols include methanol, ethanol, propanol, butanol, 2-methyl propanol and 2-methyl butanol.

Preferred secondary alcohols have an —OH group attached to a carbon atom that is bonded to two other carbon atoms. In particular, preferred secondary alcohols have the general formula (II):

$$\underset{R^1-\underset{|}{\overset{|}{CH}}-R^1}{\overset{OH}{}} \qquad (II)$$

wherein each $R^1$ is selected independently from the group of linear or branched $C_1$-$C_{20}$ alkyl and alkenyl groups, preferably methyl, ethyl, propyl, butyl, pentyl or hexyl. Examples of preferred secondary alcohols include 2-propanol and 2-butanol.

Preferred tertiary alcohols have an —OH group attached to a carbon atom that is bonded to three other carbon atoms. In particular, preferred tertiary alcohols have the general formula (III):

$$\underset{R^1-\underset{\underset{R^1}{|}}{\overset{|}{C}}-R^1}{\overset{OH}{}} \qquad (III)$$

wherein each $R^1$ is selected independently from the group of linear or branched $C_1$-$C_{20}$ alkyl and alkenyl groups, preferably methyl, ethyl, propyl, butyl, pentyl or hexyl. An example of a preferred tertiary alcohol is tert-butanol.

Preferred polyhydroxy alcohols, such as diols and triols, have primary, secondary and/or tertiary alcohol groups as described above. Examples of preferred polyhydroxy alcohol are ethylene glycol and glycerol.

Preferred cyclic alcohols have an —OH group attached to at least one carbon atom which is part of a ring of 1 to 10, more preferably 5-6 carbon atoms.

Preferred aromatic alcohols have at least one —OH group attached either to a benzene ring or to a carbon atom in a side chain. Examples of preferred aromatic alcohols include benzyl alcohol, o-, p- and m-cresol and resorcinol.

Preferred halogenated alcohols have the general formula (IV):

$$CH_nX_{3-n}—R^2—OH \qquad (IV)$$

wherein X is selected from the group consisting of F, Cl, Br and I, n is an integer from 0 to 2 and $R^2$ is selected from the group of linear or branched $C_1$-$C_{20}$ alkyl and alkenyl groups, preferably methyl, ethyl, propyl, butyl, pentyl or hexyl. More preferably X is selected from the group consisting of F and Cl and $R^2$ is selected from the group consisting of methyl and ethyl. An example of a preferred halogenated alcohol is 2,2,2-trifluoroethanol.

Other derivatives of alcohols that may be used include amines, such as methyl ethanolamine.

Preferred reducing agents containing at least one aldehyde group (—CHO) are selected from the group consisting of compounds having the general formula (V), alkanedial compounds having the general formula (VI), halogenated aldehydes and other derivatives of aldehydes.

Thus, in some embodiments reducing agents are aldehydes having the general formula (V):

$$R^3—CHO \qquad (V)$$

wherein $R^3$ is selected from the group consisting of hydrogen and linear or branched $C_1$-$C_{20}$ alkyl and alkenyl groups, preferably methyl, ethyl, propyl, butyl, pentyl or hexyl. More preferably, $R^3$ is selected from the group consisting of methyl or ethyl. Examples of preferred compounds according to formula (V) are formaldehyde, acetaldehyde and butyraldehyde.

In other embodiments reducing agents are aldehydes having the general formula (VI):

$$OHC—R^4—CHO \qquad (VI)$$

wherein $R^4$ is a linear or branched $C_1$-$C_{20}$ saturated or unsaturated hydrocarbon. Alternatively, the aldehyde groups may be directly bonded to each other ($R^4$ is null).

Reducing agents containing at least one —COOH group may be selected from the group consisting of compounds of the general formula (VII), polycarboxylic acids, halogenated carboxylic acids and other derivatives of carboxylic acids.

Thus, in some embodiment preferred reducing agents are carboxylic acids having the general formula (VII):

$$R^5—COOH \qquad (VII)$$

wherein $R^5$ is hydrogen or linear or branched $C_1$-$C_{20}$ alkyl or alkenyl group, preferably methyl, ethyl, propyl, butyl, pentyl or hexyl, more preferably methyl or ethyl. Examples of preferred compounds according to formula (VII) are formic acid and acetic acid, most preferably formic acid (HCOOH).

Figure 26:
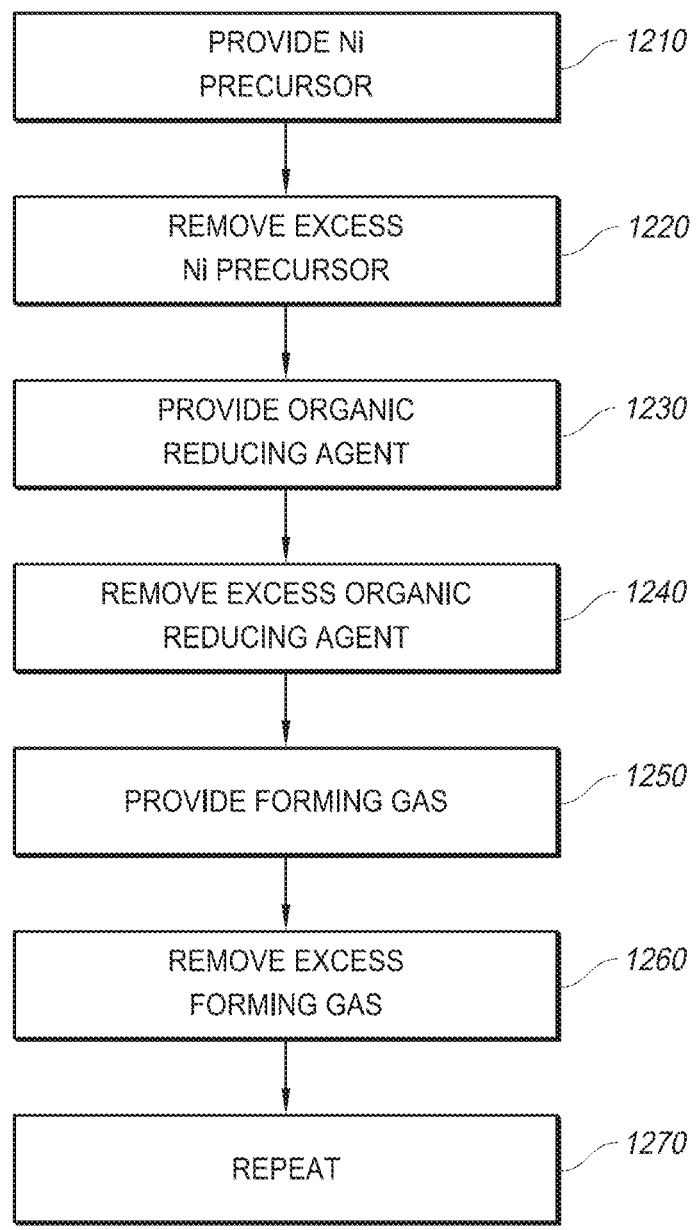
FIG. 26 is a flow chart illustrating a three-step ALD process for depositing Ni from a Ni precursor, an organic reducing agent and forming gas.

In some embodiments a third reactant is used in the ALD cycle. In some embodiments, an ALD-type process for depositing Ni thin films comprises alternate and sequential pulses of a nickel reactant, an organic reducing agent, and hydrogen or forming gas (such as 5% or 10% $H_2$ in $N_2$). One such embodiment is illustrated in FIG. 26. An elemental Ni thin film is formed on a substrate in a reaction space by an ALD-type process comprising multiple Ni deposition cycles, each deposition cycle comprising:

providing a first vapor phase reactant pulse comprising a first Ni precursor 1210 into the reaction space to form a layer of the Ni precursor on the substrate;

removing excess first reactant from the reaction space 1220;

providing a second vapor phase reactant pulse 1230 to the reaction space such that the second reactant reacts with the first Ni precursor on the substrate to form Ni, wherein the second reactant is an organic reducing agent, such as ethanol, as described above;

removing excess second reactant and reaction byproducts, if any, from the reaction space 1240;

providing a third vapor phase reactant pulse 1250 to the reaction space, wherein the third reactant is hydrogen or forming gas; and removing excess third reactant and reaction byproducts, if any, from the reaction space 1260.

Although the illustrated Ni deposition cycle begins with provision of the first Ni precursor, followed sequentially by the organic reducing agent and hydrogen or forming gas, in other embodiments the order of the provision of reactants can be changed. For example, the deposition cycle may begin with the provision of the second reactant or the third reactant. In other embodiments the order of provision of the organic reducing agent and the hydrogen or forming gas may be reversed. It will be understood by the skilled artisan that provision of the first Ni precursor and second and third reactants are interchangeable in the ALD cycle. In addition, in some embodiments one or more of the organic reducing agent and/or hydrogen or forming gas is replaced by another reducing agent, such as those described herein in relation to other embodiments.

Ni film deposition is preferably carried out at a temperature of from about 100° C. to about 400° C. In some embodiments the temperature is from about 150 to about 350° C. In other embodiments the temperature is from about 200 to about 350° C.

In some embodiments, a carrier gas such as $N_2$ or argon is used to provide one or more of the reactants. In some embodiments the carrier gas flow rate is from about 100 to about 400 sccm.

Examples of deposition of Ni films using various ALD-type processes is described in Example 6.

Figure 24:
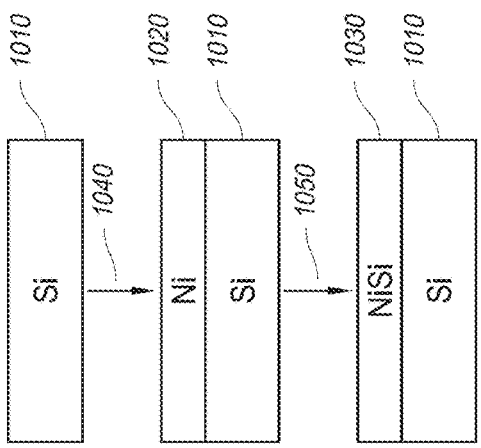
FIG. 24 is a schematic illustration of a silicidation processes in which Ni is deposited by an ALD-type process over a silicon substrate.

Silicidation and Germanidation Using Deposition of Ni by ALD or ALD-Type Reactions FIG. 24 illustrates a process of silicidation in accordance with some additional embodiments in which nickel is deposited directly over silicon or germanium by ALD or ALD-type reactions, for example as described herein, followed by annealing to form a nickel silicide or nickel germanide. Initially, a substrate is provided 1010 that has exposed silicon regions. While the process is illustrated schematically as a bare blanket silicon structure or wafer, the "self-aligned" processes are of course more useful in applications with patterned substrates having exposed silicon and non-silicon regions. Typically silicon region(s) are exposed and subjected to a native oxide cleaning process prior to subsequent depositions. In addition substrates comprising germanium exposed germanium can be used.

A layer of nickel 1020 is deposited 1040 over the silicon 1010 by ALD, essentially as described herein. In some embodiments the nickel 1020 is deposited directly over the silicon 1010 as illustrated. However, in some embodiments a dopant may be deposited over the silicon prior to deposition of the nickel layer 1020. In some embodiments less than a monolayer of dopant is formed. In other embodiments, one or more monolayers may be deposited. See, for example, U.S. 2009/0214767, which is incorporated by reference herein in its entirety. In some embodiments the dopant may be deposited directly on the silicon and the nickel may be deposited directly on the dopant. In other embodiments a dopant may be deposited with the nickel layer or on top of the nickel layer, as described herein.

Following deposition silicidation is carried 1050 out by annealing to form a nickel silicide (NiSi) layer 1030. Annealing may be carried out, for example, at 200° C. or greater, 300° C. or greater, 400° C. or greater, or even 500° C. or greater. In some embodiments annealing is carried out at 350° C. or greater. The time of the anneal may be, for example, 1, 2, 3, 4, 5, 6, 7, 8, 9, 10 or more minutes, and may be adjusted to provide a NiSi film with the desired properties, such as thickness and resistivity. In some embodiments annealing is carried out in a mildly reducing atmosphere, for example in the presence of hydrogen gas or forming gas.

In some embodiments a substrate comprising exposed germanium regions is utilized in place of a substrate with exposed silicon regions, and germanidation is carried out following deposition of the nickel layer, essentially as described above for silicidation.

Subsequent to the silicidation and/or germanidation reactions, the substrate may be etched to remove unconverted nickel or other material from the substrate surface and expose the NiSi or NiGe.

Post-Silicidation Anneal

In certain embodiments, an additional conversion step may be performed to convert metal silicide from one phase to the desired phase. For example, a person of skill in the art would understand that NiSi can refer to $Ni_2Si$, NiSi, $NiSi_2$, or a combination of the three. As NiSi has a relatively lower resistivity, the skilled artisan may choose to convert any remaining NiSi to NiSi. In some embodiments, the conversion step may be carried out in the same reaction space as the metal oxide deposition step and/or the annealing step. In other embodiments, the conversion step may be performed in a separate reaction space. The conversion step may preferably be carried out at a temperature between about 200° C. and about 500° C., a pressure between about 0.01 mbar and about 10 mbar, and from about 5 s to about 1000 s.

Example 1

Experiments were conducted using ALD of Sb for the interface layer, followed by ALD of metal oxide over the interface layer, followed by an anneal in a reducing environment that accomplished both reduction of the metal oxide and silicidation of the underlying silicon through the interface layer.

Initially, 5 cm×5 cm silicon <100> substrates were dipped in 1% aqueous HF solution for native oxide cleaning. Sb was then deposited by ALD at 100° C. using a F-120 research scale reactor. $SbCl_3$ and $(Et_3Si)_3Sb$ were alternately pulsed with intervening purging for 100 cycles. Reactant pulse/purge lengths were ⅓ s for $SbCl_3$ and ⅔ s for $(Et_3Si)_3Sb$. Subsequently, NiO was deposited by ALD in a Pulsar 2000 ALCVD prototype reactor at 160° C. by alternately pulsing bis(4-N-ethylamino-3-penten-2-N-ethyliminato)nickel (II) and $O_3$. Pulse durations of 1 s and purge durations of 4 s were used for both reactants, and 2000 cycles were performed. Post-deposition annealing was conducted for 1 minute at 500° C. 1 atmosphere partial pressure of forming gas (5%/95% $H_2/N_2$). After annealing, the sample was dipped for 5 min in 4:1 $H_2SO_4:H_2O_2$ solution to remove all remaining Ni or NiO.

Crystallinity was studied using a X'PERT PRO MPD diffractometer, commercially available from PANalytical B.V. of Almelo, the Netherlands. The X-ray diffractogram of the resultant structure indicate reflections only from NiSi and the underlying silicon substrate. No NiO or Ni peaks were found. The Sb layer is too thin to produce reflections, but is assumed to have segregated at the NiSi/Si interface, as disclosed by Wong et al., *International Symposium on VLSI Technology, Systems and applications (VLSI-TSA)*, Hsinchu, Taiwan (Apr. 21-23, 2008), pp. 36-37 after their experiments using interfacial Sb layers under PVD Ni prior to silicidation. EDS scans, which are sensitive to single digit weight percentages, showed no detectable amounts of carbon, chlorine, nitrogen or hydrogen in the NiSi film. A sheet resistance of ~5Ω/□ was measured for the sample using a 4-point probe. EELS scan showed little amount of oxygen in the surface, likely due to post-processing oxidation in air. A negligible amount of oxygen was on the bulk film. EDS showed some amounts of Sb both in the Si/NiSi$_x$ interface and in the surface.

Example 2

Experiments were conducted using epitaxial Ge for the interface layer, followed by ALD of metal oxide over the interface layer, followed by an anneal in a reducing environment that accomplished both reduction of the metal oxide, germanidation of the interface layer and silicidation of the underlying silicon through the interface layer.

Continuous Ge films with thickness from about 7 to about 15 nm were deposited by CVD on silicon at 350° C. by using deposition times from about 150 seconds to about 210 seconds. Surface roughnesses of the Ge films were about 0.6 nm. NiO was deposited by ALD in a Pulsar 2000 ALCVD prototype reactor at 160° C. by alternately pulsing bis(4-N-ethylamino-3-penten-2-N-ethyliminato)nickel (II) and O3. Pulse durations of 1 s and purge durations of 4 s were used for both reactants, and 2000 cycles were performed. Post-deposition annealing was conducted for 10 minutes at 450° C. in 1 atmosphere partial pressure of forming gas (5%/95% H2/N2).

Crystallinity was studied using a X'PERT PRO MPD diffractometer, commercially available from PANalytical B.V. of Almelo, the Netherlands. The X-ray diffractogram (FIG. 8) of the resultant structure indicate reflections only from NiSi, NiGe and the underlying silicon substrate. No NiO or Ni peaks were found. Sheet resistances from about 6 to about 11Ω/☐ were measured for the samples using a 4-point probe.

Example 3

Experiments were conducted using epitaxial Ge films on Si of 1 µm in thickness followed by ALD of metal oxide over the Ge film, followed by an anneal in a reducing environment that accomplished both reduction of the metal oxide and germanidation of the underlying germanium.

NiO was deposited by ALD in a Pulsar 2000 ALCVD prototype reactor at 160° C. by alternately pulsing bis(4-N-ethylamino-3-penten-2-N-ethyliminato)nickel (II) and O3. Pulse durations of 1 s and purge durations of 4 s were used for both reactants, and 2000 cycles were performed. In-situ XRD was done using an HTK 1200N oven commercially available from Anton Paar GmbH of Österich, Austria, and the PANalytical X'PERT PRO MPD diffractometer in forming gas (5/95% H2/N2) up to 600° C.

Figure 9:
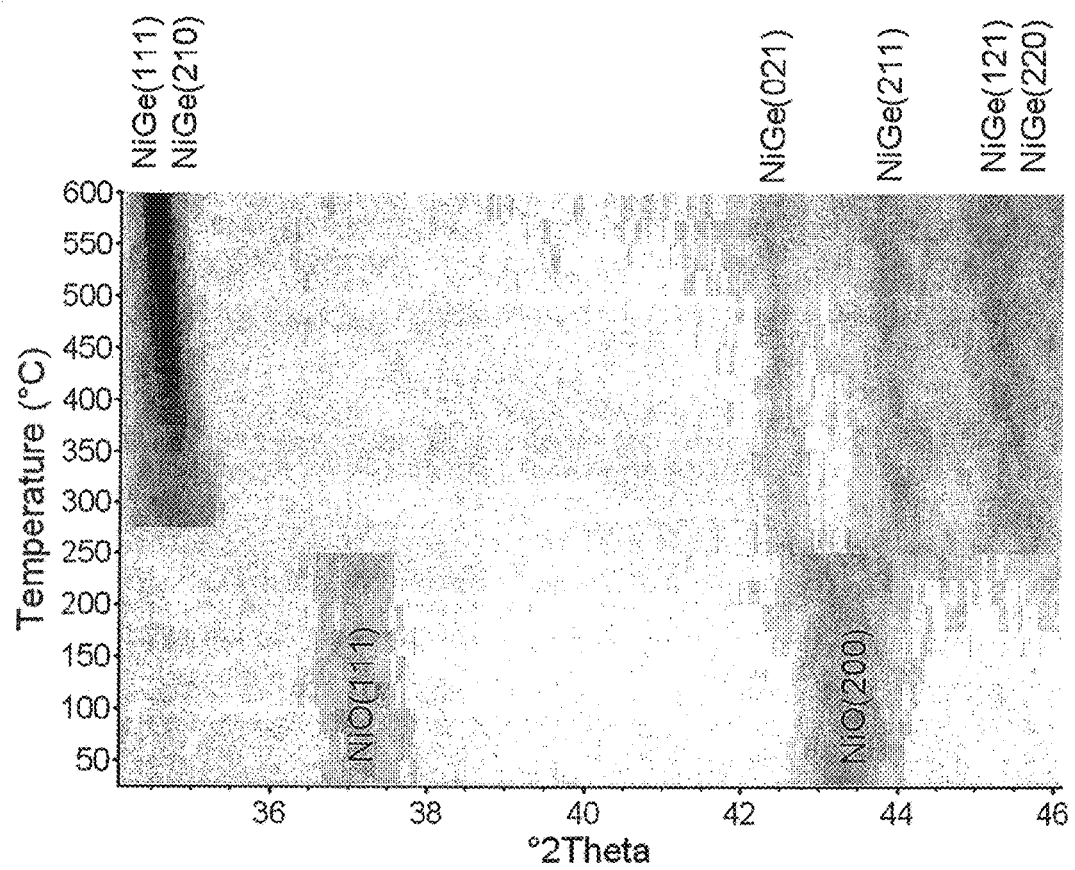
FIG. 9 is a chart of in situ x-ray diffraction (XRD) analyses, showing the effects on crystal structure of annealing nickel oxide over a thick germanium layer at different temperatures in 5% forming gas.

FIG. 9 illustrates the results of the x-ray diffraction (XRD) analyses, showing composite images for annealing the nickel oxide over germanium at different temperatures. The NiO reflections disappear at 250° C., and NiGe begins forming at 250° C.-275° C. Notably, no significant metallic Ni peaks are present, indicating full reaction.

Figure 8:
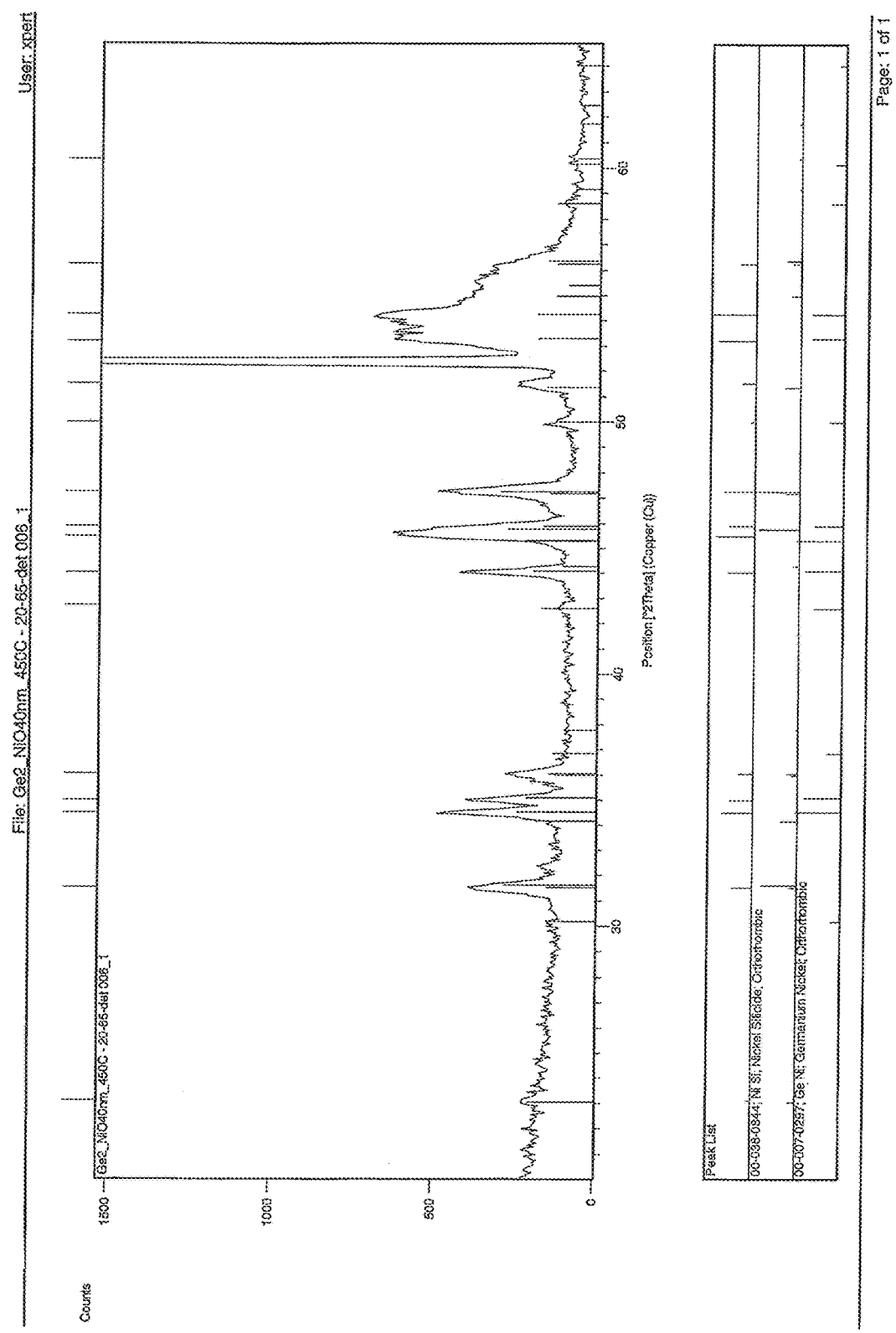
FIG. 8 is an x-ray diffractogram illustrating the result of annealing a stack of NiO over Ge interface layer over Si, showing peaks for NiSi, NiGe and Si, and no peaks for Ni or NiO.

In addition to the conformality afforded by ALD or CVD of metal oxide, another advantage use of metal oxide as the source of metal for germanidation (whether the Ge is an interface layer as in the embodiment of FIG. 8 or is the substrate as in the embodiment of FIG. 9) is that undesirably intermediate high resistivity phases can be avoided.

Example 4

Figure 11:
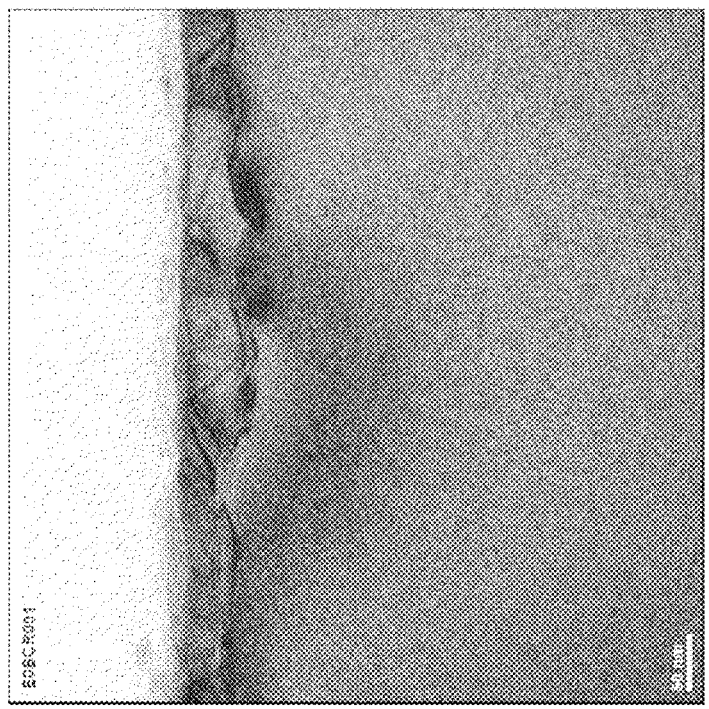
FIG. 11 is a micrograph of a NiSi layer over a silicon substrate formed using the process flow of FIG. 10.

Experiments were conducted in which a Sb interlayer was deposited by ALD on HF-last Si. NiO was deposited over the Sb interlayer using an O3 based ALD process. Silicidation was carried out by annealing at 500° C., followed by etching. A Rs of about 5 ohm/cm2 was observed. A micrograph showing the NiSi film over a Si substrate resulting from one such experiment is shown in FIG. 11.

Example 5

Figure 13:
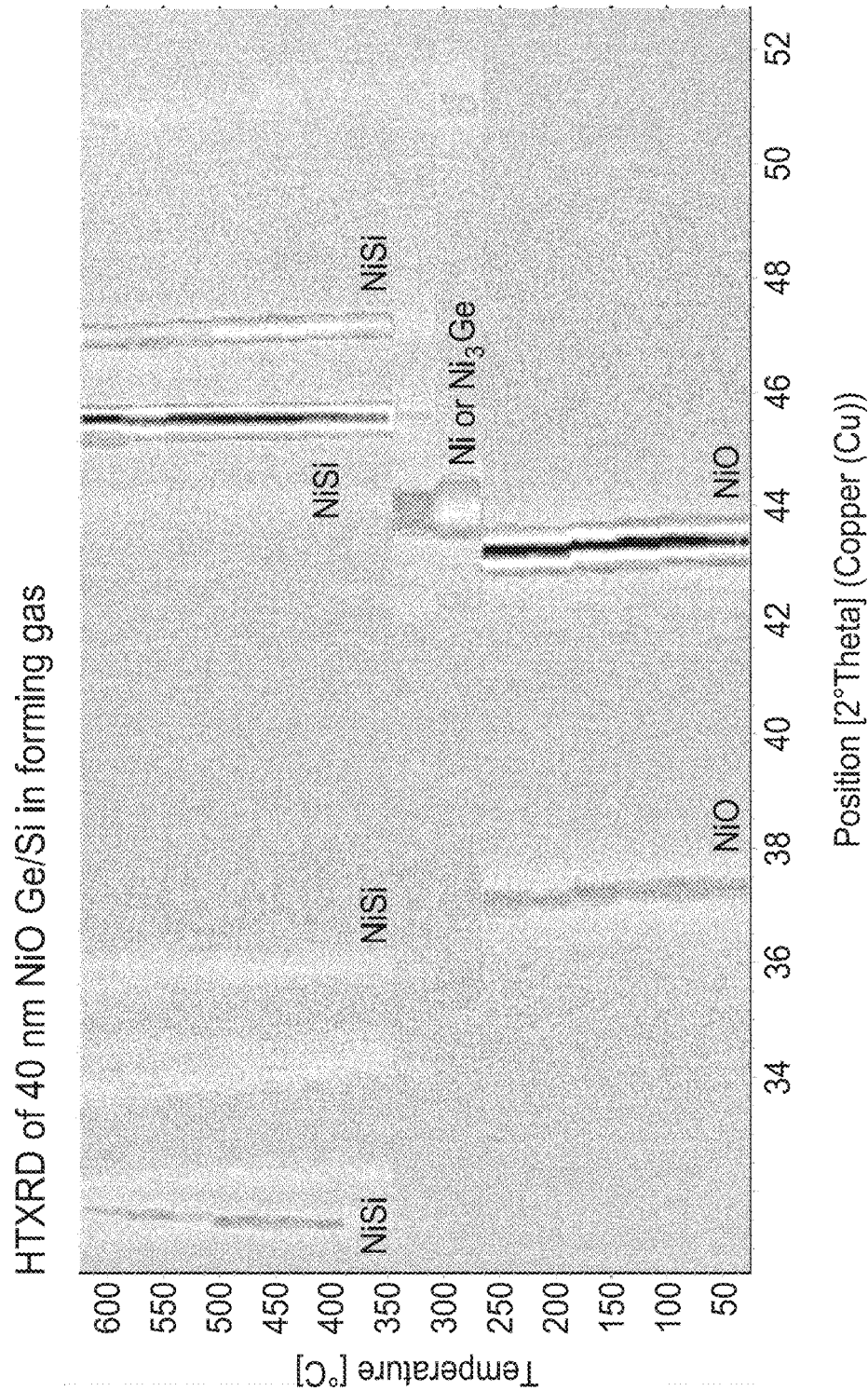
FIG. 13 is a chart of in situ x-ray diffraction (XRD) analyses, showing the effects on crystal structure of annealing 40 nm NiO deposited on 7 nm Ge/Si in forming gas.

Experiments were conducted in which 7, 11 and 15 nm epitaxial Ge films were deposited on silicon substrates by CVD. 40 nm of NiO was subsequently deposited on the epi-Ge by ALD. HTXRD analysis of the resulting structure (40 nm NiO on 7 nm Ge over Si in forming gas) is shown in FIG. 13. From HTXRD analysis it can be estimated that NiO reduces to metallic Ni at approximately ~250° C. At 250-350° C. Ni, NiGe and/or NiSi$_x$ phases are present and above 350° C. NiSi becomes the dominant phase.

Figure 14:
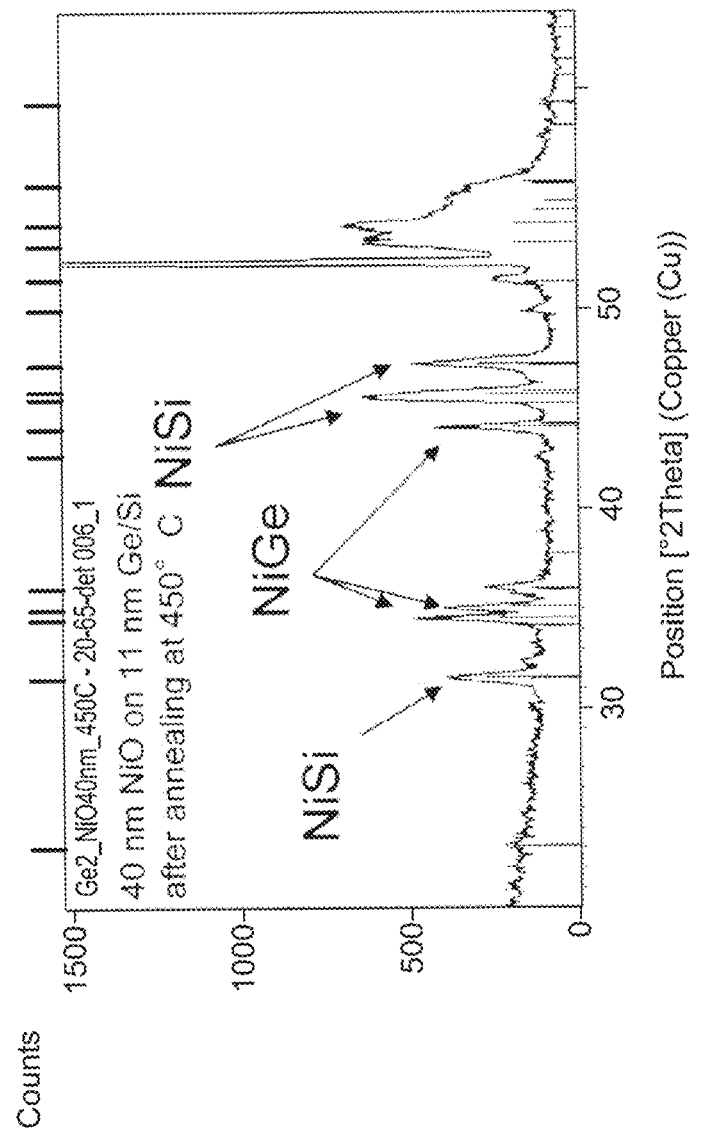
FIG. 14 illustrates the crystal structure of a substrate following deposition of 40 nm NiO on 11 nm Ge/Si after annealing at 450° C.
Figure 15:
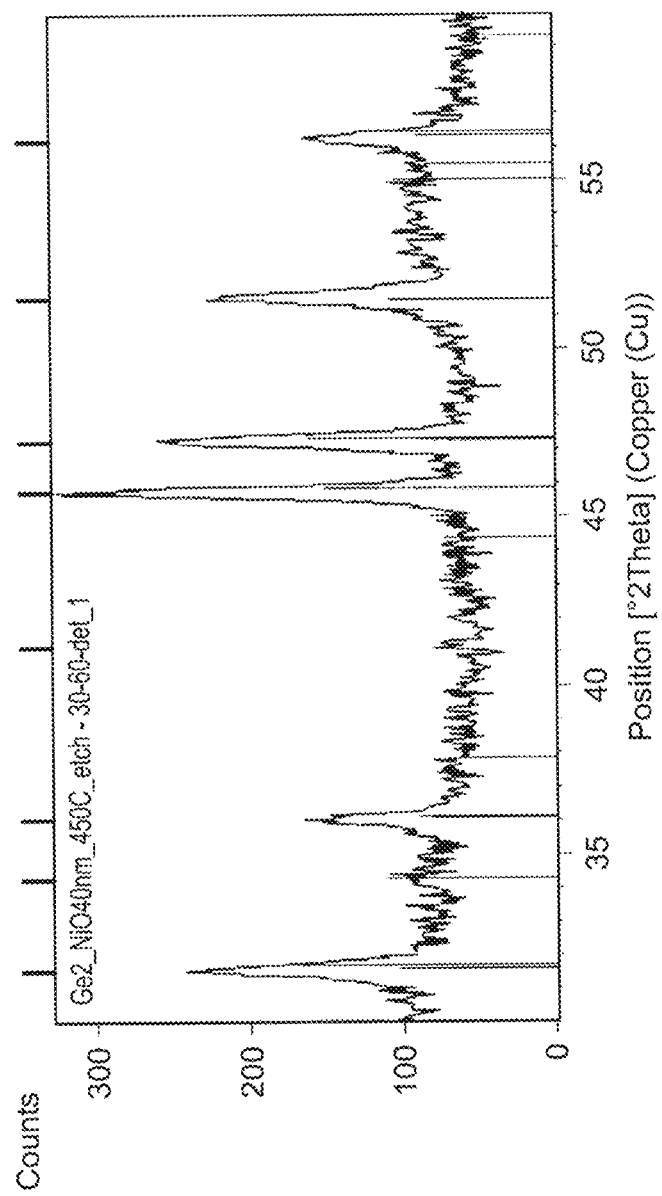
FIG. 15 illustrates the crystal structure of the same substrate after etching to remove NiGe.

In some experiments deposition of NiO was followed by an anneal at 450° C. in forming gas leading to both reduction of the metal oxide, germanidation of the underlying germanium, and silicidation of the underlying silicon. As illustrated in FIG. 14, following the anneal both NiGe and NiSi were present. Etching was performed using 25% H$_2$SO$_4$/30% H$_2$O$_2$ (4:1). The etching removed the NiGe and only the NiSi remained (FIG. 15).

Figure 17:
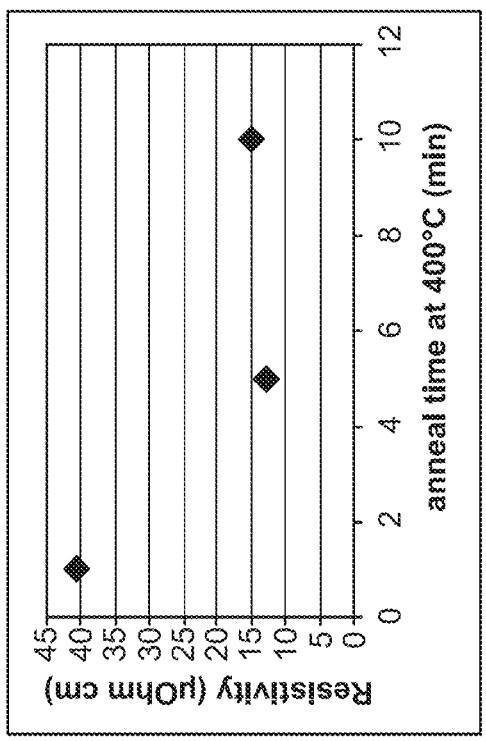
FIG. 17 is a graph showing NiSi resistivity variation with anneal time at 400° C.
Figure 16:
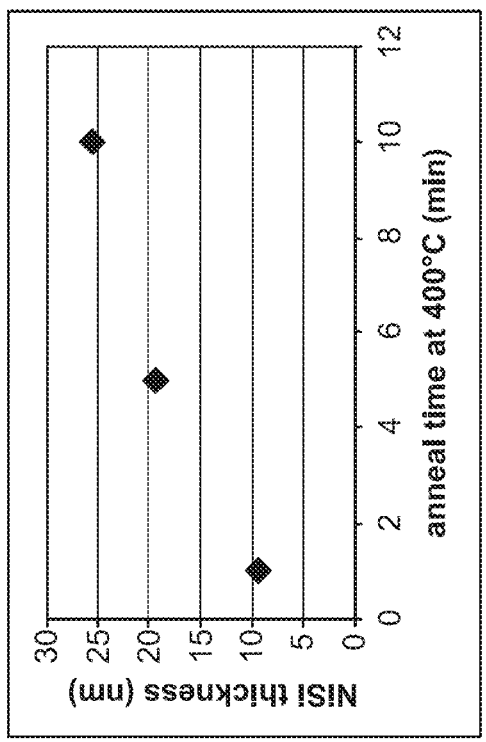
FIG. 16 is a graph showing NiSi thickness variation with anneal time at 400° C.
Figure 18A:
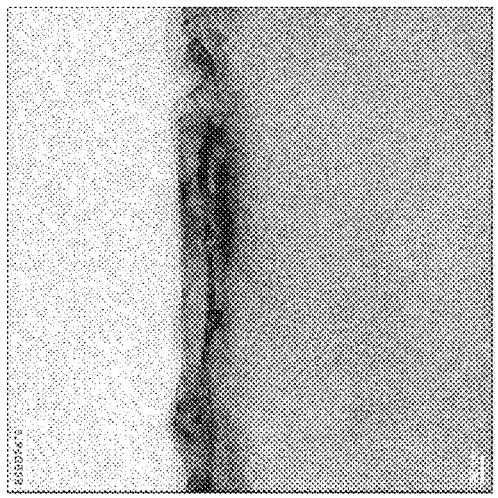
FIG. 18A-D show four TEMs of NiSi over Si. NiSi was formed by depositing 7 nm of Ge over Si, followed by 40 nm of NiO and annealing at 400° C. NiGe was removed by etching.
Figure 18B:
Figure 18C:
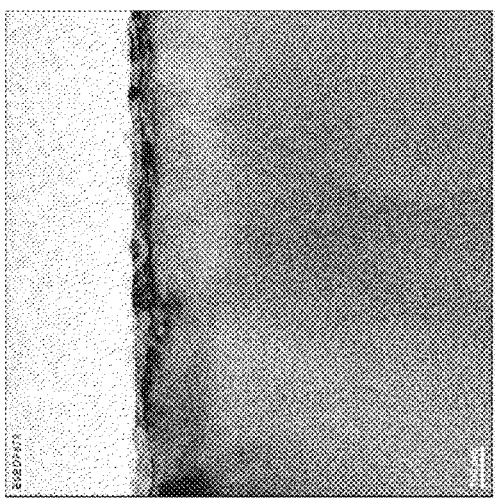
Figure 18D:
Figure 19:
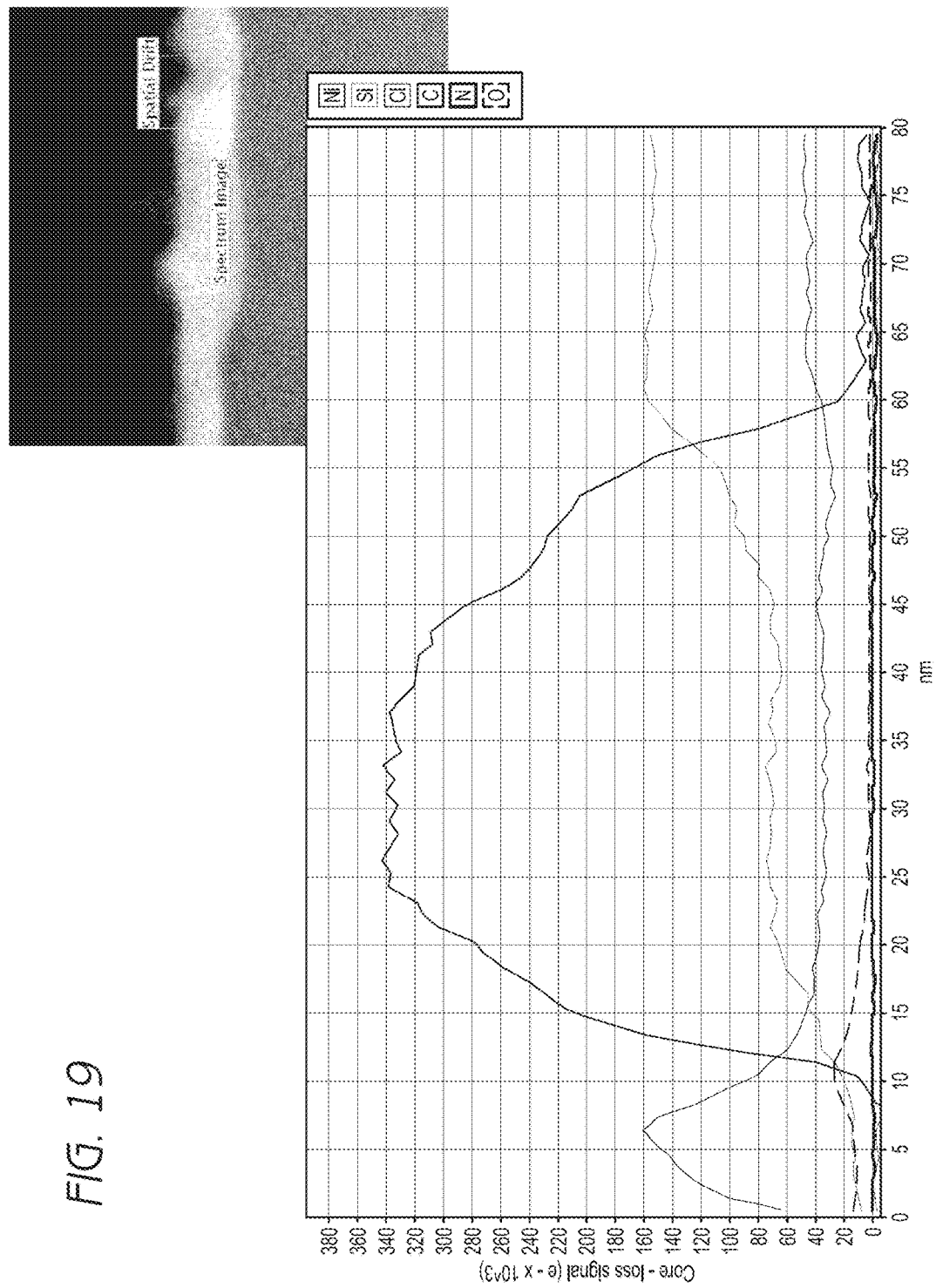
FIG. 19 shows an EELS line scan taken from the sample in FIG. 18 with 1 nm step size and approximately 1 nm spot size.

In some experiments the effect of anneal time on NiSi thickness and resistivity were investigated. 40 nm NiO was deposited over 7 nm of Ge, which in turn had been deposited on a silicon substrate. Annealing was carried out for 5 minutes in forming gas. Etching was subsequently carried out using H$_2$SO$_4$/30% H$_2$O$_2$ (4:1). FIG. 16 illustrates the variation in NiSi thickness with increasing anneal time at 400° C. FIG. 17 illustrates the resistivities observed with various anneal times at 400° C. FIGS. 18A-D shows TEM (BF TEM) images of a sample prepared in this way, using a 5 minute anneal time at 400° C. FIG. 19 shows an EELS line scan taken from sample in FIG. 18 with 1 nm step size and approximately 1 nm spot size.

Example 6

Ni films were deposited in a Pulsar 2000 ALCVD prototype reactor (F-200) at 250-325° C. using bis(4-N-ethylamino-3-penten-2-N-ethyliminato)nickel (II)) as the Ni precursor. The source temperature was 110-115° C. Pulse/purge lengths for bis(4-N-ethylamino-3-penten-2-N-ethyliminato) nickel (II) were always ¼ s. Ethanol and/or forming gas (10/90% H2/N2) were used as the reducing reactants. Ethanol (99.7%) was stored over molecular sieves overnight prior to loading in the source bottle. The effects of carrier gas (N2) flow rate, deposition temperature and reducing agent pulse length to the film growth behavior was studied. Film thicknesses were measured using an ellipsometer. Crystallinity was studied using a PANalytical X'Pert Pro MPD diffractometer.

Figure 20:
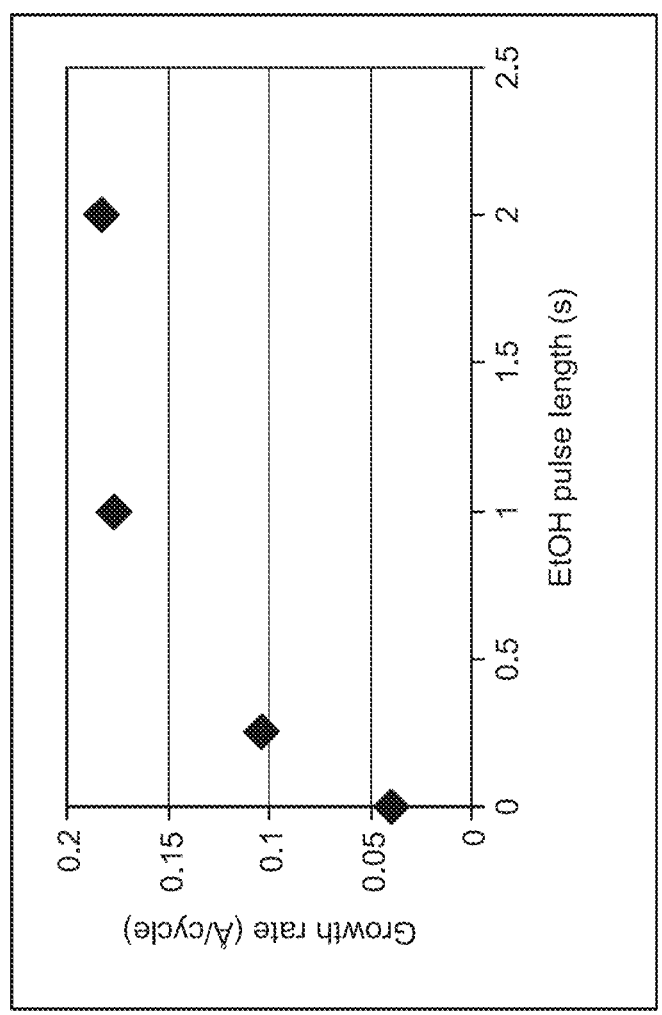
FIG. 20 is a graph showing the effect of ethanol pulse length on the Ni growth rate from bis(4-N-ethylamino-3-penten-2-N-ethyliminato)nickel (II) and ethanol.

In some experiments, nickel films were deposited by alternately and sequentially contacting a substrate in a reaction chamber with vapor phase pulses of bis(4-N-ethylamino-3-penten-2-N-ethyliminato)nickel (II) and ethanol at 285° C. The effect of ethanol pulse length was examined (FIG. 20). The ethanol purge length was varied so that in every case the duration between Ni precursor pulses was 10 s. As seen in FIG. 20, without ethanol the average growth rate was about 0.04 angstroms/cycle. When ethanol is introduced, the average growth rate saturates at about 0.18 angstroms/cycle with a pulse length of 1 s or more. Film non-uniformities were about 30%. A carrier flow rate of about 400 sccm was used.

In another set of experiments, nickel films were deposited by alternately and sequentially contacting a substrate in a reaction space with vapor phase pulses of bis(4-N-ethyl-amino-3-penten-2-N-ethyliminato)nickel (II) and forming gas. FIG. 21A shows the effect of growth temperature on the film growth rate and FIG. 21B shows the effect of temperature on thickness non-uniformity. It can be seen that the growth rate increases and the uniformity improves as the deposition temperature is increased. It was also observed that at 285° C. the results of films grown using forming gas are nearly identical to the results obtained using ethanol as the reducing agent.

Figure 22B:
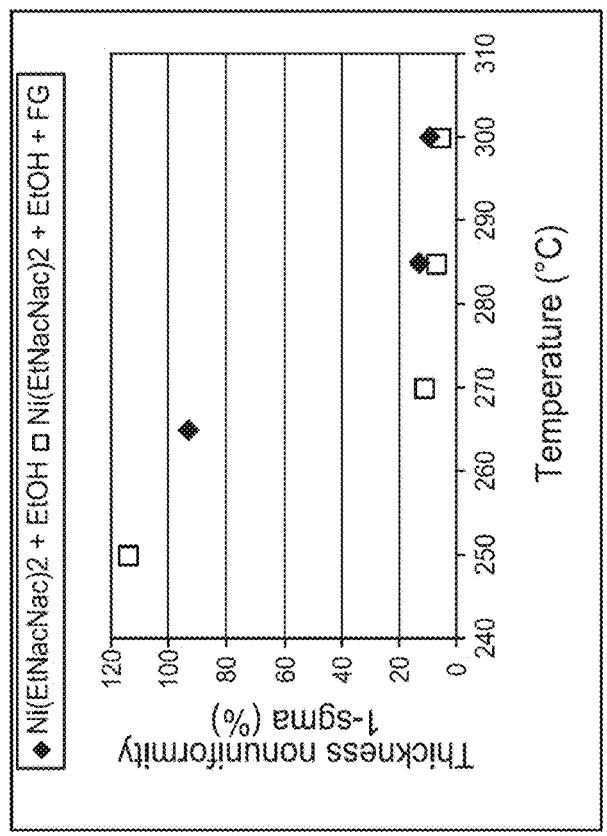
FIG. 22B is a graph showing the effect of deposition temperature on Ni film uniformity.
Figure 22A:
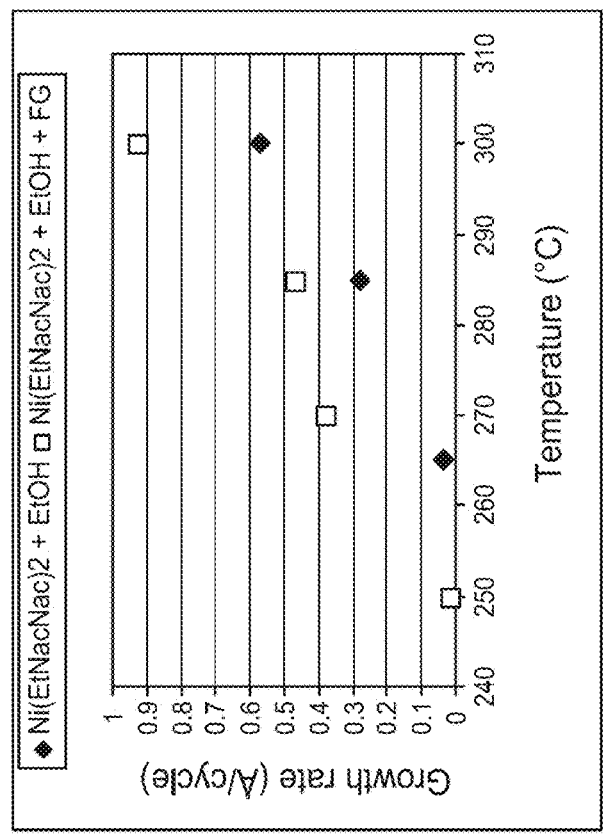
FIG. 22A is a graph showing the effect of deposition temperature on Ni film growth from bis(4-N-ethylamino-3-penten-2-N-ethyliminato)nickel (II), ethanol with or without forming gas.

Additional experiments showed that film growth rates and thickness uniformities could be improved by using both reducing agents. Nickel films were deposited by alternately and sequentially contacting a substrate with bis(4-N-ethyl-amino-3-penten-2-N-ethyliminato)nickel (II), ethanol and forming gas pulses, in that order. Decreasing the carrier gas flow rate, for example from 400 to 100 sccm also had positive effects. FIG. 22A shows the effect of deposition temperature on film growth rate using ethanol alone (diamonds) in the ALD reactions and ethanol and forming gas (squares) and FIG. 22B shows the effect of deposition temperature on thickness non-uniformity using ethanol alone (diamonds) and ethanol and forming gas (squares). For the experiments shown in FIGS. 22A and B, pulse/purge lengths for ethanol and forming gas were 2.0/4.0 s and 0.5/10 s, respectively, except at 285° C. where the forming gas pulse was 2.0 s. Carrier gas flow rate was 100 sccm. A reasonable growth rate (0.4 angstroms/cycle) and thickness non-uniformity (about 10%) were obtained at a minimum deposition temperature of about 270° C.

Figure 23:
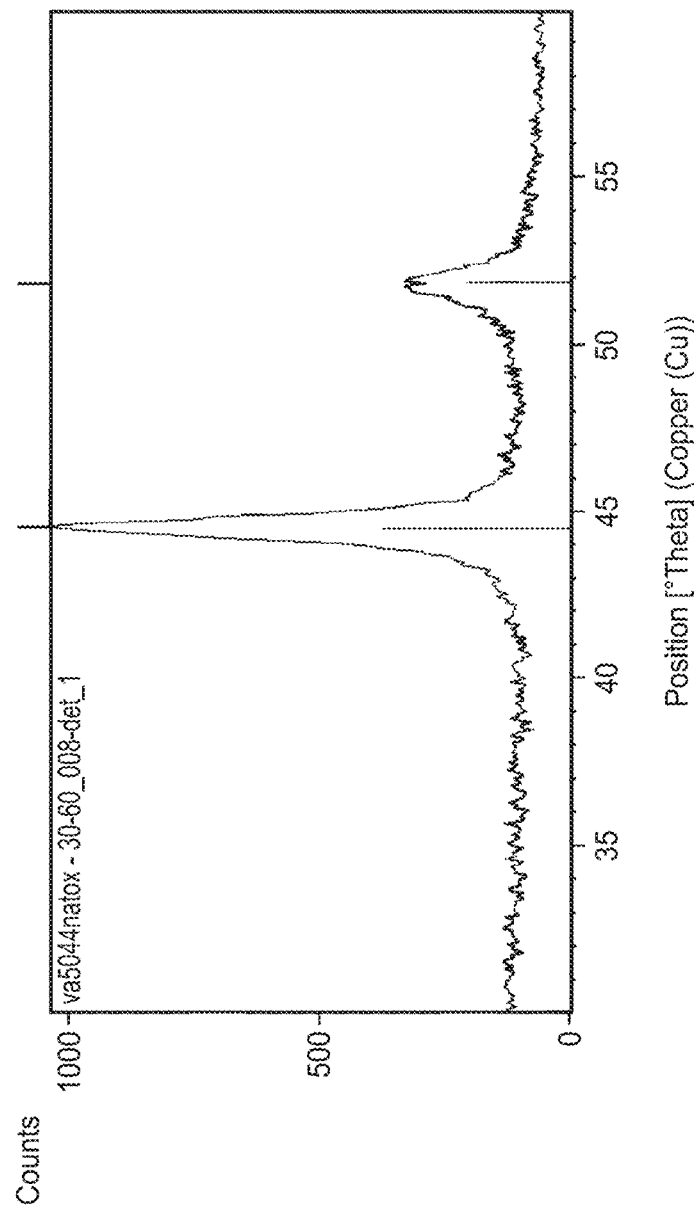
FIG. 23 is a gracing incidence XRD diffractogram of a Ni film deposited at 285° C. showing the presence of metallic nickel.

The presence of metallic nickel in films deposited at 270° C. and 285° C. was confirmed by XRD measurements as shown in FIG. 23.

All of the prepared nickel films were conductive. Resistivities were 1-2 orders of magnitude larger than the bulk value (7.2 microohm cm) of nickel.

Though primarily described in the context of self-aligned silicidation or germanidation over patterned transistors, it will be apparent to the skilled artisan that the above described silicidation and germanidation processes will be beneficial for silicidation and/or germanidation at any of a number of integrated circuit fabrication steps and in other contexts, and that the processes for deposition of nickel will find use in a wide variety of contexts.

Similarly, various other modifications, omissions and additions may be made to the methods and structures described above without departing from the scope of the invention. All such modifications and changes are intended to fall within the scope of the invention, as defined by the appended claims.

We claim:

1. A method for depositing an elemental cobalt (Co) thin film, the method comprising:
    providing a substrate comprising a 300 mm wafer in a reaction space of a flow type reactor, wherein the substrate comprises a silicon surface;
    carrying out one or more deposition cycles at a growth temperature of less than about 400° C., the deposition cycle comprising:
    contacting the silicon surface of the substrate with a first vapor phase metal precursor comprising cobalt;
    removing excess first vapor phase metal precursor from the reaction space;
    contacting the substrate comprising the silicon surface and the cobalt with a second vapor phase reactant such that it reacts with the first vapor phase metal precursor to form elemental cobalt (Co);
    wherein the elemental cobalt (Co) thin film is deposited directly on the silicon surface of the substrate;
    subsequently depositing a thin film comprising a dopant over the elemental cobalt (Co) thin film; and
    annealing the substrate comprising the elemental cobalt (Co) thin film and the thin film comprising the dopant to form a doped cobalt silicide layer.

2. The method of claim 1, wherein the first vapor phase metal precursor is a metal compound in which the metal is bound or coordinated to oxygen, nitrogen, carbon or a combination thereof.

3. The method of claim 1, wherein the first vapor phase metal precursor is an organic compound.

4. The method of claim 3, wherein the first vapor phase metal precursor is a betadiketonate, betadiketiminato compounds, amidinate compounds, aminoalkoxide, ketoiminate or cyclopentadienyl compound.

5. The method of claim 3, wherein the first vapor phase metal precursor is a cyclopentadienyl cobalt compound.

6. The method of claim 3, wherein the first vapor phase metal precursor is a compound with the formula X(acac)y, where X is cobalt and y is between 2 and 3.

7. The method of claim 3, wherein the first vapor phase metal precursor is a compound with the formula X(thd)y, where X is cobalt, y is between 2 and 3 and thd is 2,2,6,6-tetramethyl-3,5-heptanedionato.

8. The method of claim 1, wherein the method is an atomic layer deposition (ALD) method.

9. The method of claim 8, wherein the ALD method comprises alternately and sequentially contacting the substrate with the first vapor phase metal precursor and the second vapor phase reactant.

10. The method of claim 1, wherein the growth temperature is less than about 200° C.

11. The method of claim 1, wherein the first vapor phase metal precursor is pulsed into the reaction space for from about 0.3 to 3 seconds.

12. The method of claim 1, wherein the dopant is a metal.

13. The method of claim 12, wherein the dopant is platinum.

14. The method of claim 1, wherein the dopant content in the doped cobalt silicide layer as a percentage of the overall metal content is about 0-10%.

* * * * *

UNITED STATES PATENT AND TRADEMARK OFFICE
CERTIFICATE OF CORRECTION

PATENT NO. : 10,043,880 B2  
APPLICATION NO. : 15/492892  
DATED : August 7, 2018  
INVENTOR(S) : Viljami J. Pore et al.

Page 1 of 2

It is certified that error appears in the above-identified patent and that said Letters Patent is hereby corrected as shown below:

In the Drawings

Drawings Sheet 7 of 24, FIG. 6, Reference Numeral 615, Line 1 change "PRECUROR" to --PRECURSOR--.

Drawings Sheet 8 of 24, FIG. 7, Reference Numeral 725, Line 1 change "PRECUROR" to --PRECURSOR--.

Drawings Sheet 21 of 24, FIG. 22B, X-Axis, Line 2 change "1-sgma" to --1-sigma--.

In the Specification

Column 2, Line 45, change "NiSi" to --NiSi$_x$--.

Column 3, Line 10, change "film" to --film.--.

Column 5, Line 42, change "FIG." to --FIGS.--.

Column 16, Line 47, change "etc" to --etc.--.

Column 19, Line 24, change "Jr," to --Ir,--.

Column 25, Line 19, change "alkanedial" to --alkanediol--.

Column 26, Line 8, change "to is" to --is--.

Column 28, Line 45, change "PtO," to --PtOx--.

Column 30, Line 46, change "Ni(acac)$_2$,Ni(thd)$_2$" to --Ni(acac)$_2$, Ni(thd)$_2$--.

Signed and Sealed this  
Thirteenth Day of November, 2018

Andrei Iancu  
*Director of the United States Patent and Trademark Office*

CERTIFICATE OF CORRECTION (continued)
U.S. Pat. No. 10,043,880 B2

Column 32, Line 3, change "alkanedial" to --alkanediol--.

Column 34, Line 11 (approx.), change "NiSi" to --NiSi$_X$--.

Column 35, Line 47, change "Österich" to --Österreich--.

Column 36, Line 15, change "NiGe" to --Ni$_x$Ge--.